(12) United States Patent
Suzuki et al.

(10) Patent No.: US 12,100,711 B2
(45) Date of Patent: Sep. 24, 2024

(54) ACTIVE MATRIX SUBSTRATE AND METHOD FOR MANUFACTURING SAME

(71) Applicant: SHARP KABUSHIKI KAISHA, Sakai (JP)

(72) Inventors: Masahiko Suzuki, Sakai (JP); Tetsuo Kikuchi, Sakai (JP); Setsuji Nishimiya, Sakai (JP); Kengo Hara, Sakai (JP); Hitoshi Takahata, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 316 days.

(21) Appl. No.: 17/536,648

(22) Filed: Nov. 29, 2021

(65) Prior Publication Data
US 2022/0181356 A1    Jun. 9, 2022

Related U.S. Application Data

(60) Provisional application No. 63/121,553, filed on Dec. 4, 2020.

(51) Int. Cl.
*H01L 27/12* (2006.01)
*H01L 29/66* (2006.01)
*H01L 29/786* (2006.01)

(52) U.S. Cl.
CPC ........ *H01L 27/124* (2013.01); *H01L 27/1225* (2013.01); *H01L 27/127* (2013.01); *H01L 29/66742* (2013.01); *H01L 29/7869* (2013.01); *H01L 29/78696* (2013.01)

(58) Field of Classification Search
CPC .......................... H01L 27/124; H01L 27/1225
See application file for complete search history.

(56) References Cited

U.S. PATENT DOCUMENTS

| | | |
|---|---|---|
| 2012/0138922 A1 | 6/2012 | Yamazaki et al. |
| 2013/0214273 A1 | 8/2013 | Yamazaki et al. |
| 2013/0320334 A1 | 12/2013 | Yamazaki et al. |
| 2014/0183532 A1 | 7/2014 | Yamazaki et al. |

(Continued)

FOREIGN PATENT DOCUMENTS

| | | |
|---|---|---|
| JP | 2012-134475 A | 7/2012 |
| JP | 2014-007399 A | 1/2014 |

(Continued)

OTHER PUBLICATIONS

S. Yamazaki, "Crystalline Oxide Semiconductor Using CAAC-IGZO and its Application," ECS Transactions, 64 (10) 155-164 (2014). (Year: 2014).*

*Primary Examiner* — Peter M Albrecht
(74) *Attorney, Agent, or Firm* — ScienBiziP, P.C.

(57) ABSTRACT

An active matrix substrate includes a plurality of oxide semiconductor TFTs, and a plurality of wiring line connection sections, each of the plurality of wiring line connection sections includes a first connection electrode, an interlayer insulating layer extending over the first connection electrode, a wiring line contact hole formed in an insulating layer including the interlayer insulating layer, the wiring line contact hole exposing a part of a metal oxide layer of a first connection electrode, and a second connection electrode, and the second connection electrode is connected to a part of the metal oxide layer of the first connection electrode in the wiring line contact hole.

20 Claims, 74 Drawing Sheets

(56) References Cited

U.S. PATENT DOCUMENTS

| | | |
|---|---|---|
| 2014/0286076 A1 | 9/2014 | Aoki et al. |
| 2015/0179805 A1 | 6/2015 | Yamazaki et al. |
| 2016/0240694 A1 | 8/2016 | Yamazaki et al. |
| 2017/0033229 A1 | 2/2017 | Yamazaki et al. |
| 2017/0090229 A1 | 3/2017 | Imai et al. |
| 2017/0309751 A1 | 10/2017 | Yamazaki et al. |
| 2017/0309754 A1 | 10/2017 | Yamazaki et al. |
| 2018/0308989 A1 | 10/2018 | Yamazaki et al. |
| 2020/0035834 A1* | 1/2020 | Chen ............... H01L 27/124 |
| 2020/0312885 A1* | 10/2020 | Imai ................ H01L 27/124 |
| 2021/0159345 A1 | 5/2021 | Yamazaki et al. |

FOREIGN PATENT DOCUMENTS

| | | |
|---|---|---|
| JP | 2014-209727 A | 11/2014 |
| JP | 2015-109315 A | 6/2015 |
| WO | 2015/186619 A1 | 12/2015 |

* cited by examiner

ACTIVE MATRIX SUBSTRATE AND METHOD FOR MANUFACTURING SAME

CROSS-REFERENCE TO RELATED APPLICATION

The present application claims priority from Provisional Application No. 63/121,553, the content to which is hereby incorporated by reference into this application.

TECHNICAL FIELD

Technical Field

The disclosure relates to an active matrix substrate and a method for manufacturing the same.

Related Art

Display devices have been widely used each of which includes an active matrix substrate provided with switching elements for respective pixels. An active matrix substrate provided with thin film transistors (hereinafter referred to as "TFTs") as the switching elements is referred to as a TFT substrate. Note that a portion of the TFT substrate corresponding to a pixel of the display device is referred to herein as a pixel area or a pixel. Additionally, the TFT provided as the switching element for each pixel of the TFT substrate is referred to as a "pixel TFT". The TFT substrate is provided with a plurality of source bus lines and a plurality of gate bus lines, and a pixel TFT is disposed at or near each of intersections of these lines. A source electrode of the pixel TFT is connected to one of the source bus lines, and a gate electrode is connected to one of the gate bus lines. Thus, typically, the source electrode is formed in the same metal layer (source metal layer) as the source bus line, and the gate electrode is formed in the same metal layer (gate metal layer) as the gate bus line.

The TFT substrate is provided with wiring line connection sections for connecting electrodes and wiring lines formed in the different metal layers to each other. The wiring line connection section includes, for example, a terminal section, a source-gate connection section that changes connection of a wiring line in the source metal layer and a wiring line in the gate metal layer, and the like.

In recent years, the use of an oxide semiconductor as a material of an active layer of the TFT has been proposed, in place of amorphous silicon and polycrystalline silicon. Such a TFT is referred to as an "oxide semiconductor TFT". The oxide semiconductor has a higher mobility than amorphous silicon. Thus, the oxide semiconductor TFT can operate at a higher speed than the amorphous silicon TFT. In addition, since an oxide semiconductor film is formed by a process simpler than that of a polycrystalline silicon film, the oxide semiconductor film can be applied to a device that requires a large area.

While many oxide semiconductor TFTs are bottom gate type TFTs, top-gate type oxide semiconductor TFTs have been proposed as well (for example, Japanese Patent Application Laid-Open No. JP 2015-109315 A.

JP 2015-109315 A discloses a top-gate type TFT in which a gate electrode is disposed on a part of an oxide semiconductor layer with a gate insulating layer being interposed therebetween, and source and drain electrodes are disposed on an interlayer insulating layer covering the gate electrode. On the other hand, International Publication WO 2015/186619 filed by the present applicant discloses a TFT substrate including top-gate type oxide semiconductor TFTs as pixel TFTs and being provided with source bus lines closer to the substrate side than gate bus lines. In the TFT substrate, each source bus line is disposed closer to the substrate side than an oxide semiconductor layer of the corresponding oxide semiconductor TFT, and each gate bus line is disposed above the corresponding oxide semiconductor layer. Such a substrate structure is referred to as a "lower source substrate structure", and a TFT substrate having the lower source substrate structure is referred to as a "lower source substrate". In the lower source substrate, an insulating layer positioned between the source bus line and the gate bus line can be thickened, so that a parasitic capacitance to be generated at an intersection between these bus lines can be reduced.

SUMMARY

Technical Problem

In the TFT substrate using the top-gate type oxide semiconductor TFTs, in each wiring line connection section, for example, in a contact hole provided in the interlayer insulating layer covering the gate metal layer, a wiring line in the gate metal layer (hereinafter, referred to as a "first wiring line") and an electrode or wiring line disposed on the interlayer insulating layer (for example, disposed in the source metal layer) (hereinafter, referred to as a "second wiring line") are electrically connected.

However, according to the investigation by the present inventors, the present inventors have found that when a contact hole exposing a part of the first wiring line is formed in the interlayer insulating layer in the wiring line connection section, a projection made of a material of the interlayer insulating layer may be formed in the contact hole. The generation of the projection in the contact hole may be a factor of the deterioration of the coverage of a protective insulating layer (passivation film) covering the first wiring line and the wiring line connection section. As a result, moisture or hydrogen enters an active layer (oxide semiconductor layer) of the oxide semiconductor TFT, and there is a risk that the oxide semiconductor TFT may be depressed or conduction between the source and the drain may occur.

An embodiment of the present invention provides an active matrix substrate that can suppress degradation of characteristics (depression) of the oxide semiconductor TFT due to a reduction in coverage of the protective insulating layer.

An active matrix substrate and a method for manufacturing the active matrix substrate are disclosed herein in the following items.

Item 1

An active matrix substrate including a display region including a plurality of pixel areas arranged in a matrix shape in a row direction and a column direction, and a non-display region positioned around the display region, including a substrate, a plurality of oxide semiconductor TFTs supported by the substrate, the plurality of oxide semiconductor TFTs including a plurality of pixel TFTs disposed corresponding to the plurality of pixel areas, and a plurality of wiring line connection sections supported by the substrate, wherein each of the plurality of oxide semiconductor TFTs includes an oxide semiconductor layer including a channel region, a gate electrode disposed on the channel region of the oxide semiconductor layer with a gate insulating layer interposed between the gate electrode and the channel region, an interlayer insulating layer covering the oxide semiconductor layer and the gate electrode, and a source electrode electrically connected to a part of the oxide semiconductor layer, each of the plurality of wiring line connection sections electrically connects a first connection electrode provided in a layer identical to that of the gate electrode and a second connection electrode disposed on the interlayer insulating layer, the gate electrode of each of the plurality of oxide semiconductor TFTs and the first connection electrode of each of the plurality of wiring line connection sections include a layered structure including a Cu-containing conductive layer containing Cu, and a metal oxide layer disposed on the Cu-containing conductive layer, the metal oxide layer containing an oxide material identical to that of the channel region of the oxide semiconductor layer, and each of the plurality of wiring line connection sections includes the first connection electrode, the interlayer insulating layer extending over the first connection electrode, a wiring line contact hole formed in an insulating layer including the interlayer insulating layer, the wiring line contact hole exposing a part of the metal oxide layer of the first connection electrode, and the second connection electrode, and the second connection electrode is connected to the part of the metal oxide layer of the first connection electrode in the wiring line contact hole.

Item 2

The active matrix substrate according to item 1, wherein the second connection electrode of each of the plurality of wiring line connection sections is formed from a conductive film identical to that of the source electrode of each of the plurality of oxide semiconductor TFTs.

Item 3

The active matrix substrate according to item 1 or 2, wherein, in the gate electrode and the first connection electrode, the metal oxide layer covers an upper face of the Cu-containing conductive layer.

Item 4

The active matrix substrate according to item 1 or 2, wherein, in the gate electrode and the first connection electrode, the metal oxide layer covers an upper face and a side face of the Cu-containing conductive layer.

Item 5

The active matrix substrate according to any one of items 1 to 4, wherein, in the gate electrode and the first connection electrode, the Cu-containing conductive layer includes a Cu alloy layer and a Cu layer disposed on the Cu alloy layer.

Item 6

The active matrix substrate according to any one of items 1 to 4, wherein the layered structure of the gate electrode and the first connection electrode further includes a barrier metal layer disposed on a side of the substrate of the Cu-containing conductive layer, and the barrier metal layer contains Ti or Mo.

Item 7

The active matrix substrate according to any one of items 1 to 6, wherein, in the gate electrode and the first connection electrode, a thickness of the metal oxide layer is equal to or greater than 30 nm, and is less than a thickness of the Cu-containing conductive layer.

Item 8

The active matrix substrate according to any one of items 1 to 7, wherein, in each of the plurality of oxide semiconductor TFTs, the oxide semiconductor layer includes a first metal oxide containing In, Ga, and Zn, the metal oxide layer of the gate electrode includes a second metal oxide containing In, Ga, and Zn, and a ratio, in the first metal oxide, of the numbers of atoms of In, Ga, and Zn to all metal elements contained in the first metal oxide and a ratio, in the second metal oxide, of the numbers of atoms of In, Ga, and Zn to all metal elements contained in the second metal oxide are substantially identical.

Item 9

The active matrix substrate according to any one of items 1 to 8, wherein each of the plurality of oxide semiconductor TFTs further includes a lower electrode disposed between the channel region of the oxide semiconductor layer and the substrate, and the oxide semiconductor layer is disposed on the lower electrode with a lower insulating layer interposed between the oxide semiconductor layer and the lower electrode.

Item 10

The active matrix substrate according to item 9, wherein the plurality of wiring line connection sections include a first wiring line connection section that electrically connects a lower connection electrode provided in a layer identical to that of the lower electrode to the first connection electrode via the second connection electrode, and in the first wiring line connection section, the wiring line contact hole is formed in the interlayer insulating layer and the lower insulating layer, and exposes the part of the metal oxide layer of the first connection electrode and a part of the lower connection electrode, and the second connection electrode is connected to the part of the metal oxide layer of the gate electrode and the part of the lower electrode in the wiring line contact hole.

Item 11

The active matrix substrate according to item 10, wherein the plurality of oxide semiconductor TFTs include a plurality of double gate structure TFTs, and the first wiring line connection section includes a gate connection section that electrically connects the lower electrode and the gate electrode that are included in each of the double gate structure TFTs.

Item 12

The active matrix substrate according to any one of items 1 to 11, further including a plurality of gate bus lines supported by a main surface of the substrate and extending in the row direction, and a plurality of source bus lines supported by the main surface of the substrate and extending in the column direction, wherein the source electrode of each of the plurality of pixel TFTs is electrically connected to one corresponding source bus line of the plurality of source bus lines, and the gate electrode of each of the plurality of pixel TFTs is electrically connected to one corresponding gate bus line of the plurality of gate bus lines, and each of the plurality of gate bus lines is provided in a layer identical to that of the gate electrode of a corresponding pixel TFT, of the plurality of pixel TFTs, and each of the plurality of source bus lines is provided in a layer identical to that of the source electrode of a corresponding pixel TFT, of the plurality of pixel TFTs, on the corresponding interlayer insulating layer.

Item 13

The active matrix substrate according to any one of items 9 to 11, further including a plurality of gate bus lines supported by a main surface of the substrate and extending in the row direction, and a plurality of source bus lines supported by the main surface of the substrate and extending in the column direction, wherein the source electrode of each of the pixel TFTs is electrically connected to one corresponding source bus line of the plurality of source bus lines, and the gate electrode of each of the pixel TFTs is electrically connected to one corresponding gate bus line of the plurality of gate bus lines, and each of the plurality of gate bus lines is provided in a layer identical to that of the gate electrode of a corresponding pixel TFT, of the plurality of pixel TFTs, and each of the plurality of source bus lines is provided in a layer identical to that of the lower electrode of a corresponding pixel TFT, of the plurality of pixel TFTs.

Item 14

The active matrix substrate according to item 13, wherein, in each of the plurality of pixel TFTs, the lower insulating layer and the interlayer insulating layer include a source contact hole exposing the part of the oxide semiconductor layer and a part of the one corresponding source bus line, and the source electrode is disposed on the interlayer insulating layer and in the source contact hole, and is electrically connected to the part of the oxide semiconductor layer and the part of the one corresponding source bus line in the source contact hole.

Item 15

The active matrix substrate according to any one of items 1 to 14, wherein the oxide semiconductor layer and the metal oxide layer contain In, Ga, and Zn.

Item 16

The active matrix substrate according to item 15, wherein the oxide semiconductor layer and the metal oxide layer contain an In—Ga—Zn—O-based oxide.

Item 17

The active matrix substrate according to item 16, wherein the In—Ga—Zn—O-based oxide includes a crystalline portion.

Item 18

A method for manufacturing an active matrix substrate including a substrate, a plurality of oxide semiconductor TFTs supported by the substrate, and a plurality of wiring line connection sections supported by the substrate, the method including (a) forming an oxide semiconductor film on the substrate by a sputtering method in a TFT formation region where each of the plurality of oxide semiconductor TFTs is formed, and then patterning the oxide semiconductor film to form an oxide semiconductor layer of each of the plurality of oxide semiconductor TFTs, (b) forming a gate insulating film that covers the oxide semiconductor layer in the TFT formation region and a connection section formation region where each of the plurality of wiring line connection sections is formed, (c) forming a Cu-containing conductive film on the gate insulating film in the TFT formation region and the connection section formation region, and then forming a metal oxide film on the Cu-containing conductive film by a sputtering method to form a layered film including the Cu-containing conductive film and the metal oxide film, where, in the forming of the metal oxide film, a sputtering target used to form the oxide semiconductor film is used again, (d) providing a first resist layer on a part of the metal oxide film, patterning the metal oxide film and the Cu-containing conductive film by using the first resist layer as a mask, and then patterning the gate insulating film to form a gate insulating layer and a gate electrode on a part of the oxide semiconductor layer in the TFT formation region and to form another gate insulating layer and a first connection electrode in the connection section formation region, where the gate electrode and the first connection electrode include a layered structure including a Cu-containing conductive layer and a metal oxide layer, (e) lowering specific resistances of a region covered by neither the gate insulating layer nor the gate electrode in the oxide semiconductor layer and the metal oxide layer of the gate electrode and the first connection electrode, (f) forming an interlayer insulating layer that covers the gate electrode and the first connection electrode in the TFT formation region and the connection section formation region, (g) forming, in the connection section formation region, a wiring line contact hole that exposes a part of the metal oxide layer of the first connection electrode to the interlayer insulating layer by dry etching, and (h) forming, in the connection section formation region, a second connection electrode that makes contact with the part of the metal oxide layer of the first connection electrode in the wiring line contact hole.

Item 19

A method for manufacturing an active matrix substrate including a substrate, a plurality of oxide semiconductor TFTs supported by the substrate, and a plurality of wiring line connection sections supported by the substrate, the method including (a) forming an oxide semiconductor film on the substrate by a sputtering method in a TFT formation region where each of the plurality of oxide semiconductor TFTs is formed, and then patterning the oxide semiconductor film to form an oxide semiconductor layer of each of the plurality of oxide semiconductor TFTs, (b) forming a gate insulating film that covers the oxide semiconductor layer in the TFT formation region and a connection section formation region where each of the plurality of wiring line connection sections is formed, (c) forming a Cu-containing conductive film on the gate insulating film, providing a second resist layer on a part of the Cu-containing conductive film, and patterning the Cu-containing conductive film by using the second resist layer as a mask to form a first Cu-containing conductive layer in the TFT formation region and to form a second Cu-containing conductive layer in the connection section formation region, (d) forming a metal oxide film that covers the first Cu-containing conductive layer and the second Cu-containing conductive layer by a sputtering method in the TFT formation region and the connection section formation region, where, in the forming of the metal oxide film, a sputtering target used to form the oxide semiconductor film is used again, (e) providing a third resist layer on a part of the metal oxide film, patterning the metal oxide film by using the third resist layer as a mask to form a first metal oxide layer that covers an upper face and a side face of the first Cu-containing conductive layer in the TFT formation region, thereby obtaining a gate electrode including a layered structure including the first Cu-containing conductive layer and the first metal oxide layer, and forming a second metal oxide layer that covers an upper face and a side face of the second Cu-containing conductive layer in the connection section formation region, thereby obtaining a first connection electrode including a layered structure including the second Cu-containing conductive layer and the second metal oxide layer, (f) patterning the gate insulating film to form a gate insulating layer on a side of the substrate of the gate electrode in the TFT formation region, and forming another gate insulating layer on a side of the substrate of the first connection electrode in the connection section formation region, (g) lowering specific resistances of a region covered by neither the gate insulating layer nor the gate electrode in the oxide semiconductor layer, the first metal oxide layer, and the second metal oxide layer, (h) forming an interlayer insulating layer that covers the gate electrode and the first connection electrode in the TFT formation region and the connection section formation region, (i) forming a wiring line contact hole that exposes a part of the second metal oxide layer to the interlayer insulating layer by dry etching in the connection section formation region, and (j) forming a second connection electrode that makes contact with the part of the second metal oxide layer in the wiring line contact hole in the connection section formation region, wherein the second resist layer and the third resist layer are formed by using an identical photomask.

According to an embodiment of the present invention, an active matrix substrate capable of suppressing a reduction in characteristics of the oxide semiconductor TFT due to a reduction in coverage of the protective insulating layer is provided.

DESCRIPTION OF EMBODIMENTS

First, the knowledge found by the inventors of the present application will be described.

In an oxide semiconductor TFT including a top-gate structure, for example, an oxide semiconductor layer, a gate insulating layer, and a gate electrode may be covered by an interlayer insulating layer being relatively thick, and source and drain electrodes may be provided on the interlayer insulating layer.

In a TFT substrate provided with such an oxide semiconductor TFT, a contact hole exposing a surface of a gate metal layer is formed in the interlayer insulating layer in a wiring line connection section (for example, a source-gate connection section). However, as described above, in forming a contact hole in the interlayer insulating layer, a "projection" may be formed in the contact hole.

The inventors of the present application have considered a mechanism of forming the "projection". Hereinafter, a process of forming a conventional wiring line connection section and the mechanism of forming the projection considered by the inventors of the present application will be described by using a source-gate connection section as an example.

FIG. 19A to FIG. 19H are process cross-sectional views illustrating a process of forming a conventional wiring line connection section.

Figure 19A:
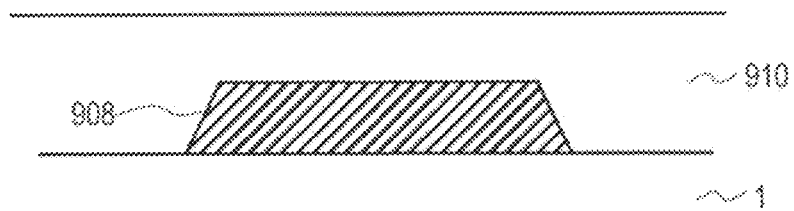
FIG. 19A is a process cross-sectional view illustrating a method for forming a conventional wiring line connection section and a mechanism for forming a projection.

As illustrated in FIG. 19A, a first wiring line 908 is formed on a main surface of a substrate 1 by using a conductive film identical to that of a gate electrode of an oxide semiconductor TFT (that is, in a gate metal layer). Next, an interlayer insulating layer 910 is formed to cover the gate metal layer including the first wiring line 908. The first wiring line 908 is, for example, a Cu wiring line. The interlayer insulating layer 910 is, for example, a $SiO_2$ layer.

Figure 19B:
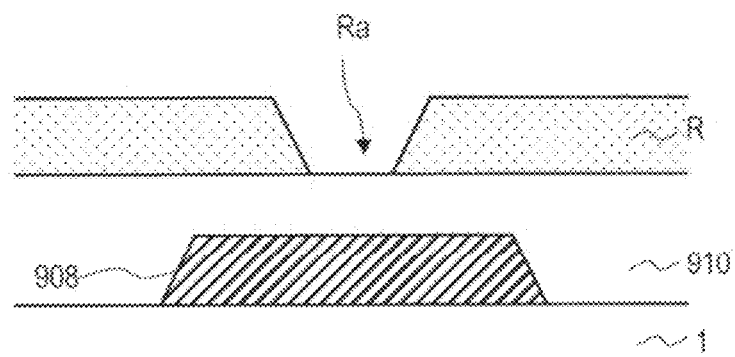
FIG. 19B is a process cross-sectional view illustrating the method for forming the conventional wiring line connection section and the mechanism for forming the projection.

Next, as illustrated in FIG. 19B, a resist layer R including an opening Ra is formed on the interlayer insulating layer 910. The opening Ra is disposed to overlap a part of the first wiring line 908 when viewed from the normal direction of the substrate 1.

Figure 19C:
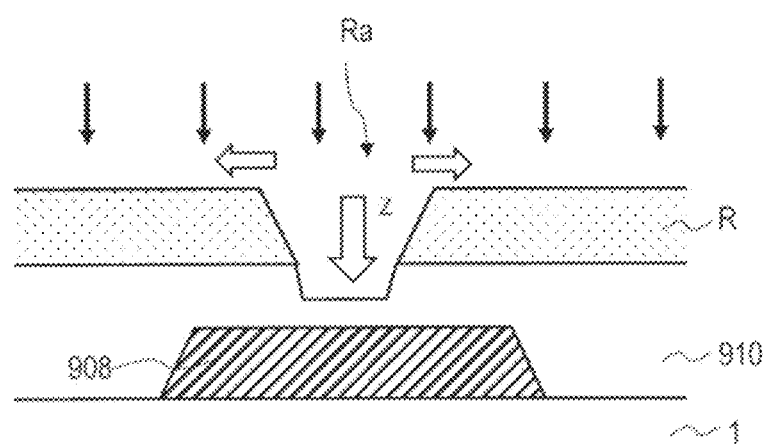
FIG. 19C is a process cross-sectional view illustrating the method for forming the conventional wiring line connection section and the mechanism for forming the projection.

Next, as illustrated in FIG. 19C, dry etching of the interlayer insulating layer 910 is performed by using the resist layer R as a mask. For example, $CF_4/O_2$ is used as etching gas. By employing the dry etching, an etching shift can be reduced even when the interlayer insulating layer 910 is relatively thick (for example, a thickness equal to or larger than 400 nm).

In dry etching, a chemical etching action and a physical etching action are generated. Thus, as illustrated in the figure, while etching of the interlayer insulating layer 910, which is a film to be etched, proceeds in a direction z from the above of the opening Ra in the resist layer R toward the substrate 1, the resist layer R is also being etched. When viewed from the normal direction of the substrate 1, the resist layer R is retreated at the edge of the opening Ra toward the outer side.

Figure 19D:
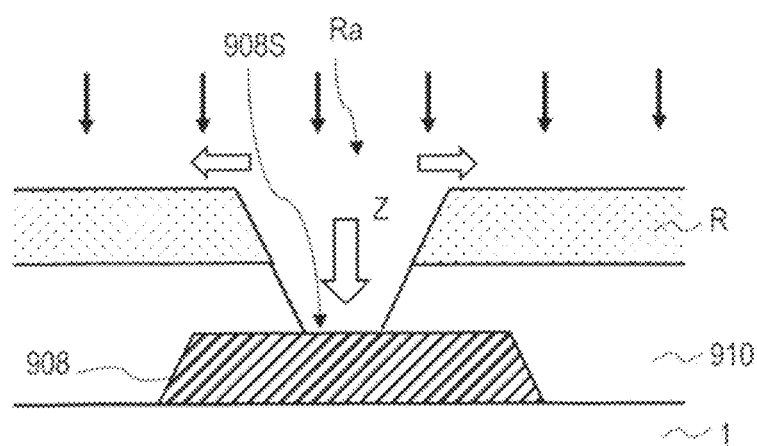
FIG. 19D is a process cross-sectional view illustrating the method for forming the conventional wiring line connection section and the mechanism for forming the projection.

As etching of the interlayer insulating layer 910 proceeds, as illustrated in FIG. 19D, a surface (here, a Cu surface) 908S of the first wiring line 908 that serves as an underlayer is exposed (just etching).

Figure 19E:
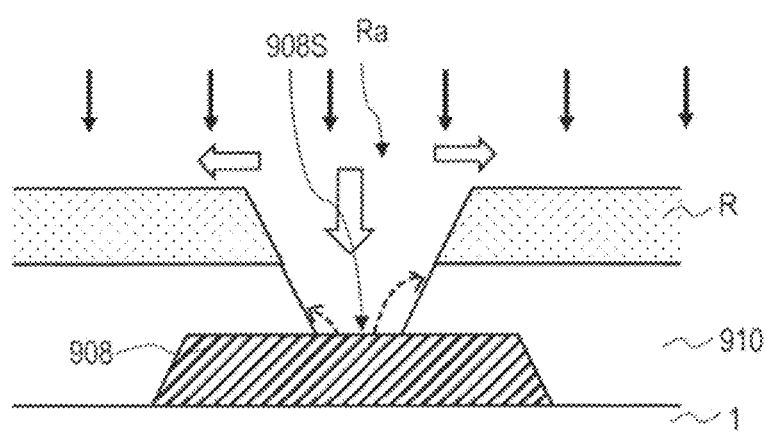
FIG. 19E is a process cross-sectional view illustrating the method for forming the conventional wiring line connection section and the mechanism for forming the projection.

Typically, even after the Cu surface is exposed, as illustrated in FIG. 19E, overetching is performed to more reliably expose the first wiring line 908 having a predetermined area, in view of variations in the thickness of the interlayer insulating layer 910. In performing the overetching, an etching rate is small, but the exposed surface (Cu surface) of the first wiring line 908 is also etched. As a result, a reaction product containing Cu protrudes from the exposed surface 908S of the first wiring line 908, and a part thereof adheres to the side wall or upper face of the opening of the interlayer insulating layer 910. In a portion of the interlayer insulating layer 910 to which the reaction product containing Cu is attached, the progress of etching of the interlayer insulating layer 910 is inhibited compared with the other portions, because the attached reaction product serves as an etching mask.

Figure 19F:
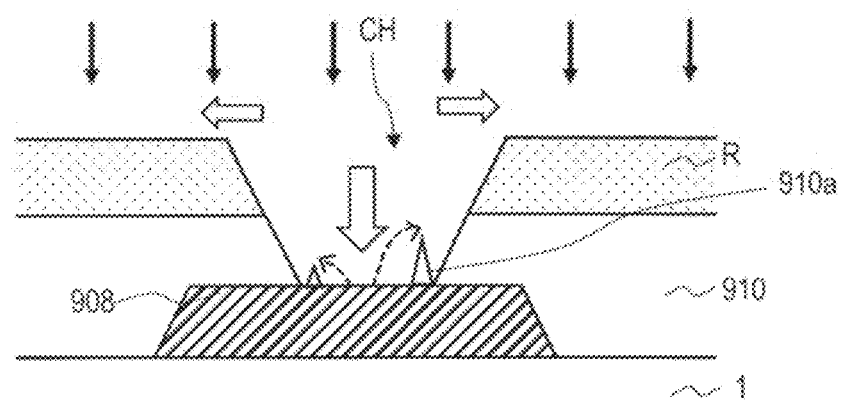
FIG. 19F is a process cross-sectional view illustrating the method for forming the conventional wiring line connection section and the mechanism for forming the projection.

In this way, as illustrated in FIG. 19F, a contact hole CH that exposes a part of the first wiring line 908 is obtained in the interlayer insulating layer 910. A projection 910a formed of a material of the interlayer insulating layer 910 is formed at and below the portion of the interlayer insulating layer 910 to which the reaction product containing Cu is attached, in the contact hole CH. Note that Cu is a material in which fluoride thereof is less likely to volatilize among metal materials. Because of this, the fluoride of Cu adheres to the side wall of the contact hole to form an etching mask, and the projection 910a is likely to be generated.

Figure 19G:
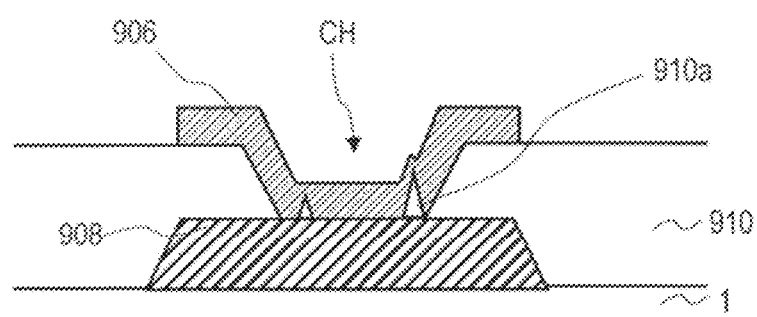
FIG. 19G is a process cross-sectional view illustrating the method for forming the conventional wiring line connection section and the mechanism for forming the projection.

Next, as illustrated in FIG. 19G, after the resist layer R is removed, a second wiring line 906 is formed on the interlayer insulating layer 910 and in the contact hole CH by using a conductive film identical to that of the source electrode (that is, in a source metal layer). The second wiring line 906 is electrically connected to the first wiring line 908 in the contact hole CH. At this time, the coverage characteristics of the second wiring line 906 may decrease due to the projection 910a in the contact hole CH.

Figure 19H:
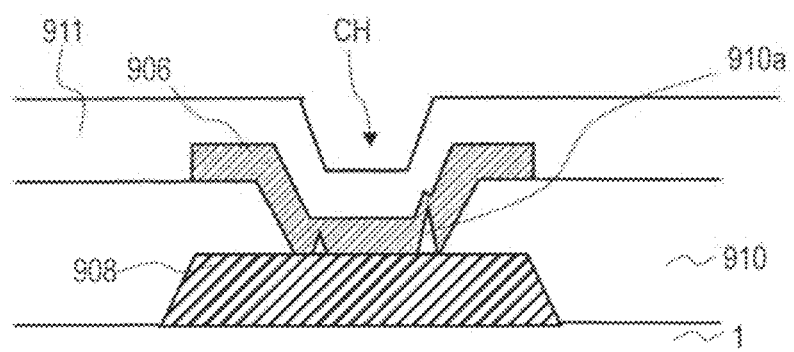
FIG. 19H is a process cross-sectional view illustrating the method for forming the conventional wiring line connection section and the mechanism for forming the projection.

After this, as illustrated in FIG. 19H, a protective insulating film (passivation film) 911 is formed to cover the source metal layer. The protective insulating film 911 may also affected by the projection 910a, and thereby, may not have good coverage characteristics.

Figure 20:
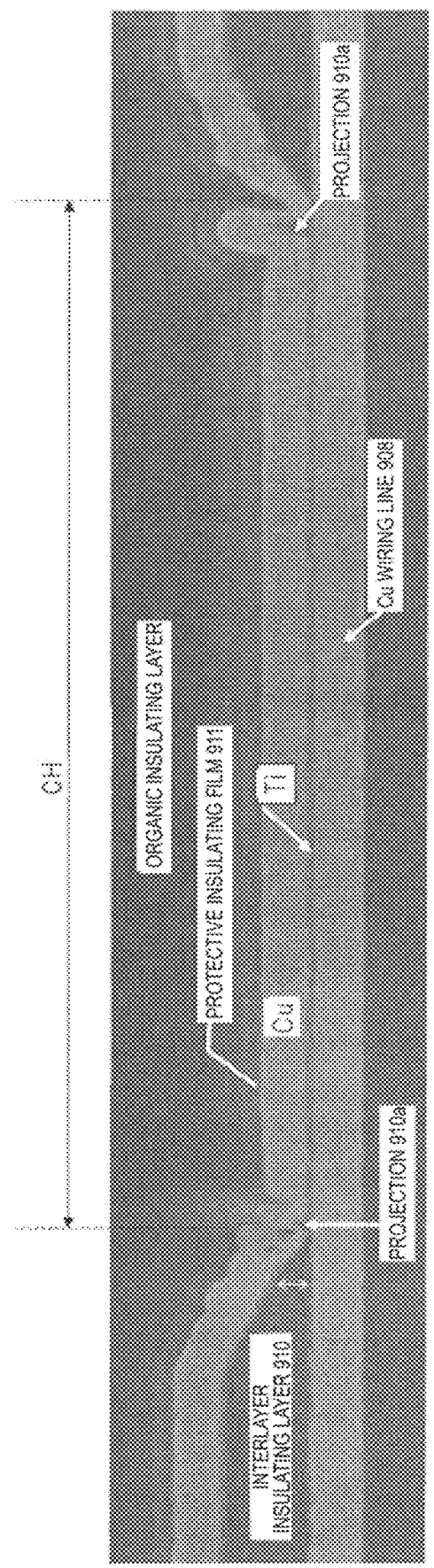
FIG. 20 is a diagram showing a cross-sectional SEM image of the conventional wiring line connection section.

FIG. 20 is a diagram showing a cross-sectional SEM image of a conventional wiring line connection section formed by the above-described method.

In this example, the interlayer insulating layer ($SiO_2$ layer) 910 is disposed to cover the first wiring line (Cu wiring line) 908, and the contact hole CH exposing a part of the Cu wiring line 908 is formed in the interlayer insulating layer 910. A layered wiring line (Cu/Ti wiring line) including a Ti film and a Cu film is formed from the substrate side as the second wiring line in the contact hole CH. The protective insulating film 911 is formed above the second wiring line.

As illustrated in the figure, it can be seen that a plurality of projections 910a are formed on the upper face of the Cu wiring line 908 in the contact hole CH. The projections 910a are positioned at or near the side wall of the interlayer insulating layer 910, for example. Due to these projections 910a, the coverage characteristics of the second wiring line (Cu/Ti film) and the protective insulating film 911 are reduced. In particular, portions of the protective insulating film 911 positioned above the projections 910a are affected by the projections 910a to be in a state in which "voids" are formed, that is, a state in which fine holes, micro bubbles, or the like are formed. Thus, moisture, hydrogen, or the like may enter the oxide semiconductor layer, which is an active layer of the TFT, from the portions having the "voids" of the protective insulating film 911. As a result, there is a concern that degradation such as a reduction in electrical resistance of the oxide semiconductor layer may occur, because the oxide semiconductor is reduced to increase oxygen defects. For example, the entrance of moisture, hydrogen, or the like into the oxide semiconductor layer lowers resistance of the oxide semiconductor layer, and a threshold voltage Vth of the oxide semiconductor TFT is easily shifted to the negative side. When the threshold voltage Vth is shifted to the negative side, there is a risk that an off-leak current may increase, conduction between the source and the drain may occur, or depletion (a normally-on state) may occur. This may cause a bright spot defect that the pixel always has the maximum pixel value, in a case where the oxide semiconductor TFT is used as the pixel TFT. Additionally, this may cause malfunction of a circuit such as a gate driver circuit, in a case where the oxide semiconductor TFT is used as a circuit TFT.

Against this, the inventors of the present application have considered and found that when a metal oxide layer containing an oxide material identical to that of the active layer (channel region) of the oxide semiconductor TFT is formed on the top layer of the gate metal layer, the formation of projections as described above can be suppressed.

Figure 21:
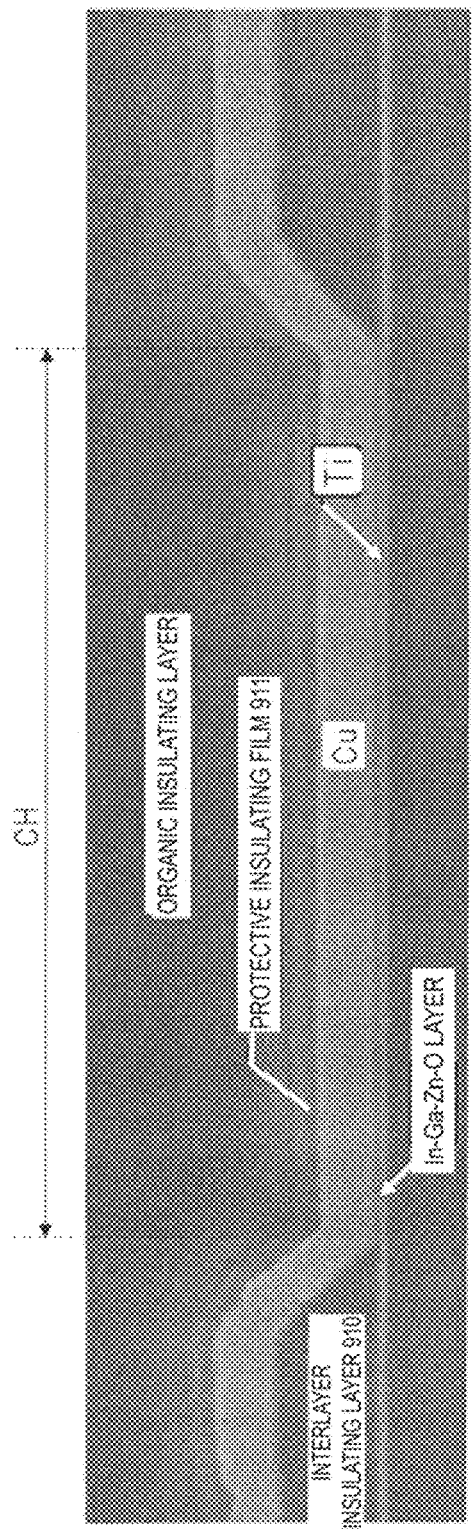
FIG. 21 is a diagram showing a cross-sectional SEM image in a case where a contact hole is formed in an interlayer insulating layer by using an In—Ga—Zn—O-based oxide layer as an underlayer.

FIG. 21 is a cross-sectional SEM image showing an example in which the contact hole CH is formed in the interlayer insulating layer ($SiO_2$ layer) 910 with a metal oxide layer (here, an In—Ga—Zn—O-based oxide layer) serving as the underlayer. As can be seen from FIG. 21, when dry etching of the interlayer insulating layer 910 is performed with the metal oxide layer serving as the underlayer, projections as illustrated in FIG. 19F and FIG. 20 are not seen in the contact hole CH. It is possible that, because the metal oxide layer is less likely to be etched than the Cu layer, for example, even when overetching is performed, an etching inhibitor is unlikely to protrude from the surface of the metal oxide layer, and as a result, the formation of projections caused by the etching inhibitor is suppressed. Thus, the second wiring line (Cu/Ti wiring line) disposed in the contact hole CH and the protective insulating film 911 disposed thereon can have good coverage characteristics.

Based on the above knowledge, the inventors of the present application have found a new structure capable of suppressing the formation of a projection when dry etching of an interlayer insulating layer is performed, and have arrived at the present invention.

Hereinafter, an active matrix substrate according to a first embodiment of the present invention will be described with reference to the drawings.

Basic Structure of Active Matrix Substrate 101

Figure 1:
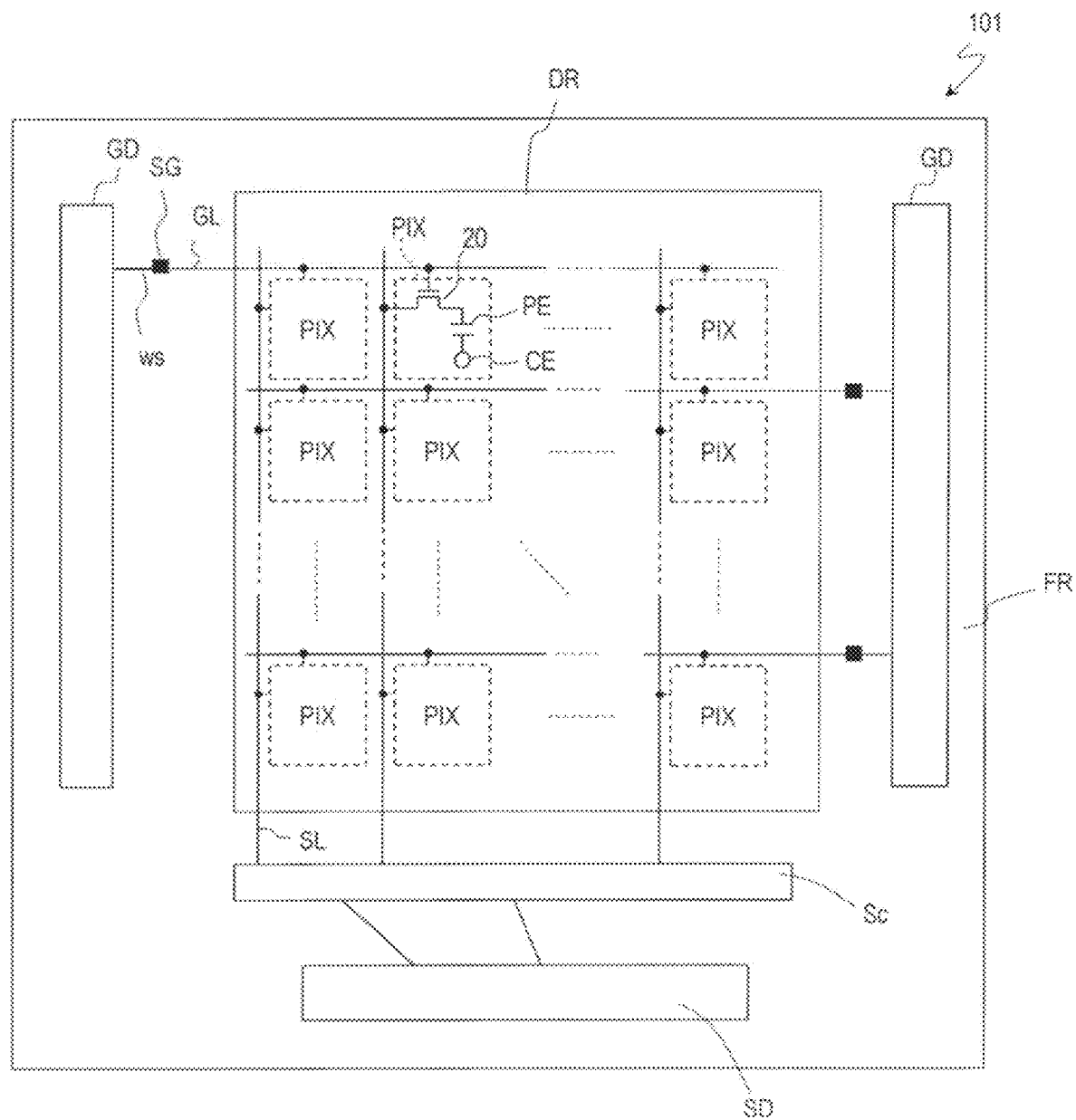
FIG. 1 is a schematic view illustrating an example of a planar structure of an active matrix substrate 101.

FIG. 1 is a plan view schematically illustrating an example of an active matrix substrate 101. The active matrix substrate 101 includes a display region DR contributing to display, and a peripheral region (frame region) FR positioned outside the display region DR. The display region DR includes a plurality of pixel areas PIX arranged in a matrix shape. Each of the plurality of pixel areas PIX (also referred to as a "pixel") is an area corresponding to a pixel of the display device. The non-display region FR is a region positioned in a periphery of the display region DR and does not contribute to display.

The active matrix substrate 101 includes, in the display region DR, a substrate 1, a plurality of pixel TFTs supported by the substrate 1 (hereinafter simply referred to as "TFTs") 20, a plurality of pixel electrodes PE, a plurality of gate bus lines GL that supply gate signals to the TFTs 20, and a plurality of source bus lines SL that supply source signals to the TFTs 20. The TFT 20 is an oxide semiconductor TFT having an oxide semiconductor layer as an active layer.

Each of the plurality of pixel areas PIX is defined by the gate bus line GL and the source bus line SL, for example. The source bus lines SL extend in a direction intersecting with the gate bus lines GL.

Each TFT 20 and each pixel electrode PE are provided corresponding to one of the plurality of pixel areas PIX. A gate electrode of the TFT 20 is electrically connected to one of the plurality of gate bus lines GL. A part (referred to as a "first region") of the oxide semiconductor layer of the TFT 20 is electrically connected to one of the plurality of source bus lines SL. Another part (referred to as a "second region") of the oxide semiconductor layer of the TFT 20 is electrically connected to the pixel electrode PE.

When the active matrix substrate 101 is applied to a display device of a transverse electrical field mode such as a Fringe Field Switching (FFS) mode, an electrode (common electrode) CE that is common to the plurality of pixels PIX is provided in the active matrix substrate 101.

Peripheral circuits such as gate drivers GD that drive the gate bus lines GL and an SSD circuit Sc that drives the source bus lines SL in a time division manner are formed in the non-display region FR in a monolithic manner. The SSD circuit Sc is connected to a source driver SD mounted by a Chip On Glass (COG) system, for example.

Each of the gate bus lines GL is connected to the gate driver (not illustrated) via a corresponding gate terminal section. Each of the source bus lines SL is connected to the source driver (not illustrated) via a corresponding source terminal section. The gate driver and the source driver may be monolithically formed or implemented in the non-display region FR of the active matrix substrate 100.

Wiring line connection sections such as a plurality of gate terminal sections, a plurality of source terminal sections, and a plurality of source-gate connection sections SG are further disposed in the non-display region FR. The source-gate connection section SG is a connection changing portion between wiring lines formed in the source metal layer (or formed using the same conductive film as that of the source bus line SL) and wiring lines formed in the gate metal layer (or formed using the same conductive film as that of the gate bus line GL). As illustrated in the figure, the source-gate connection section SG may connect each gate bus line GL to a connection wiring line (source connection wiring line) ws formed in the source metal layer, for example. The source connection wiring line ws is connected to the gate driver via the gate terminal section. In this case, the source terminal section and the gate terminal section may have a similar structure. Note that the source-gate connection section may be a connection section that connects each source bus line SL to a connection wiring line (gate connection wiring line) formed in the gate metal layer, for example.

Structure of Pixel Area in Active Matrix Substrate 101

Hereinafter, a structure of the pixel area of the active matrix substrate of the present embodiment will be described by using an active matrix substrate applied to a display device of an FFS mode as an example, with reference to the accompanying drawings. The FFS mode is a mode of a transverse electrical field scheme in which a pair of electrodes are provided in one of substrates, and an electrical field is applied to liquid crystal molecules in a direction (transverse direction) parallel to the substrate plane.

In the following description, a layer that includes electrodes, wiring lines, and the like formed from a first conductive film (also referred to as a lower conductive film) and that is disposed closer to the substrate side than the oxide semiconductor layer serving as the active layer of the pixel TFT is referred to as a "first metal layer M1". The first metal layer includes, for example, a light blocking layer (referred to as a "lower electrode") of the pixel TFT. Additionally, a layer that is disposed on the oxide semiconductor layer with the gate insulating layer interposed therebetween and that includes electrodes, wiring lines, and the like formed from a second conductive film is referred to as a "second metal layer M2". The second metal layer M2 is a layer (gate metal layer) including a plurality of gate bus lines GL and gate electrodes of the respective pixel TFTs. Furthermore, a layer that is disposed on the second metal layer M2 with the interlayer insulating layer interposed therebetween and that includes electrodes, wiring lines, and the like formed from a third conductive film is referred to as a "third metal layer M3". In the present embodiment, the third metal layer M3 is a layer (source metal layer) including a plurality of source bus lines SL and source electrodes of the respective pixel TFTs. Note that, as described below, the source bus lines SL may be formed in the first metal layer M1.

In the present specification, when two or more electrodes and wiring lines are formed by using an identical conductive film (that is, in an identical metal layer), these electrodes and wiring lines are expressed as an "identical layer", and when the electrodes and wiring lines are formed in different metal layers, these electrodes and wiring lines may be expressed as "different layers".

In the drawings, after a reference sign of each constituent element, a layer in which these electrodes and wiring lines and the like are formed may be represented in parentheses. For example, "(M1)" may be added after the reference sign of the electrode or wiring line formed in the first metal layer M1.

Figure 2A:
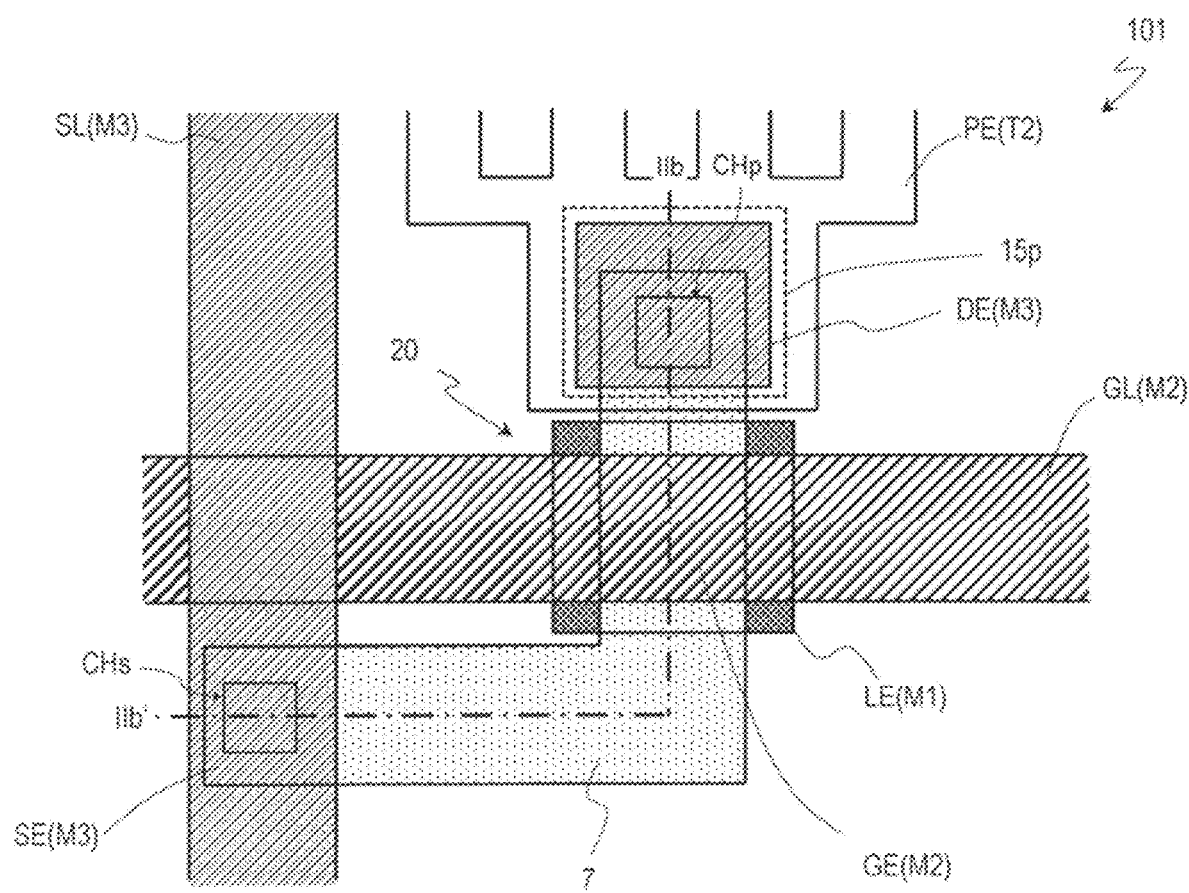
FIG. 2A is a plan view illustrating an example of a pixel area in the active matrix substrate 101 according to a first embodiment.
Figure 2B:
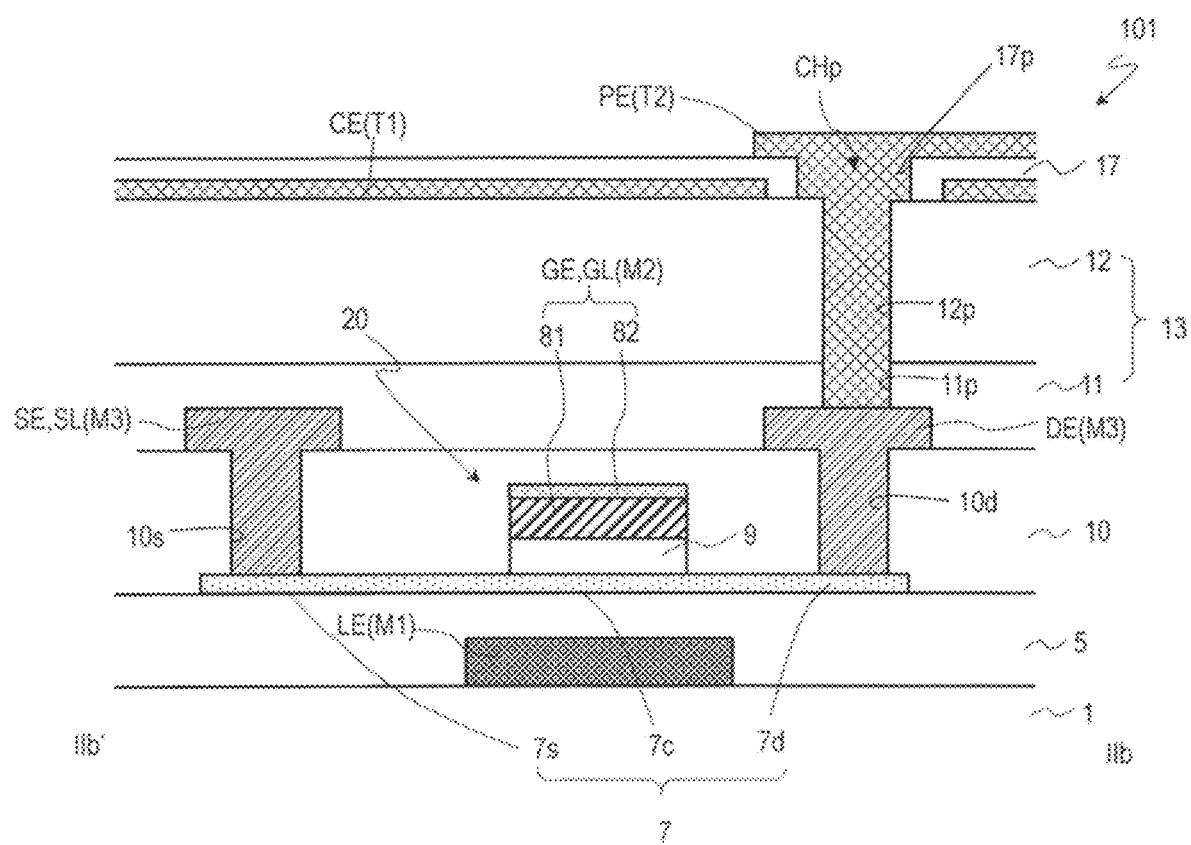
FIG. 2B is a cross-sectional view of the pixel area taken along the line IIb-IIb' illustrated in FIG. 2A.

FIG. 2A is a plan view illustrating an example of the pixel area in the active matrix substrate 101. Although the active matrix substrate 101 has many pixel areas, only one pixel area is illustrated in FIG. 2A. FIG. 2B is a cross-sectional view taken along the line IIb-IIb' illustrated in FIG. 2A, and illustrates a cross section of the TFT 20 in a channel length direction.

The active matrix substrate 101 includes a substrate 1 having a main surface, a first metal layer M1 disposed on the main surface of the substrate 1, a lower insulating layer 5 covering the first metal layer M1, a second metal layer M2 including a plurality of gate bus lines GL extending in a row direction, an interlayer insulating layer 10 covering the second metal layer M2, a third metal layer M3 disposed on the interlayer insulating layer 10 and including a plurality of source bus lines SL extending in a column direction, and an upper insulating layer 13 covering the third metal layer M3.

The active matrix substrate 101 also includes a plurality of top-gate type TFTs (pixel TFTs) 20 and a plurality of pixel electrodes PE. Each of the plurality of TFTs 20 and each of the plurality of pixel electrodes PE are provided corresponding to each of the plurality of pixel areas PIX. The active matrix substrate 101 may further include a common electrode CE.

Each TFT 20 includes an oxide semiconductor layer 7 disposed on the lower insulating layer 5, a gate electrode GE disposed on a part of the oxide semiconductor layer 7 with a gate insulating layer 9 being interposed therebetween, a source electrode SE, and a drain electrode DE.

The oxide semiconductor layer 7 includes a channel region 7c, and a first region 7s and a second region 7d disposed at both sides of the channel region 7c. The first region 7s and the second region 7d are low-resistive regions having specific resistances lower than that of the channel region 7c. The first region 7s is electrically connected to the source electrode SE, and the second region 7d is electrically connected to the drain electrode DE.

The gate electrode GE is disposed so as to overlap the channel region 7c when viewed from a normal direction of the main surface of the substrate 1 (hereinafter abbreviated as a "normal direction of the substrate 1"). The gate electrode GE is formed by using a conductive film identical to that of the gate bus line GL (that is, in the second metal layer M2). The gate electrode GE is electrically connected to the corresponding gate bus line GL. The gate electrode GE may be formed integrally with the corresponding gate bus line GL. For example, the gate electrode GE may be connected to the corresponding gate bus line GL, or may be a part of the corresponding gate bus line GL as illustrated in the figure. In this case, a portion of the gate bus line GL that overlaps the oxide semiconductor layer 7 when viewed from the normal direction of the substrate 1 may be referred to as the "gate electrode GE".

In the present embodiment, the electrode and wiring line in the second metal layer M2, such as the gate electrode GE and the gate bus line GL, have a layered structure including a Cu-containing conductive layer 81 containing Cu, and a metal oxide layer 82 disposed on the Cu-containing conductive layer 81. The Cu-containing conductive layer 81 includes, for example, a Cu layer. The metal oxide layer 82 may be the top layer of the second metal layer M2. The metal oxide layer 82 covers the upper face of the Cu-containing conductive layer 81. The metal oxide layer 82 may cover the entire upper face of the Cu-containing conductive layer 81, for example, or may cover the upper face and the side face of the Cu-containing conductive layer 81. The metal oxide layer 82 may directly contact the upper face of the Cu-containing conductive layer 81.

Although not illustrated in the figure, the second metal layer M2 may include a Ti layer or a Cu alloy layer as the bottom layer in order to improve adhesion with the substrate surface (or the underlayer surface). For example, the Cu-containing conductive layer 81 may be a layered film including a Cu layer and a Cu alloy layer disposed on the substrate 1 side of the Cu layer. Alternatively, the second metal layer M2 may further include a barrier metal layer (for example, a Ti layer, a Mo layer, or the like) on the substrate 1 side of the Cu-containing conductive layer 81.

The metal oxide layer 82 is a different layer from the oxide semiconductor layer 7, but includes an oxide material identical to that of the oxide semiconductor layer 7. The oxide semiconductor layer 7 herein refers to a layer formed from the oxide semiconductor film configuring the channel region 7c, and does not include an oxide film or a conductive film formed on a region of the oxide semiconductor film other than the channel region 7c.

For example, when the oxide semiconductor layer 7 is an In—Ga—Zn—O-based semiconductor layer, the metal oxide layer 82 is an In—Ga—Zn—O-based oxide layer. The oxide semiconductor layer 7 and the metal oxide layer 82 may be designed to include identical types of metal elements at an identical composition ratio (a ratio of the numbers of atoms for all the metal elements included in the oxide material). For example, the oxide semiconductor layer 7 and the metal oxide layer 82 may be sputtered films formed by using an identical target. As with the first region 7s and the second region 7d of the oxide semiconductor layer 7, the metal oxide layer 82 is a low-resistive region having a specific resistance lower than that of the channel region 7c. The low-resistive region may be a conductor region (for example, a sheet resistance being equal to or less than 200Ω/□).

The gate insulating layer 9 may cover the channel region 7c and may not cover the first region 7s and the second region 7d. In the illustrated example, the gate insulating layer 9 is formed only in a region overlapping the second metal layer M2 when viewed from the normal direction of the substrate 1. Such a configuration is obtained by patterning the gate insulating layer 9 by using an etching mask (resist layer) identical to that for the patterning of the second metal layer M2. The edges of the gate insulating layer 9 may be aligned with the edges of the electrode and wiring line in the second metal layer M2.

The interlayer insulating layer 10 is formed to cover the oxide semiconductor layer 7, the gate insulating layer 9, and the second metal layer M2. The interlayer insulating layer 10 may be in contact with the first region 7s and the second region 7d of the oxide semiconductor layer 7.

The source electrode SE and the drain electrode DE are arranged on the interlayer insulating layer 10. In this example, the source electrode SE and the drain electrode DE are formed by using a conductive film identical to that of the source bus line SL (that is, in the third metal layer M3). The source electrode SE is electrically connected to the corresponding source bus line SL. The drain electrode DE is electrically connected to the corresponding pixel electrode PE. The source electrode SE may be integrally formed with the corresponding source bus line SL. For example, the source electrode SE may be connected to the corresponding source bus line SL, or may be a part of the corresponding source bus line SL as illustrated in the figure. In such a case, a portion of the source bus line SL connected to the first region 7s of the oxide semiconductor layer 7 is referred to as the "source electrode SE".

A first opening 10s that exposes a part of the first region 7s of the oxide semiconductor layer 7 and a second opening 10d that exposes a part of the second region 7d are provided in the interlayer insulating layer 10. The source electrode SE is arranged on the interlayer insulating layer 10 and in the first opening 10s, and is connected to the first region 7s in the first opening 10s. The drain electrode DE is arranged on the interlayer insulating layer 10 and in the second opening 10d, and is connected to the second region 7d in the second opening 10d.

Each TFT 20 may include a lower electrode LE at the substrate 1 side of the oxide semiconductor layer 7. The lower electrode LE is formed in the first metal layer M1. The lower electrode LE may be disposed to overlap at least the channel region 7c of the oxide semiconductor layer 7 when viewed from the normal direction of the substrate 1. The lower electrode LE may be configured to block light (backlight) from the substrate 1 side toward the channel region 7c to function as a light blocking layer. This can suppress deterioration of characteristics of the oxide semiconductor layer 7 caused by the entrance of light (backlight) from the substrate 1 side into the channel region 7c. The lower electrode LE may be in an electrically floating state or may be fixed to a fixed potential (for example, a common potential). Alternatively, the lower electrode LE may be electrically connected to the gate electrode GE to function as the lower gate electrode of the TFT 20.

The upper insulating layer 13 includes an inorganic insulating layer (a passivation film) 11, for example. As illustrated in the figure, the upper insulating layer 13 may include a layered structure including the inorganic insulating layer 11 and an organic insulating layer 12 that is formed on the inorganic insulating layer 11. The organic insulating layer 12 may not be formed. Alternatively, the organic insulating layer 12 may be formed only in the display region.

A pixel electrode PE and a common electrode CE may be arranged so as to face with each other with a dielectric layer 17 interposed therebetween. In the present example, the common electrode CE is disposed on the upper insulating layer 13, and the pixel electrode PE is disposed on the common electrode CE with the dielectric layer 17 interposed therebetween. Note that the pixel electrode PE may be disposed on the upper insulating layer 13, and the common electrode CE may be disposed on the pixel electrode PE with the dielectric layer 17 interposed therebetween. In the present specification, an electrode positioned at the substrate 1 side of the common electrode CE and the pixel electrode PE is referred to as a "lower transparent electrode", and an electrode disposed on the lower transparent electrode with the dielectric layer 17 interposed therebetween is referred to as an "upper transparent electrode". In addition, a layer including the lower transparent electrode is referred to as a "lower transparent conductive layer T1", and a layer including the upper transparent electrode is referred to as an "upper transparent conductive layer T2". In the upper transparent electrode (in the pixel electrode PE in this example), one or a plurality of slits (openings) or notched portions are provided in each pixel area.

The plurality of pixel electrodes PE are separated for each pixel area. The pixel electrode PE is electrically connected to the drain electrode DE of the corresponding TFT 20 in a pixel contact hole CHp. In the present embodiment, the pixel electrode PE is disposed on the dielectric layer 17, and thus, the pixel contact hole CHp is formed in the upper insulating layer 13 and the dielectric layer 17. The pixel contact hole CHp is configured of an opening 11p of the inorganic insulating layer 11, an opening 12p of the organic insulating layer 12, and an opening 17p of the dielectric layer 17.

The common electrode CE is not necessarily be separated for each pixel area PIX. For example, the common electrode CE may include an opening 15p on a region where each pixel contact hole CHp is formed, and may be formed across the entire pixel area except for this region.

The TFT 20 may not include the drain electrode DE in the third metal layer M3. For example, a pixel contact hole exposing the second region 7d of the oxide semiconductor layer 7 may be formed in the insulating layer including the upper insulating layer 13, and the pixel electrode PE may directly contact the second region 7d of the oxide semiconductor layer 7 in the pixel contact hole.

Although not illustrated in the drawings, a circuit TFT having a structure similar to that of the TFT 20 serving as the pixel TFT may be provided in the non-display region.

Wiring Line Connection Section 31

The active matrix substrate 101 includes a plurality of wiring line connection sections. The wiring line connection section connects the electrode and wiring line in the second metal layer M2 and the electrode and wiring line in the metal layer (for example, the third metal layer M3) positioned at an upper layer than the second metal layer M2.

The wiring line connection sections include a plurality of source-gate connection sections provided in the non-display region. In each source-gate connection section, for example, the corresponding one of the gate bus lines GL in the second metal layer M2 is connected to the source connection wiring line disposed in the third metal layer M3. The gate bus line GL may be connected to the gate driver through the source connection wiring line. Alternatively, in each source-gate connection section, for example, the corresponding one of the source bus lines SL in the third metal layer M3 (in the first metal layer M1 in the case of the lower source substrate) may be connected to the gate connection wiring line disposed in the second metal layer M2. The source bus line SL may be connected to the source driver through the gate connection wiring line. Note that the source-gate connection section may be a connection section that connects the wiring lines other than the bus lines with each other in the second metal layer M2 and the third metal layer M3.

The wiring line connection section according to the present embodiment will be described below by using the source-gate connection section as an example.

Figure 3A:
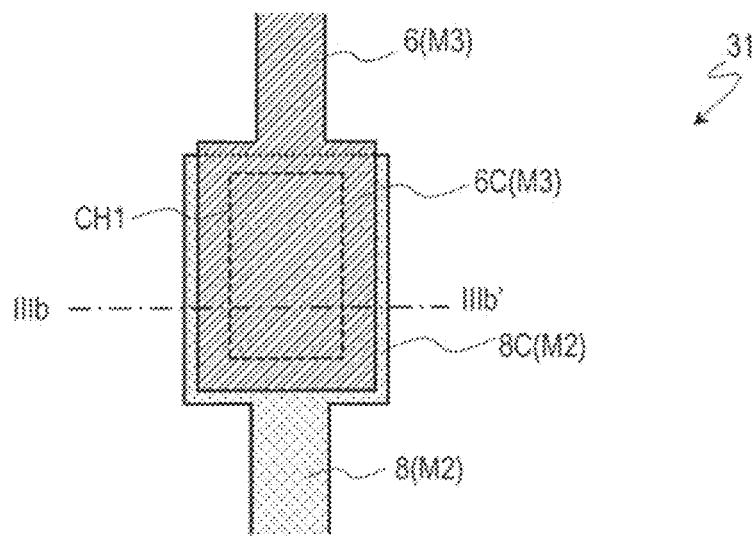
FIG. 3A is a plan view illustrating an example of a wiring line connection section 31 in the active matrix substrate 101.
Figure 3B:
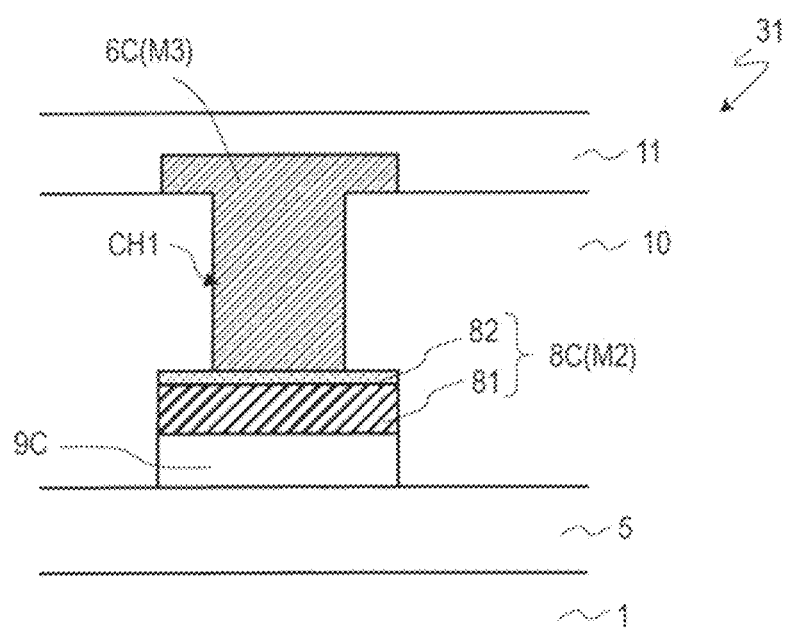
FIG. 3B is a cross-sectional view of the wiring line connection section 31 taken along the line IIIb-IIIb' illustrated in FIG. 3A.

FIG. 3A and FIG. 3B are respectively a plan view and a cross-sectional view illustrating an example of a wiring line connection section (source-gate connection section) 31 according to the present embodiment. The active matrix substrate 101 includes a plurality of source-gate connection sections, but here, only a single source-gate connection section is illustrated.

The wiring line connection section (source-gate connection section) 31 includes a first connection electrode 8C formed in the second metal layer M2, the interlayer insulating layer 10 extending on the first connection electrode 8C, a wiring line contact hole CH1 formed in an insulating layer (here, the interlayer insulating layer 10) including the interlayer insulating layer 10, and a second connection electrode 6C formed on the interlayer insulating layer 10. The second connection electrode 6C is formed, for example, in the third metal layer M3.

The first connection electrode 8C may be a part of a first wiring line 8 in the second metal layer M2. The second connection electrode 6C may be a part of a second wiring line 6 in the third metal layer M3. For example, the first wiring line 8 may be the gate bus line GL, and the second wiring line 6 may be a source connection wiring line. Alternatively, the second wiring line 6 may be the source bus line SL, and the first wiring line 8 may be a gate connection wiring line.

The first connection electrode 8C is disposed, for example, on the substrate 1 with the lower insulating layer 5 and the gate insulating layer 9C interposed therebetween. The first connection electrode 8C has a layered structure including the Cu-containing conductive layer 81 and the metal oxide layer 82 described above. The metal oxide layer 82 is disposed on the Cu-containing conductive layer 81 (for example, a Cu layer) so as to cover the upper face of the Cu-containing conductive layer 81. The metal oxide layer 82 may directly contact the upper face of the Cu-containing conductive layer 81. In this example, the metal oxide layer 82 covers only the upper face of the Cu-containing conductive layer 81, but may cover the upper and side faces of the Cu-containing conductive layer 81. In the present embodiment, the first wiring line 8 also has a layered structure similar to that of the first connection electrode 8C. Note that a portion of the first wiring line 8 other than the first connection electrode 8C does not necessarily have the metal oxide layer 82.

The wiring line contact hole CH1 exposes a part of the metal oxide layer 82 in the first connection electrode 8C. The wiring line contact hole CH1 may be formed in an etching step common to a source contact hole CHs and a drain contact hole CHd.

The second connection electrode 6C is disposed on the interlayer insulating layer 10 and in the wiring line contact hole CH1, and directly makes contact with the exposed portion of the metal oxide layer 82 of the first connection electrode 8C in the wiring line contact hole CH1.

The third metal layer M3 including the second connection electrode 6C is covered by the inorganic insulating layer 11. In the non-display region, an organic insulating layer may not be formed on the inorganic insulating layer 11.

Note that the second connection electrode 6C may be disposed above the interlayer insulating layer 10, and may be formed in another metal layer different from the second metal layer M2. For example, in an active matrix substrate to be used in an in-cell touch panel, a metal layer for forming wiring lines for the touch panel may be separately provided. The second connection electrode 6C may be formed in a metal layer identical to that of the wiring lines for the touch panel. Alternatively, the second connection electrode 6C may be a transparent electrode or transparent wiring line formed in the lower transparent conductive layer T1 or the upper transparent conductive layer T2.

Here, the source-gate connection section has been described as an example, but other wiring line connection sections such as a terminal section may have a similar cross-sectional structure.

Effects

In the present embodiment, the second metal layer M2 includes the Cu-containing conductive layer 81 and the metal oxide layer 82 disposed on the Cu-containing conductive layer 81. Because the second metal layer M2 includes the Cu-containing conductive layer 81, an electrode or wiring line with low resistance can be formed in the second metal layer M2.

In addition, by providing the metal oxide layer 82 on the Cu-containing conductive layer 81, the following effects can be obtained. As described above by using FIG. 19A to FIG. 19H and FIG. 20, in the conventional wiring line connection section, in the etching step (dry etching) of the interlayer insulating layer, there is a concern that an etching inhibitor may be generated from the Cu surface exposed in the opening of the interlayer insulating layer to adhere to the side wall or upper face of the interlayer insulating layer, and thus, a projection may be formed in the opening. Such a projection can be a factor that degrades the coverage characteristics of the wiring line and the protective insulating film formed above the projection. In contrast, in the present embodiment, in the etching step of the interlayer insulating layer 10, the metal oxide layer 82 is exposed in the opening of the interlayer insulating layer 10. The metal oxide layer 82 is less likely to be etched than a metal layer such as a Cu layer, and thus, the occurrence of an etching inhibitor caused by overetching is suppressed. As a result, a projection is hardly formed in the wiring line contact hole CH1 formed in the interlayer insulating layer 10 (see FIG. 21), and thus, a degradation in coverage characteristics of the second connection electrode 6C and the protective insulating film (here, the inorganic insulating layer 11) disposed above the wiring line contact hole CH1 can be suppressed. According to this, deterioration of TFT characteristics caused by moisture and hydrogen entering the oxide semiconductor layer 7, that is, depletion or conduction between the source and the drain can be suppressed.

The metal oxide layer 82 may be formed by using a sputtering target identical to that of the oxide semiconductor layer 7 of the TFT 20. This can suppress an increase in manufacturing costs. Additionally, as will be described below, the metal oxide layer 82 is lowered in resistance in a step identical to that of the first region 7s and the second region 7d of the oxide semiconductor layer 7. According to this, even when the metal oxide layer 82 is disposed on the Cu-containing conductive layer 81 in the second metal layer M2, increases in electrical resistance of the electrode and wiring line of the second metal layer M2 can be suppressed.

Figure 4A:
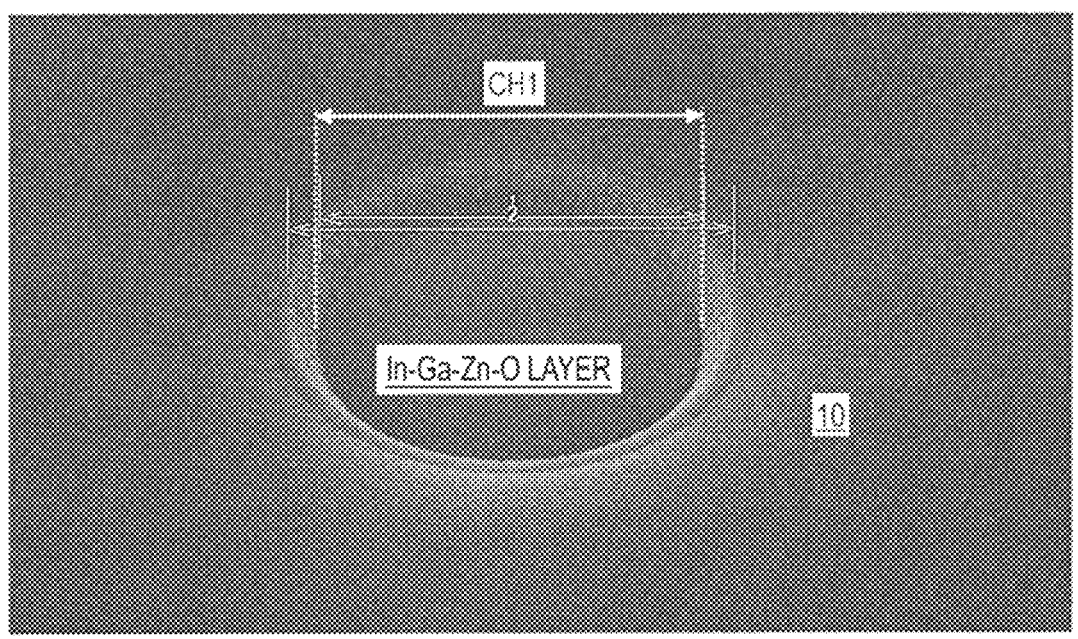
FIG. 4A is an SEM image showing a surface state of an In—Ga—Zn—O-based oxide layer exposed in a wiring line contact hole CH1 when the In—Ga—Zn—O-based oxide layer is used as an underlayer.
Figure 4B:
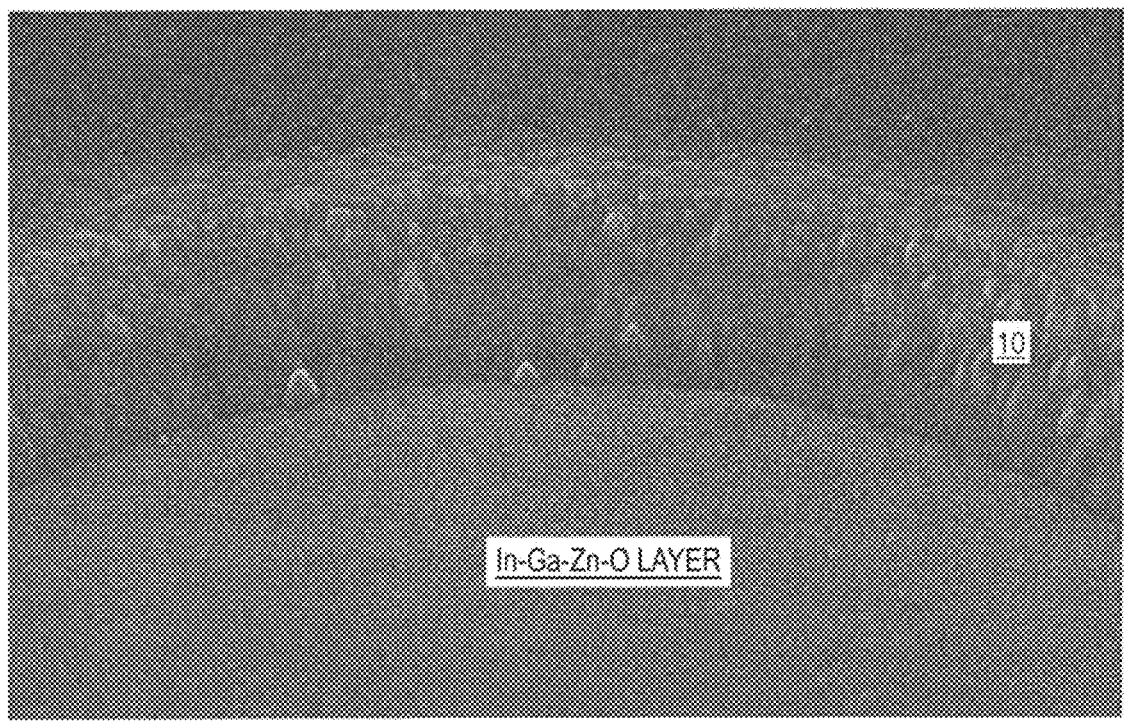
FIG. 4B is an enlarged view of a part of FIG. 4A.

Here, in order to examine the etching resistance of the metal oxide layer 82, the surface state of an underlayer exposed in the wiring line contact hole CH1 is observed when the metal oxide layer 82 is formed as the underlayer. FIG. 4A is an SEM image showing the surface state of the underlayer exposed in the wiring line contact hole CH1 when the underlayer is formed by using a material identical to that of the oxide semiconductor layer 7, and FIG. 4B is an enlarged view of a part of FIG. 4A. Here, an In—Ga—Zn—O-based oxide layer (In:Ga:Zn=1:1:1) having a thickness of 40 nm is used as the underlayer.

As illustrated in the figures, in the wiring line contact hole CH1, the exposed surface of the In—Ga—Zn—O-based oxide layer is smooth, and almost no damage caused by dry etching is observed. Thus, it is conceived that the In—Ga—Zn—O-based oxide layer has excellent etching resistance, and when the In—Ga—Zn—O-based oxide layer is used as the underlayer, a product that inhibits etching of the interlayer insulating layer 10 is unlikely to protrude from the surface of the underlayer. It is confirmed from the results that when a metal oxide layer containing In, Ga, and Zn is used as the underlayer, the formation of a projection in the wiring line contact hole CH1 can be more effectively suppressed.

Figure 5A:
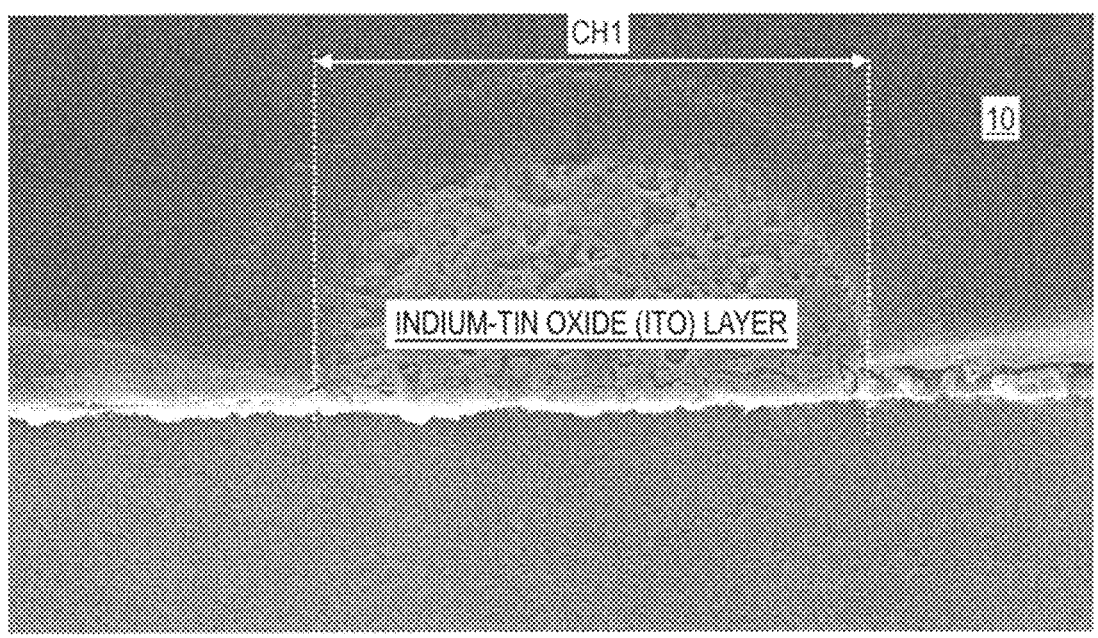
FIG. 5A is an SEM image showing a surface state of an indium-tin oxide (ITO) layer exposed in the wiring line contact hole CH1 when the ITO layer is used as an underlayer.

On the other hand, when an indium-tin oxide (ITO) layer (thickness: 40 nm) is used as the underlayer, the surface state of the indium-tin oxide layer exposed in the wiring line contact hole CH1 is also observed. FIG. 5A is an SEM image showing the surface state of the indium-tin oxide layer, and FIG. 5B is an enlarged view of a part of FIG. 5A.

Figure 5B:
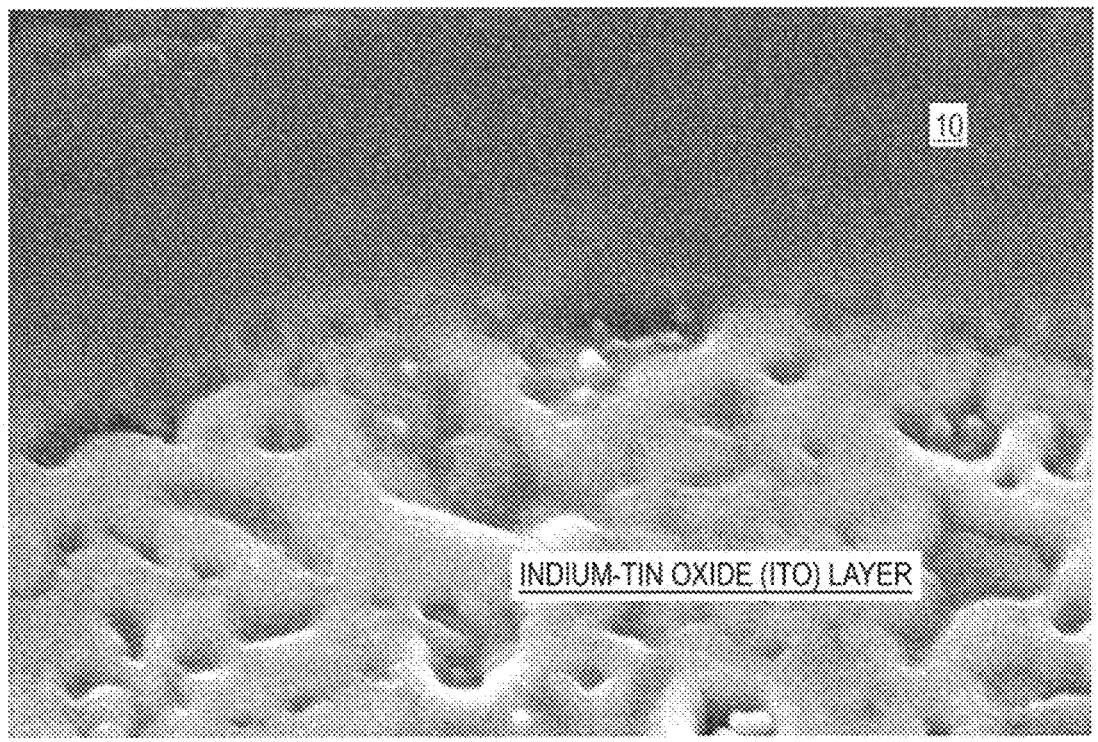
FIG. 5B is an enlarged view of a part of FIG. 5A.

As can be seen in FIG. 5B, fine recessed portions (holes) are formed in the exposed surface of the indium-tin oxide layer in the wiring line contact hole CH1. This is considered to be because the surface of the indium-tin oxide layer is damaged (etched) by dry etching (overetching) of the interlayer insulating layer 10. From this result, it can be seen that the etching resistance of the indium-tin oxide layer is lower than that of the In—Ga—Zn—O-based oxide layer described above. Thus, depending on etching conditions (a time period of etching and the like) of the interlayer insulating layer 10, an etching inhibitor may protrude from the surface of the indium-tin oxide layer to prevent the progress of etching of the interlayer insulating layer 10. However, since indium-tin oxide (ITO) is less likely to be etched than a metal material such as Cu, the occurrence of an etching inhibitor is suppressed and the formation of a projection due to the etching inhibitor is suppressed, compared with the case where the underlayer of the interlayer insulating layer 10 is a Cu wiring line (see FIG. 20).

Composition and Thickness of Metal Oxide Layer 82

The metal oxide layer 82 of the second metal layer M2 includes an oxide material identical to that of the channel region 7c of the oxide semiconductor layer 7 of the oxide semiconductor TFT. The oxide material is not particularly limited as long as the oxide material is an oxide material that can be used as the active layer of the TFT.

The oxide material included in the oxide semiconductor layer 7 and the metal oxide layer 82 may contain In, Ga, and Zn. As an example, the oxide semiconductor layer 7 contains first metal oxide containing In, Ga, and Zn, the metal oxide layer 82 contains second metal oxide containing In, Ga, and Zn, and a ratio, in the first metal oxide, of the numbers of atoms of In, Ga, and Zn to all metal elements contained in the first metal oxide (for example, In:Ga:Zn=1/3:1/3:1/3, or a ratio of the numbers of atoms close to this ratio), and a ratio, in the second metal oxide, of the numbers of atoms of In, Ga, and Zn to all metal elements contained in the second metal oxide may be substantially identical.

Note that when the channel region 7c of the oxide semiconductor layer 7 is a layered film including a plurality of oxide semiconductor films, it is sufficient that the metal oxide layer 82 contains an oxide material identical to that of at least one oxide semiconductor film of the layered film. For example, the oxide semiconductor layer 7 may include a first oxide semiconductor film and a second oxide semiconductor film, and the second oxide semiconductor film may be a high mobility layer having higher mobility than that of the first oxide semiconductor film (for example, a rate of the number of atoms of In>a rate of the number of atoms of Zn), and the first oxide semiconductor film may be a highly crystallized layer having higher crystallinity than that of the second oxide semiconductor film (for example, a rate of the number of atoms of In<a rate of the number of atoms of Zn). In this case, the metal oxide layer 82 may be formed of an oxide material identical to that of the second oxide semiconductor film that is a high mobility layer. Thus, a specific resistance of the metal oxide layer 82 can be made lower, so an electrode and a wiring line that have a lower resistance can be formed. Alternatively, the metal oxide layer 82 may be formed of an oxide material identical to that of the first oxide semiconductor film that is a highly crystallized layer. Thus, since the metal oxide layer 82 can have high etching resistance, the formation of a projection as described above with reference to FIG. 19F and FIG. 20 can be more effectively suppressed.

A thickness of the metal oxide layer 82 is not particularly limited, but when the thickness is equal to or larger than 30 nm, etching of the Cu-containing conductive layer 81 can be more reliably suppressed. On the other hand, the thickness of the metal oxide layer 82 is preferably less than a thickness of the Cu-containing conductive layer 81, and may be, for example, equal to or less than ⅕ of the thickness of the Cu-containing conductive layer 81. Thus, an increase in thickness of the second metal layer can be suppressed, and resistances of the electrode and wiring line (the gate electrode GE and gate bus line GL) in the second metal layer can be lowered. The thickness of the metal oxide layer 82 may be, for example, approximately 1/10 of a thickness of the interlayer insulating layer 10. As an example, when the thickness of the interlayer insulating layer (for example, a SiN layer) 10 is equal to or larger than 300 nm and equal to or less than 500 nm (for example, approximately 400 nm), the thickness of the metal oxide layer 82 may be equal to or larger than 30 nm and equal to or less than 50 nm (for example, approximately 40 nm).

Method for Forming Gate Electrode GE and First Connection Electrode 8C

The second metal layer M2 including the first connection electrode 8C, the gate electrode GE, the gate bus line GL, and the like is formed by patterning the second conductive film including the Cu-containing conductive film and the metal oxide film. A method for forming the gate electrode GE and the first connection electrode 8C will be described below with reference to the accompanying drawings.

FIG. 6A to FIG. 6D are process cross-sectional views illustrating an example of a method for forming the gate electrode GE and the first connection electrode 8C. Here, a TFT formation region r1 where each oxide semiconductor TFT is formed, and a connection section formation region r2 where each wiring line connection section is formed are exemplified.

Figure 6A:
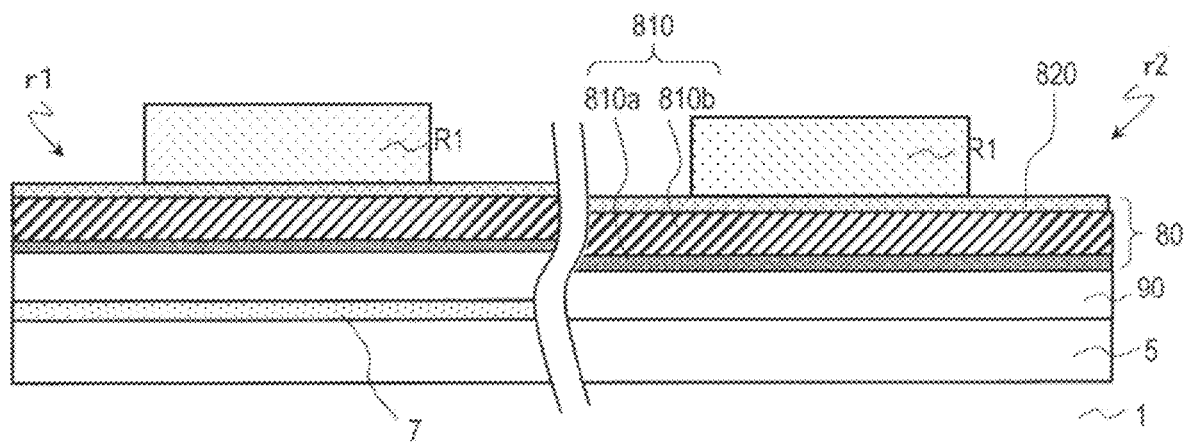
FIG. 6A is a step cross-sectional view illustrating an example of a method for forming a second metal layer M2.

First, as illustrated in FIG. 6A, the lower insulating layer 5 is formed on the substrate 1 in the TFT formation region r1 and the connection section formation region r2. Subsequently, the oxide semiconductor layer 7 is formed on the lower insulating layer 5 in the TFT formation region r1. Thereafter, a gate insulating film 90 and a second conductive film 80 are formed in this order in the TFT formation region r1 and the connection section formation region r2. The second conductive film 80 includes a Cu-containing conductive film 810 and a metal oxide film 820 that serves as the top layer of the second conductive film 80. In this example, the Cu-containing conductive film 810 may include a Cu alloy (CuX) film 810a that makes contact with the gate insulating film 90, and a Cu film 810b disposed on the Cu alloy film 810a.

The Cu alloy (CuX) film 810a is a film made of a Cu alloy containing Cu and at least one added metal element. For example, the Cu alloy film may be a Cu alloy film such as a Cu—Mg based, Cu—Al-based, Cu—Ca-based, Cu—Mo-based, or Cu—Mn-based Cu alloy film. Examples of the metal element X that forms an alloy with Cu include not only Mg, Al, Ca, Mo, and Mn that have been described above, but also W, Zr, and the like. A Cu alloy layer 81a may be made of a binary alloy containing Cu and one type of metal element X, or may contain two or more types of added metal elements (for example, Al and Mg). Note that in the present specification, a "Cu alloy" refers to an alloy in which Cu is a main metal element. The content of Cu in the Cu alloy may be, for example, equal to or larger than 80 at % and equal to or less than 98 at %. A thickness of the Cu alloy film 810a is, for example, equal to or larger than 30 nm and equal to or less than 200 nm. Thus, the adhesion with the gate insulating layer 9 can be ensured while an increase in electrical resistance is suppressed.

The Cu film 810b is a layer containing Cu as a main component. The content rate of Cu in the Cu film 810b may be, for example, equal to or larger than 90%. Preferably, the Cu film 810b is a pure Cu film (the content rate of Cu is equal to or larger than 99.99%, for example). A thickness of the Cu film 810b is, for example, equal to or larger than 30 nm and equal to or less than 500 nm. The Cu film 810b may be thicker than the Cu alloy film 810a.

Subsequently, a resist layer R1 is formed on a part of the second conductive film 80. Specifically, first, a resist film is formed on the second conductive film 80. Next, the resist film is exposed by using a photomask for gate metal, and then, the exposed resist film is developed, so the resist layer R1 is obtained.

Figure 6B:
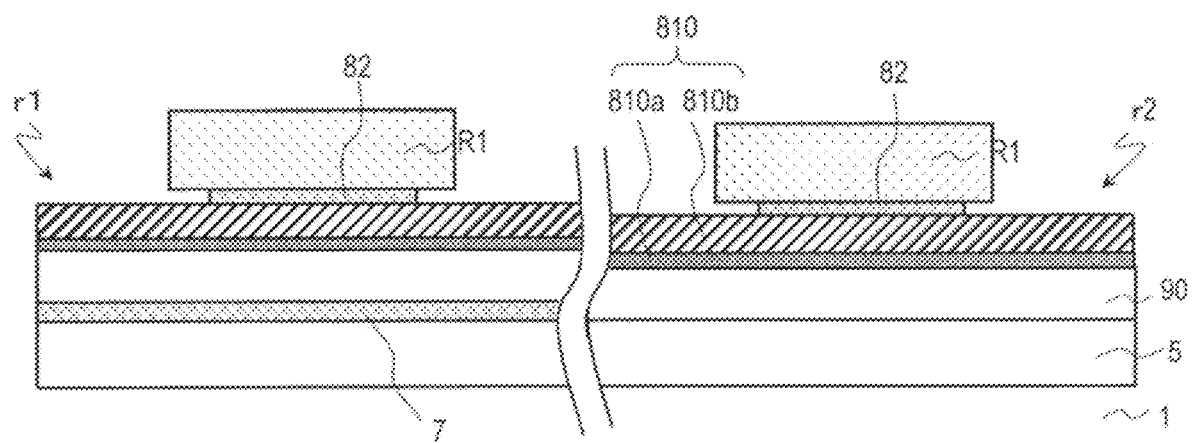
FIG. 6B is a step cross-sectional view illustrating the example of the method for forming the second metal layer M2.

Next, as illustrated in FIG. 6B, the metal oxide film 820 is patterned by using the resist layer R1 as a mask. Here, for example, wet etching is performed by using an oxalic acid etching solution. Thus, the metal oxide layer 82 that serves as an upper layer of each of the gate electrode and the first connection electrode is obtained from the metal oxide film 820 in the TFT formation region r1 and the connection section formation region r2. The Cu-containing conductive film 810 is not etched and is exposed.

Figure 6C:
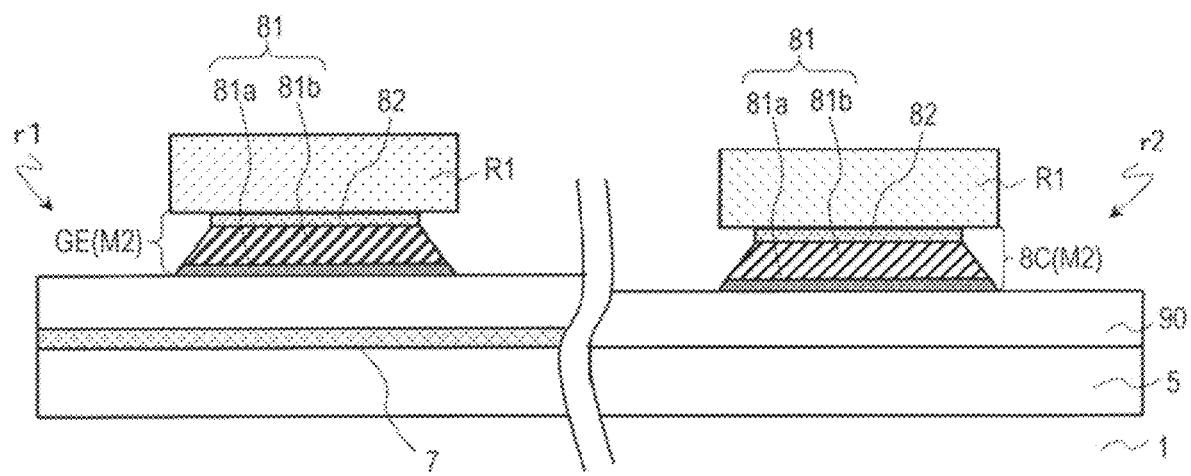
FIG. 6C is a step cross-sectional view illustrating the example of the method for forming the second metal layer M2.

Next, as illustrated in FIG. 6C, the Cu-containing conductive film 810 is patterned by using the resist layer R1 as a mask. For example, a hydrogen peroxide-based etching solution is used for patterning the Cu-containing conductive film 810. Thus, the Cu-containing conductive layer 81 including the Cu alloy layer 81a and the Cu layer 81b is obtained from the Cu-containing conductive film 810 in the TFT formation region r1 and the connection section formation region r2. The side faces of the Cu alloy layer 81a and the Cu layer 81b may be aligned. The metal oxide layer 82 covers only the upper face of the Cu-containing conductive layer 81 and is not disposed on the side face of the Cu-containing conductive layer 81. In this way, the second metal layer M2 including the gate electrode GE and the first connection electrode 8C is formed. The electrode and wiring line in the second metal layer M2 have a layered structure including the Cu-containing conductive layer 81 and the metal oxide layer 82 disposed on the upper face of the Cu-containing conductive layer 81.

Note that in order to perform patterning of all films other than the metal oxide film 820 in the second conductive film 80 by wet etching using a hydrogen peroxide-based etching solution, the second conductive film 80 preferably does not include a barrier metal layer, such as Ti.

Figure 6D:
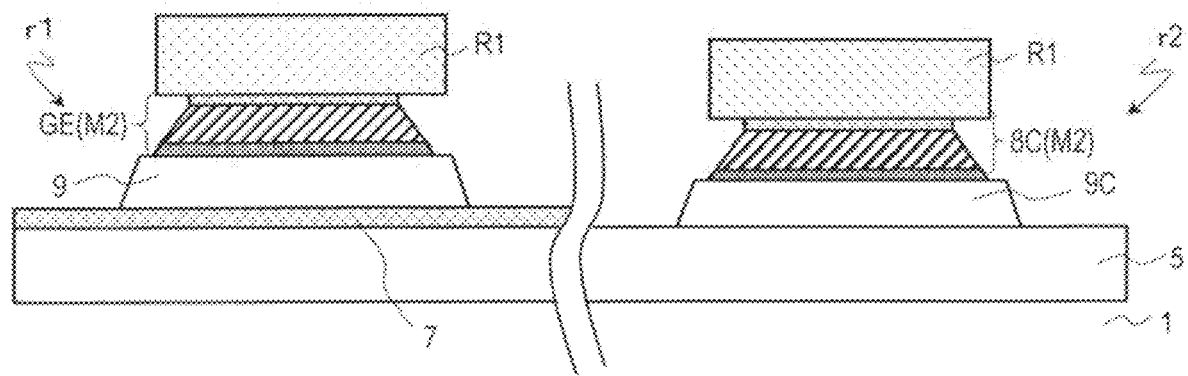
FIG. 6D is a step cross-sectional view illustrating the example of the method for forming the second metal layer M2.

Next, as illustrated in FIG. 6D, the gate insulating film 90 is patterned by dry etching by using the resist layer R1 as a mask to obtain the gate insulating layers 9 and 9C. After this, the resist layer R1 is removed. Note that after removing the resist layer R1, the gate insulating film 90 may be patterned by using the second metal layer M2 as a mask.

According to the method described above, the identical resist layer R1 can be used to perform etching of the metal oxide film 820, the Cu-containing conductive film 810, and the gate insulating film 90.

Modified Example 1

In the method described with reference to FIG. 6A to FIG. 6D, the metal oxide layer 82 is formed to cover only the upper face of the Cu-containing conductive layer 81, but may be formed to cover the upper and side faces of the Cu-containing conductive layer 81. When the metal oxide layer 82 covers not only the upper face but also the side face of the Cu-containing conductive layer 81, the occurrence of an etching inhibitor can be more effectively suppressed in a case where not only the upper face of the first connection electrode 8C but also the side face are exposed in the wiring line contact hole, for example (see FIG. 10B, FIG. 14A, and FIG. 14B).

FIG. 7A to FIG. 7E are process cross-sectional views illustrating another example of a method for forming the gate electrode GE and the first connection electrode 8C.

Figure 7A:
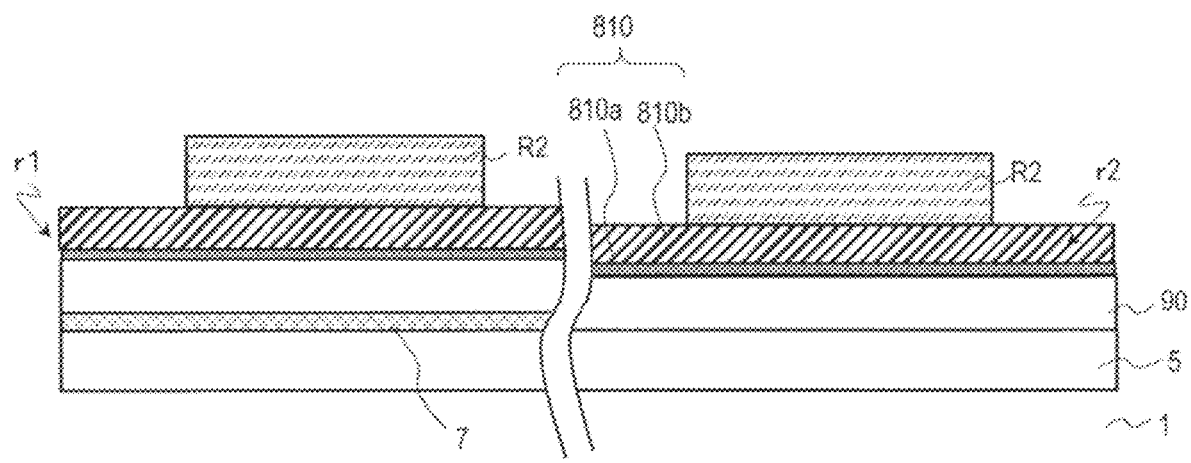
FIG. 7A is a step cross-sectional view illustrating another example of a method for forming the second metal layer M2.

First, as with the case illustrated in FIG. 6A, the lower insulating layer 5, the oxide semiconductor layer 7, and the gate insulating film 90 are formed on the substrate 1. Next, as illustrated in FIG. 7A, the Cu-containing conductive film 810 including the Cu alloy film 810a and the Cu film 810b is formed on the gate insulating film 90 in the TFT formation region r1 and the connection section formation region r2. Thereafter, a photomask for gate metal is used to form a resist layer R2 on a part of the Cu-containing conductive film 810.

Figure 7B:
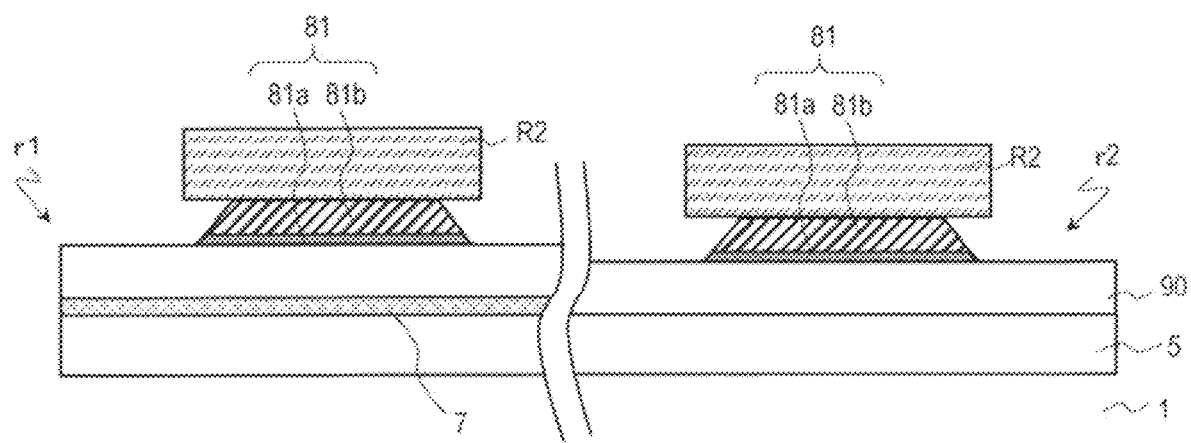
FIG. 7B is a step cross-sectional view illustrating the other example of the method for forming the second metal layer M2.

Next, as illustrated in FIG. 7B, wet etching of the Cu-containing conductive film 810 is performed by using, for example, a hydrogen peroxide-based etching solution, with the resist layer R2 serving as a mask. Thus, the Cu-containing conductive layer 81 serving as a lower layer of the gate electrode and the first connection electrode is obtained in the TFT formation region r1 and the connection section formation region r2. As illustrated in the figure, a time period of etching may be set to be long (overetching) such that a width of the Cu-containing conductive layer 81 is less than a width of the photomask (a width of the resist layer R2). After this, the resist layer R2 is removed.

Figure 7C:
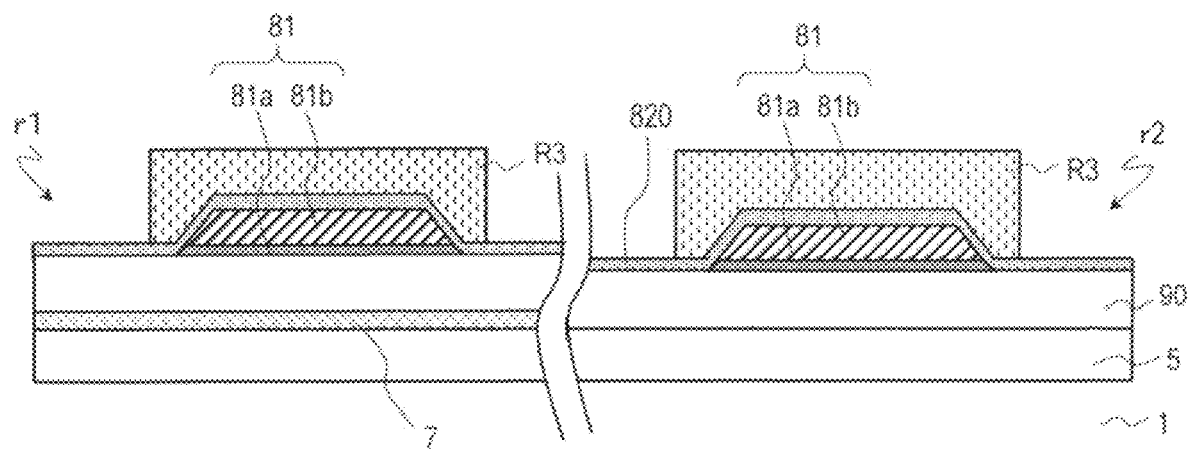
FIG. 7C is a step cross-sectional view illustrating the other example of the method for forming the second metal layer M2.

After removing the resist layer R2, as illustrated in FIG. 7C, the metal oxide film 820 is formed to cover the Cu-containing conductive layer 81. Thereafter, a resist layer R3 is formed on a part of the metal oxide film 820. The resist layer R3 is larger in width than the Cu-containing conductive layer 81, and is disposed to cover the entirety of the upper and side faces of the Cu-containing conductive layer 81 when viewed from the normal direction of the substrate 1. The resist layer R3 may be formed by using a photomask (photomask for gate metal) identical to that of the resist layer R2 used to etch the Cu-containing conductive film 810. As described above, the width of the Cu-containing conductive layer 81 is smaller than the width defined by the photomask for gate metal, and thus, the resist layer R3 having a larger line width than that of the Cu-containing conductive layer 81 can be formed. By adjusting an exposure amount in forming the resist layer R3, the line width of the resist layer R3 may be made larger than the width defined by the photomask for gate metal.

Figure 7D:
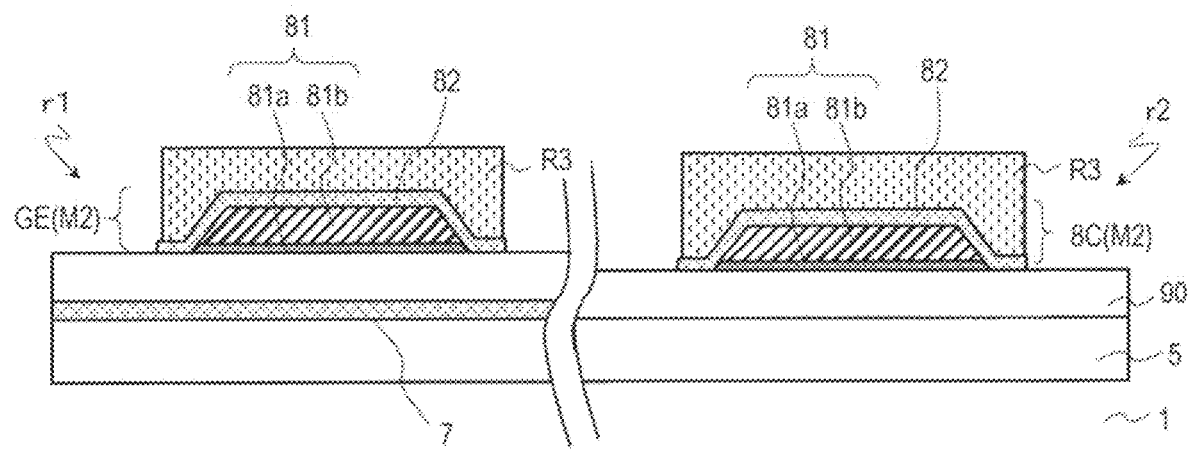
FIG. 7D is a step cross-sectional view illustrating the other example of the method for forming the second metal layer M2.

Next, as illustrated in FIG. 7D, wet etching of the metal oxide film 820 is performed by using, for example, an oxalic acid etching solution, with the resist layer R3 serving as a mask. Thus, the metal oxide layer 82 that covers the upper face and the side face of the Cu-containing conductive layer 81 is formed in each of the TFT formation region r1 and the connection section formation region r2. The metal oxide layer 82 may be in contact with a portion of the gate insulating film 90 positioned around the Cu-containing conductive layer 81. In this way, the second metal layer M2 including the gate electrode GE and the first connection electrode 8C is formed. The electrodes and wiring lines in the second metal layer M2 have a layered structure including the Cu-containing conductive layer 81 and the metal oxide layer 82 covering the upper face and the side face of the Cu-containing conductive layer 81.

Figure 7E:
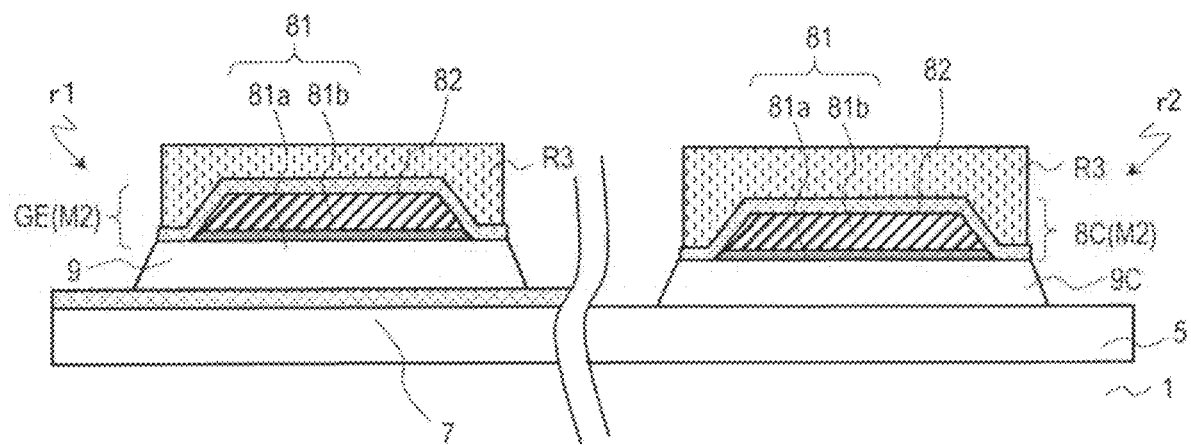
FIG. 7E is a step cross-sectional view illustrating the other example of the method for forming the second metal layer M2.

Thereafter, as illustrated in FIG. 7E, the gate insulating film 90 is etched with the resist layer R3 serving as a mask to obtain the gate insulating layers 9 and 9C. The side faces of the gate insulating layers 9 and 9C may be aligned with the side faces of the gate electrode GE and the first connection electrode 8C.

In the gate electrode GE obtained by the above method, the metal oxide layer 82 may cover the upper face and the side face of the Cu-containing conductive layer 81, and may be in contact with a portion of the gate insulating layer 9 positioned around the Cu-containing conductive layer 81. Similarly, in the first connection electrode 8C, the metal oxide layer 82 may cover the upper face and the side face of the Cu-containing conductive layer 81, and may be in contact with a portion of the gate insulating layer 9C positioned around the Cu-containing conductive layer 81.

Note that it is also possible to form the resist layer R3 by using a photomask different from the resist layer R2. In this case, the metal oxide layer 82 may be disposed on at least portions that serve as at least the first connection electrode 8C and the gate electrode GE, among the electrodes and wiring lines in the second metal layer M2. However, from the perspective of reducing manufacturing costs, it is preferable that the width of the metal oxide layer 82 be larger than that of the Cu-containing conductive layer 81 by using an identical photomask and adjusting a time period of etching of the Cu-containing conductive film 810 and an exposure amount in forming each resist layer.

Modified Example 2

In the methods described with reference to FIG. 6A to FIG. 6D and FIG. 7A to FIG. 7E, the Cu alloy layer is formed as the bottom layer of the second conductive film (layer contacting the gate insulating layer 9), but instead of the Cu alloy layer, a barrier metal layer made of, for example, Ti, Mo, or the like may be formed.

FIG. 8A to FIG. 8D are process cross-sectional views illustrating an example of another method for forming the gate electrode GE and the first connection electrode 8C.

Figure 8A:
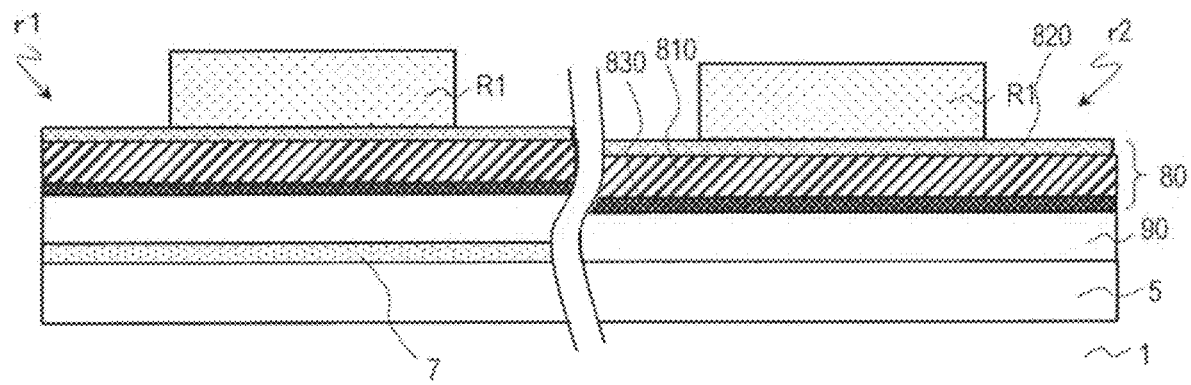
FIG. 8A is a step cross-sectional view illustrating still another example of a method for forming the second metal layer M2.

First, as with the case illustrated in FIG. 6A, the lower insulating layer 5, the oxide semiconductor layer 7, and the gate insulating film 90 are formed on the substrate 1. Next, as illustrated in FIG. 8A, the second conductive film 80 is formed on the gate insulating film 90 in the TFT formation region r1 and the connection section formation region r2. In this example, a barrier metal film (for example, a Ti film) 830, the Cu-containing conductive film (here, the Cu film) 810, and the metal oxide film 820 are formed as the second conductive film 80 in this order. The barrier metal film 830 is in contact with the gate insulating film 90. Subsequently, the resist layer R1 is formed on a part of the second conductive film 80.

Figure 8B:
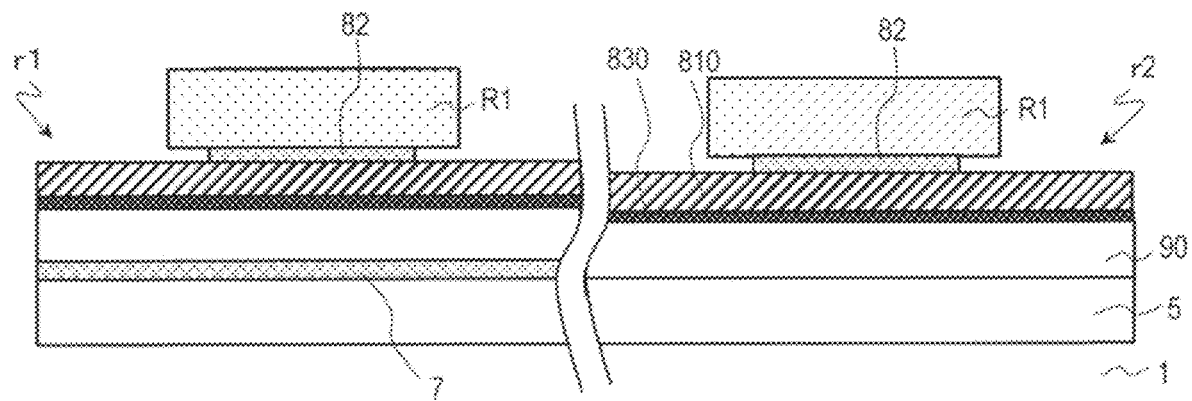
FIG. 8B is a step cross-sectional view illustrating the other example of the method for forming the second metal layer M2.

Next, as illustrated in FIG. 8B, the metal oxide film 820 is patterned by using, for example, an oxalic acid etching solution, with the resist layer R1 serving as a mask. Thus, the metal oxide layer 82 that serves as an upper layer of each of the gate electrode and the first connection electrode is obtained from the metal oxide film 820 in the TFT formation region r1 and the connection section formation region r2.

Figure 8C:
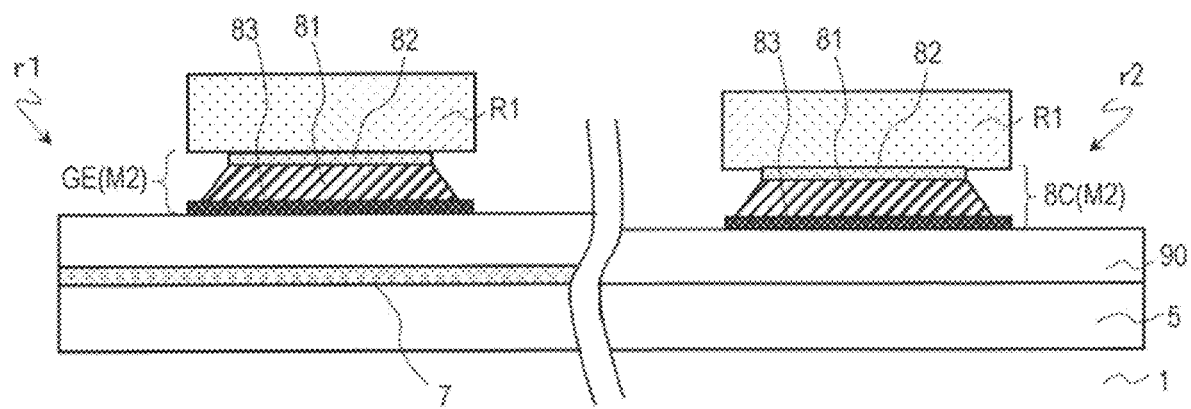
FIG. 8C is a step cross-sectional view illustrating the other example of the method for forming the second metal layer M2.

Next, as illustrated in FIG. 8C, after wet etching of the Cu-containing conductive film 810 is performed by using a hydrogen peroxide-based etching solution (not including a fluorine compound) with the resist layer R1 serving as a mask, patterning of the barrier metal film 830 is performed by dry etching. Due to this, a barrier metal layer 83 and the Cu-containing conductive layer 81 are formed in each of the TFT formation region r1 and the connection section formation region r2. In this way, the second metal layer M2 including the gate electrode GE and the first connection electrode 8C is formed. The electrodes and wiring lines in the second metal layer M2 have a layered structure including the barrier metal layer 83, the Cu-containing conductive layer 81, and the metal oxide layer 82. In this example, the metal oxide layer 82 is disposed only on the upper face of the Cu-containing conductive layer 81, and does not cover the side face of the Cu-containing conductive layer 81.

Figure 8D:
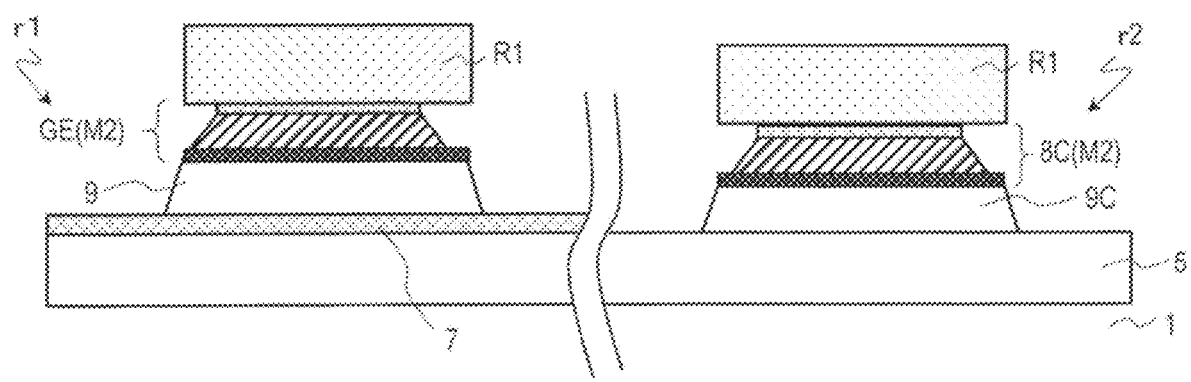
FIG. 8D is a step cross-sectional view illustrating the other example of the method for forming the second metal layer M2.

Next, as illustrated in FIG. 8D, as with the case illustrated in FIG. 6D, the gate insulating film 90 is patterned by dry etching to obtain the gate insulating layers 9 and 9C. After this, the resist layer R1 is removed.

Modified Example 3

FIG. 9A to FIG. 9E are process cross-sectional views illustrating an example of yet another method of forming the gate electrode GE and the first connection electrode 8C.

Figure 9A:
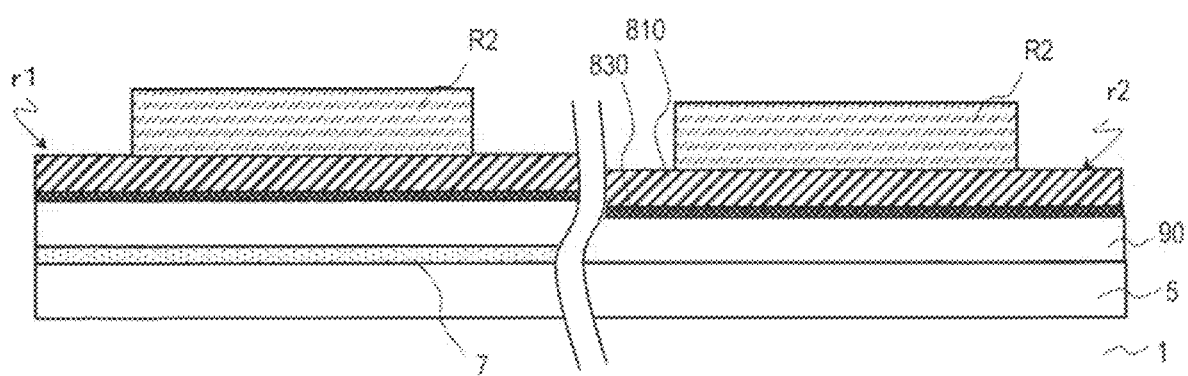
FIG. 9A is a step cross-sectional view illustrating still another example of a method for forming the second metal layer M2.

First, as with the case illustrated in FIG. 6A, the lower insulating layer 5, the oxide semiconductor layer 7, and the gate insulating film 90 are formed on the substrate 1. Next, as illustrated in FIG. 9A, the barrier metal film (for example, a Ti film) 830 and the Cu-containing conductive film 810 are formed in this order on the gate insulating film 90 in the TFT formation region r1 and the connection section formation region r2. Next, the resist layer R2 is formed on a part of the Cu-containing conductive film 810 by using a photomask for gate metal.

Figure 9B:
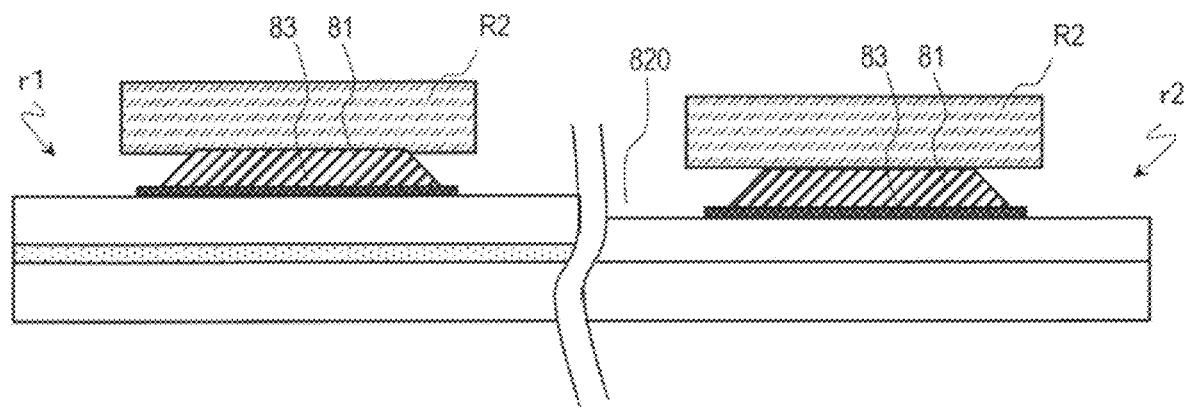
FIG. 9B is a step cross-sectional view illustrating the other example of the method for forming the second metal layer M2.

Thereafter, as illustrated in FIG. 9B, wet etching of the Cu-containing conductive film 810 and the barrier metal film 830 is performed by using a hydrogen peroxide-based etching solution containing, for example, a fluorine compound, with the resist layer R2 serving as a mask. Thus, a layered film including the barrier metal layer (for example, a Ti layer) 83 and the Cu-containing conductive layer 81 is formed in each of the TFT formation region r1 and the connection section formation region r2. As with the case illustrated in FIG. 8B, a time period of etching may be set to be long such that the width of the Cu-containing conductive layer 81 is less than the width of the photomask (the width of the resist layer R2). After this, the resist layer R2 is removed.

Figure 9C:
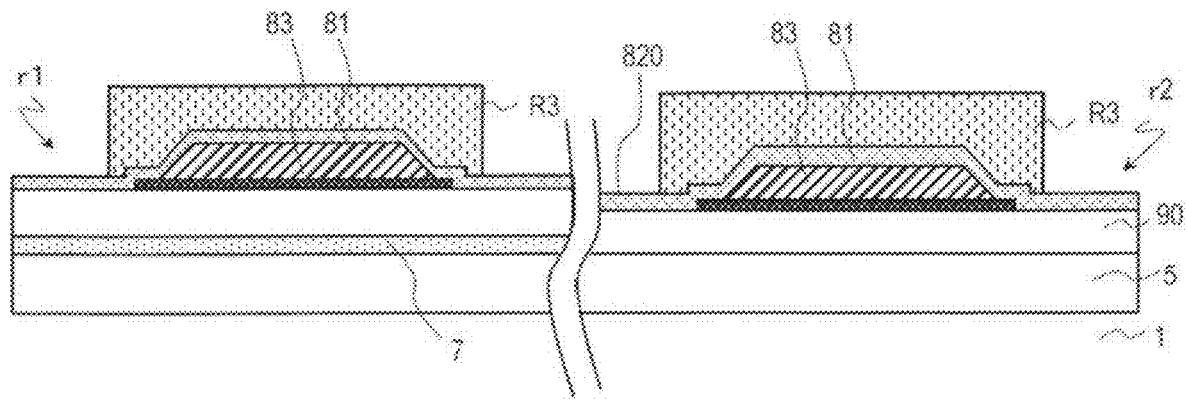
FIG. 9C is a step cross-sectional view illustrating the other example of the method for forming the second metal layer M2.

Next, as illustrated in FIG. 9C, the metal oxide film 820 is formed to cover the Cu-containing conductive layer 81 and the barrier metal layer 83. Thereafter, the resist layer R3 is formed on a part of the metal oxide film 820. The resist layer R3 is larger in width than the Cu-containing conductive layer 81 and the barrier metal layer 83, and is disposed so as to cover the entire upper and side faces of the Cu-containing conductive layer 81 and the barrier metal layer 83 when viewed from the normal direction of the substrate 1. The method for forming the resist layer R3 may be identical to that in FIG. 8C.

Figure 9D:
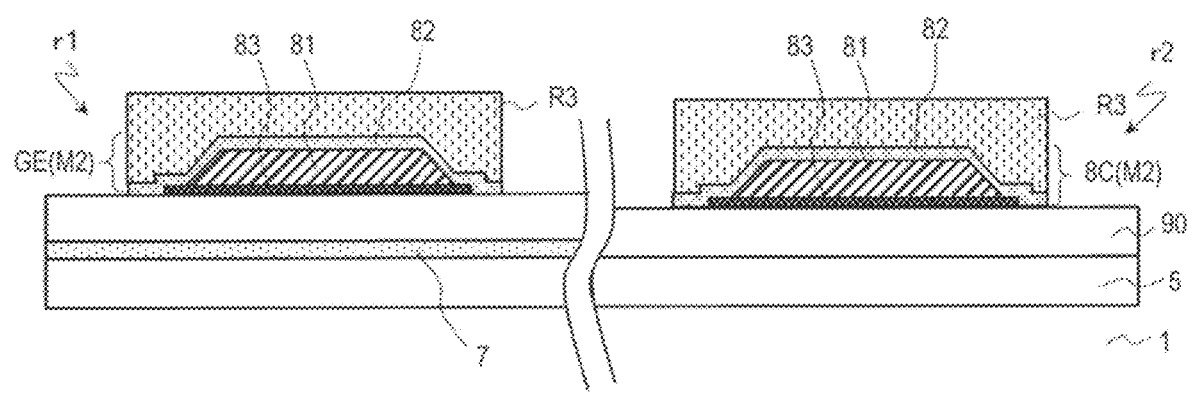
FIG. 9D is a step cross-sectional view illustrating the other example of the method for forming the second metal layer M2.

Next, as illustrated in FIG. 9D, wet etching of the metal oxide film 820 is performed by using, for example, an oxalic acid etching solution, with the resist layer R3 serving as a mask. Thus, the metal oxide layer 82 that covers the upper face and the side face of the Cu-containing conductive layer 81 is formed in each of the TFT formation region r1 and the connection section formation region r2. In this way, the second metal layer M2 including the gate electrode GE and the first connection electrode 8C is formed. The electrodes and wiring lines in the second metal layer M2 have a layered structure including the barrier metal layer 83, the Cu-containing conductive layer 81, and the metal oxide layer 82. The metal oxide layer 82 may cover the upper and side faces of the Cu-containing conductive layer 81 and the side face of the barrier metal layer 83, and may be in contact with a portion of the gate insulating film 90 positioned around the Cu-containing conductive layer 81.

Figure 9E:
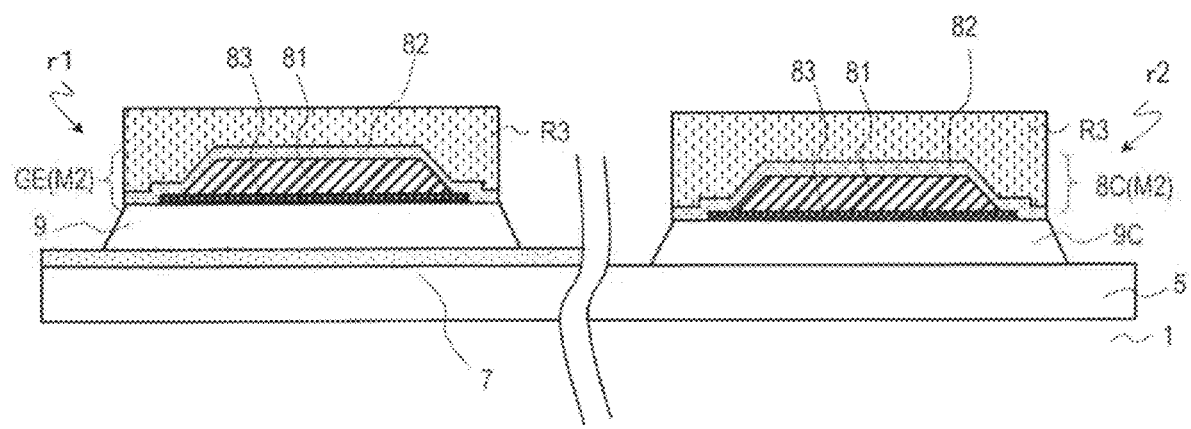
FIG. 9E is a step cross-sectional view illustrating the other example of the method for forming the second metal layer M2.

Thereafter, as illustrated in FIG. 9E, the gate insulating film 90 is etched with the resist layer R3 serving as a mask to obtain the gate insulating layers 9 and 9C.

In the gate electrode GE obtained by the above method, the metal oxide layer 82 may cover the upper and side faces of the Cu-containing conductive layer 81 and the upper and side faces of the barrier metal layer 83, and may be in contact with a portion of the gate insulating layer 9 positioned around the Cu-containing conductive layer 81. Similarly, in the first connection electrode 8C, the metal oxide layer 82 may cover the upper and side faces of the Cu-containing conductive layer 81 and the upper and side faces of the barrier metal layer 83, and may be in contact with a portion of the gate insulating layer 9C positioned around the Cu-containing conductive layer 81.

Another Wiring Line Connection Section 32

The active matrix substrate according to the present embodiment may include a wiring line connection section that electrically connects the electrode and wiring line in the first metal layer M1 and the electrode and wiring line in the second metal layer M2 through an electrode provided in an upper layer than the second metal layer M2, in addition to or instead of the wiring line connection section 31 illustrated in FIG. 3A and FIG. 3B as an example.

In the oxide semiconductor TFT that is the pixel TFT 20 or the circuit TFT, the lower electrode LE (see FIG. 2A and FIG. 2B) in the first metal layer M 1 may be caused to function as a lower gate electrode (double gate structure). In such a case, a wiring line connection section that electrically connects the lower electrode LE in the first metal layer M1 and the gate electrode GE in the second metal layer M2 through a connection electrode in an upper layer than the second metal layer M2 (for example, the third metal layer M3) may be formed. As described above, a connection section that connects the gate electrode GE and the lower electrode LE is referred to as a "gate connection section".

Next, another wiring line connection section according to the present embodiment will be described by using the gate connection section as an example.

Figure 10A:
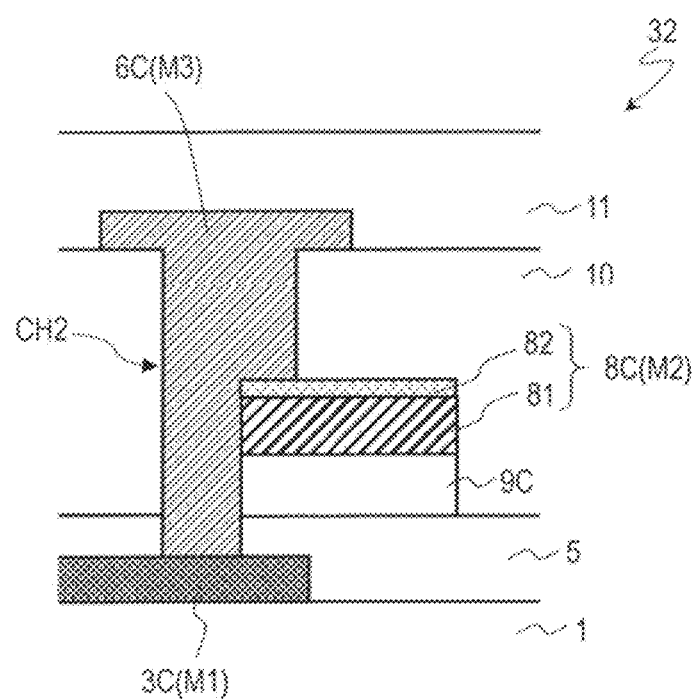
FIG. 10A is a plan view illustrating another wiring line connection section 32 in the active matrix substrate 101.

FIG. 10A is a cross-sectional view illustrating an example of another wiring line connection section (gate connection section) according to the present embodiment.

A wiring line connection section (gate connection section) 32 includes a lower connection electrode 3C formed in the first metal layer M1, the lower insulating layer 5 extending over the lower connection electrode 3C, the first connection electrode 8C formed in the second metal layer M2, the gate insulating layer 9C disposed between the first connection electrode 8C and the lower insulating layer 5, the interlayer insulating layer 10 extending over the first connection electrode 8C, a wiring line contact hole CH2 provided in an insulating layer (here, the interlayer insulating layer 10 and the lower insulating layer 5) including the interlayer insulating layer 10, and the second connection electrode 6C disposed on the interlayer insulating layer 10. The lower connection electrode 3C may be integrally formed (connected) with the lower electrode LE of the oxide semiconductor TFT, or may be a part of the lower electrode LE. The first connection electrode 8C may be integrally formed (connected) with the gate electrode GE of the oxide semiconductor TFT, or may be a part of the gate electrode GE or the gate bus line GL. The side face of the gate insulating layer 9C may be aligned with the side face of the first connection electrode 8C.

The gate electrode GE and the first connection electrode 8C have a layered structure including the Cu-containing conductive layer 81 and the metal oxide layer 82 covering the upper face of the Cu-containing conductive layer 81.

The wiring line contact hole CH2 is formed in the interlayer insulating layer 10 and the lower insulating layer 5, and exposes a part of the metal oxide layer 82 of the first connection electrode 8C and a part of the lower connection electrode 3C. In this example, a part of the upper face and a part of the side face of the metal oxide layer 82, and a part of the side face of the Cu-containing conductive layer 81 are exposed in the wiring line contact hole CH2. The wiring line contact hole CH2 can be formed in an etching step common to the source contact hole CHs and the drain contact hole CHd. Thus, the wiring line connection section 32 can be formed on the active matrix substrate 101 without increasing the number of the manufacturing steps and the number of photomasks to be used.

The second connection electrode 6C is disposed on the interlayer insulating layer 10 and in the wiring line contact hole CH2, and is connected to the exposed portion of the first connection electrode 8C and the exposed portion of the lower connection electrode 3C in the wiring line contact hole CH2. In this example, the second connection electrode 6C is directly in contact with a part of the upper face and a part of the side face of the metal oxide layer 82 of the first connection electrode 8C, and a part of the side face of the Cu-containing conductive layer 81.

In the wiring line connection section 32, in forming the wiring line contact hole CH2, the lower insulating layer 5 needs to be etched even after the interlayer insulating layer 10 is etched to expose the upper face of the first connection electrode 8C. Thus, a time period for which the exposed portion of the first connection electrode 8C is subjected to etching increases. In the present embodiment, the Cu-containing conductive layer 81 is covered with the metal oxide layer 82 that is unlikely to be etched, and thus, the occurrence of an etching inhibitor can be suppressed even when the time period for which the first connection electrode 8C is subjected to etching increases. As a result, it is possible to more effectively suppress degradation of characteristics of the oxide semiconductor TFT caused by etching of the metal oxide layer 82.

Figure 10B:
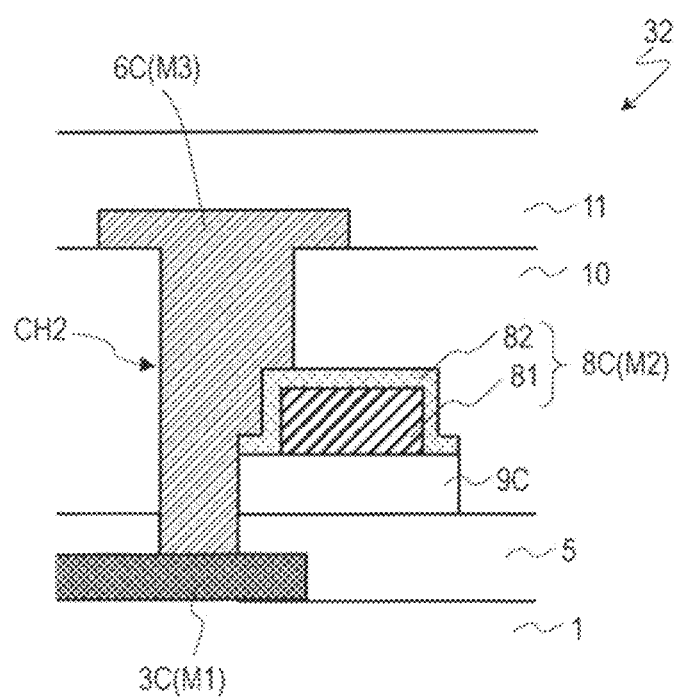
FIG. 10B is a cross-sectional view illustrating another example of the wiring line connection section 32.

As illustrated in FIG. 10B, in the first connection electrode 8C, the metal oxide layer 82 may cover the upper face and the side face of the Cu-containing conductive layer 81 (see FIG. 7A to FIG. 7E and FIG. 9A to FIG. 9E). As a result, in forming the wiring line contact hole CH2, the formation of an etching inhibitor due to the fact that the surface of the Cu-containing conductive layer 81 is subjected to etching can be further suppressed.

Figure 10C:
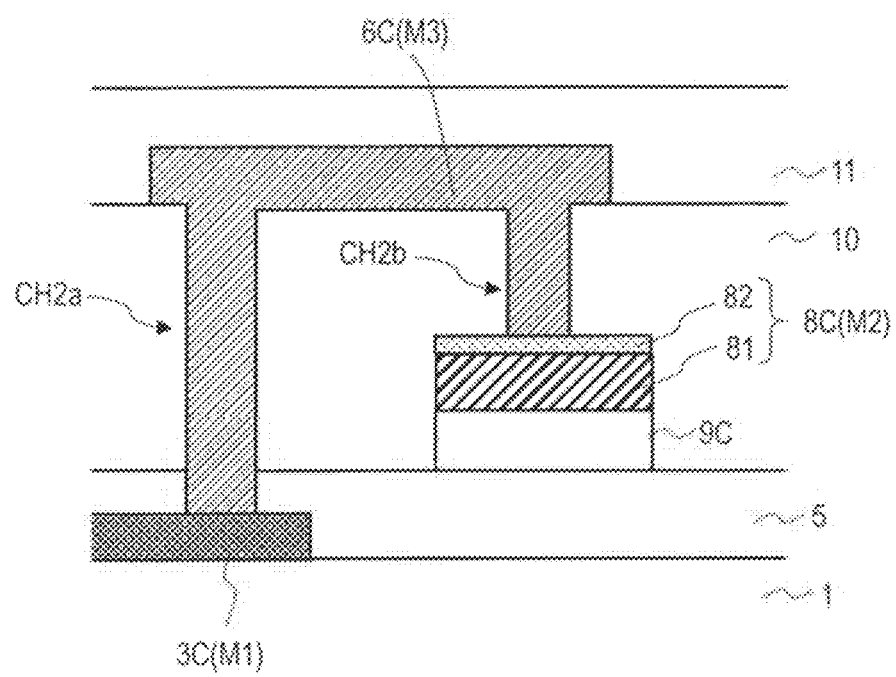
FIG. 10C is a cross-sectional view illustrating still another example of the wiring line connection section 32.

Note that instead of the wiring line connection section 32, as exemplified in FIG. 10C, a wiring line contact hole CH2a for electrically connecting the lower connection electrode 3C and the second connection electrode 6C, and a wiring line contact hole CH2b for electrically connecting the first connection electrode 8C and the second connection electrode 6C may be provided separately at an interval.

Here, although the gate connection section has been described as an example, the wiring line connection section 32 is not limited to the gate connection section, it is sufficient that the wiring line connection section 32 is a connection section that connects the electrode and wiring line in the first metal layer M1 and the electrode and wiring line in the second metal layer M2.

Method for Manufacturing Active Matrix Substrate 101

FIG. 11A to FIG. 11M are schematic process cross-sectional views for explaining a method for manufacturing the active matrix substrate 101. These figures illustrate the TFT formation region r1 where a pixel TFT is formed in each pixel area, and the connection section formation region r2 where each wiring line connection section is formed. Here, as the connection section formation region r2, a region where the source-gate connection section is formed in the non-display region is exemplified.

Figure 11A:
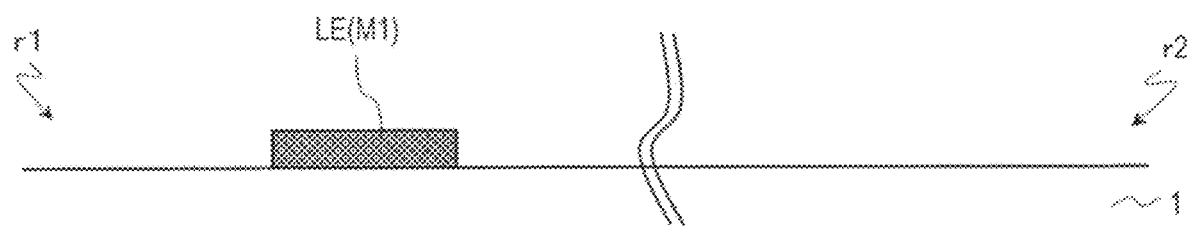
FIG. 11A is a process cross-sectional view illustrating an example of a method for manufacturing the active matrix substrate 101.

STEP 1: Forming First Metal Layer M1 (FIG. 11A)

A first conductive film (having a thickness equal to or larger than 50 nm and equal to or less than 500 nm) is formed on the substrate 1 by a sputtering method, for example. Next, patterning (for example, wet etching) of the first conductive film is performed by a known photolithography step. In this way, as illustrated in FIG. 11A, the first metal layer M1 including the lower electrode LE of the pixel TFT is formed.

As the substrate 1, a transparent substrate with insulating properties, for example, a glass substrate, a silicon substrate, a heat-resistant plastic substrate (resin substrate), or the like can be used.

The material of the first conductive film is not particularly limited, and a film containing metal such as aluminum (Al), tungsten (W), molybdenum (Mo), tantalum (Ta), chromium (Cr), titanium (Ti), and copper (Cu), an alloy thereof, or metal nitride thereof can be appropriately used. Further, a layered film obtained by layering such a plurality of films may be used.

Here, a single-layer film of a metal film (or an alloy film) containing Cu or Al is used as the first conductive film. Alternatively, a layered film having a metal film containing Cu or Al as a top layer may be used.

STEP 2: Forming Lower Insulating Layer 5 (FIG. 11B)

Figure 11B:
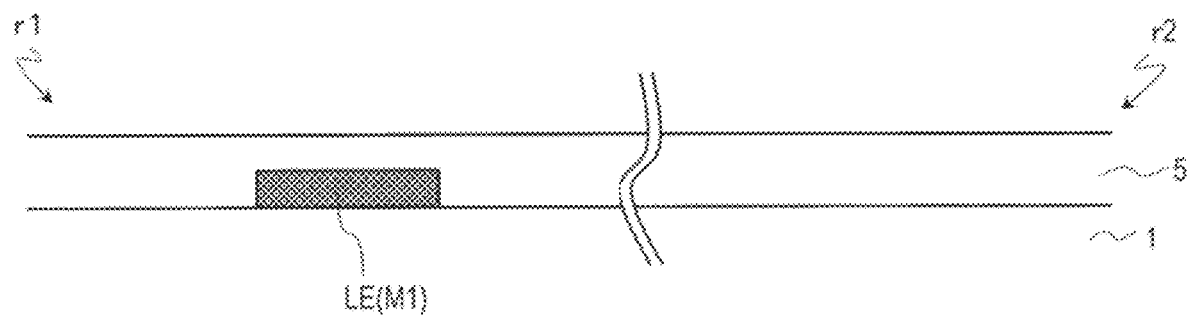
FIG. 11B is a process cross-sectional view illustrating the example of the method for manufacturing the active matrix substrate 101.

Subsequently, as illustrated in FIG. 11B, the lower insulating layer 5 (having a thickness equal to or larger than 200 nm and equal to or less than 600 nm, for example) is formed to cover the first metal layer M1 in the TFT formation region r1 and the connection section formation region r2.

The lower insulating layer 5 is formed by a CVD method, for example. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 5 may be a single layer or may include a layered structure. For example, a silicon nitride (SiNx) layer, a silicon nitride oxide layer, or the like may be formed on a substrate side (lower layer) in order to prevent diffusion of impurities and the like from the substrate 1, and a silicon oxide (SiO$_2$) layer, a silicon oxynitride layer, or the like may be formed on a layer (upper layer) on the former layer in order to ensure insulating properties. Here, a silicon oxide (SiO$_2$) layer (having a thickness of 350 nm, for example) is formed as the lower insulating layer 5 by a CVD method, for example. Alternatively, a layered film having a silicon nitride (SiNx) layer (having a thickness from 50 to 600 nm) as a lower layer and a silicon oxide (SiO$_2$) layer (having a thickness from 50 to 600 nm) as an upper layer may be formed as the lower insulating layer 5. In a case where the oxide film such as a silicon oxide film is used as the lower insulating layer 5 (or, the top layer of the lower insulating layer 5, in a case where the lower insulating layer 5 has a layered structure), oxidation deficits generated in the channel region of the oxide semiconductor layer that is subsequently formed can be reduced by the oxide film, and thus, causing the channel region to be low-resistive can be suppressed.

Figure 11C:
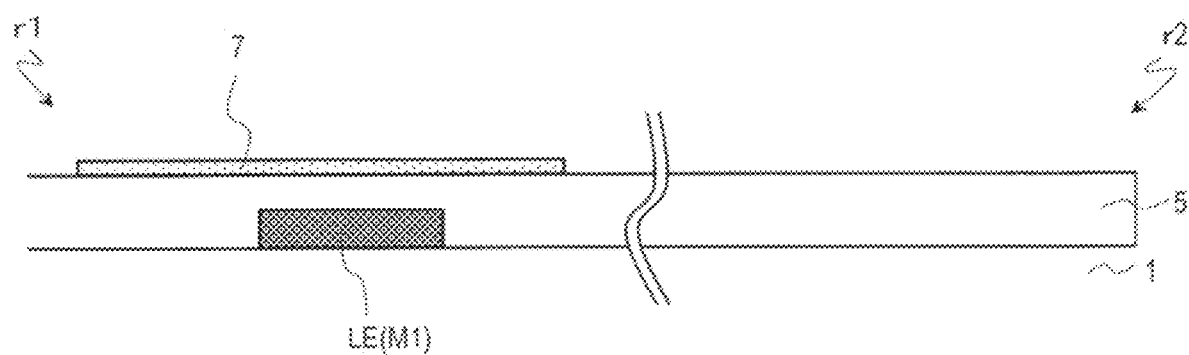
FIG. 11C is a process cross-sectional view illustrating the example of the method for manufacturing the active matrix substrate 101.

STEP 3: Forming Oxide Semiconductor Layer 7 (FIG. 11C)

Subsequently, an oxide semiconductor film (having a thickness equal to or larger than 15 nm and equal to or less than 200 nm, for example) is formed on the lower insulating layer 5. Subsequently, annealing treatment of the oxide semiconductor film may be performed. Subsequently, patterning of the oxide semiconductor film is performed by a known photolithography step. In this manner, as illustrated in FIG. 11C, the oxide semiconductor layer 7 to be the active layer of the TFT 20 is obtained in the TFT formation region r1.

The oxide semiconductor film may be formed by a sputtering method that uses, for example, a sputtering target having a desired composition. Here, as the oxide semiconductor film, an In—Ga—Zn—O-based semiconductor film (having a thickness of 50 nm) film containing In, Ga, and Zn is formed. As the sputtering target, for example, a sputtering target having a ratio of the numbers of atoms In:Ga:Zn of 1:1:1 may be used.

Patterning of the oxide semiconductor film may be, for example, performed by wet etching using a PAN-based etching solution containing phosphoric acid, nitric acid, and acetic acid. Alternatively, other etching solutions such as oxalic acid etching solutions may be used for the patterning.

STEP 4: Forming Gate Insulating Film 90 (FIG. 11D)

Figure 11D:
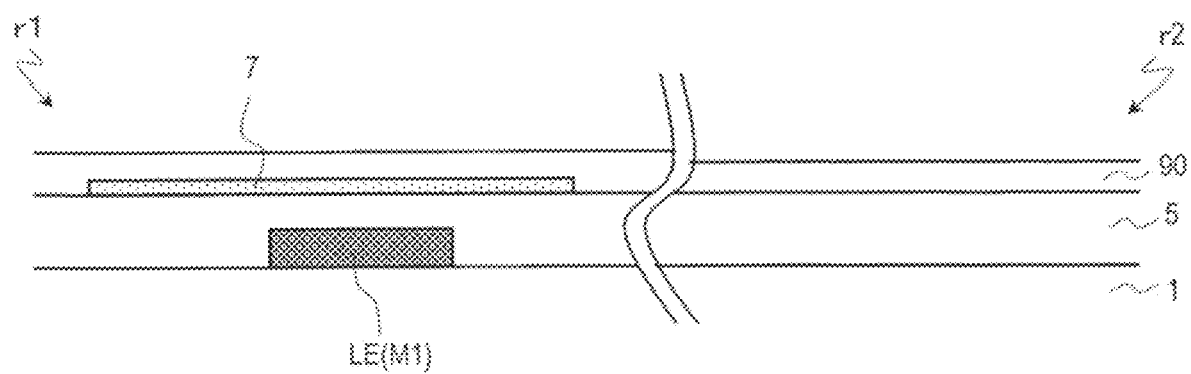
FIG. 11D is a process cross-sectional view illustrating the example of the method for manufacturing the active matrix substrate 101.

Next, as illustrated in FIG. 11D, the gate insulating film 90 is formed to cover the oxide semiconductor layer 7 in the TFT formation region r1 and the connection section formation region r2.

As the gate insulating film 90, an insulating film (insulating film exemplified as the lower insulating layer 5) similar to the lower insulating layer 5 can be used. Here, a silicon oxide (SiO$_2$) film is formed as the gate insulating film 90. In a case where an oxide film such as a silicon oxide film is used as the gate insulating film 90, oxidation deficits generated in the channel region of the oxide semiconductor layer 7 can be reduced by the oxide film, and thus, causing the channel region to be low-resistive can be suppressed.

Figure 11E:
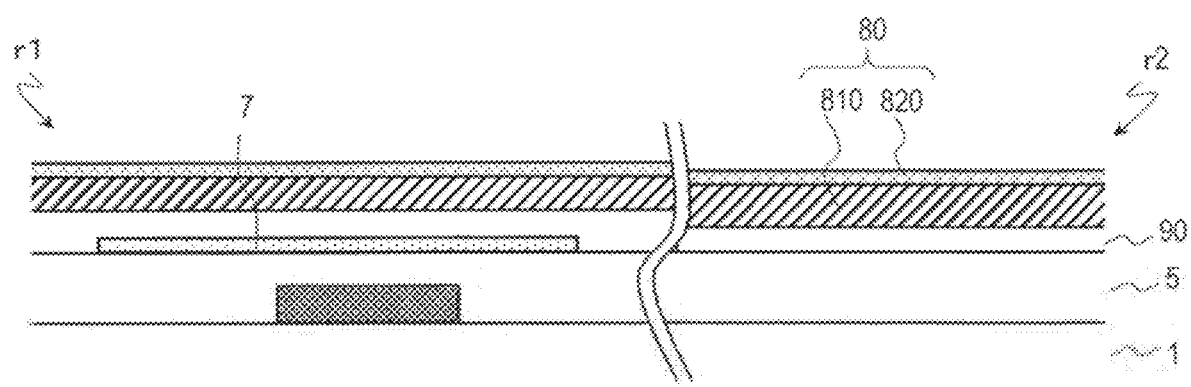
FIG. 11E is a process cross-sectional view illustrating the example of the method for manufacturing the active matrix substrate 101.
Figure 11F:
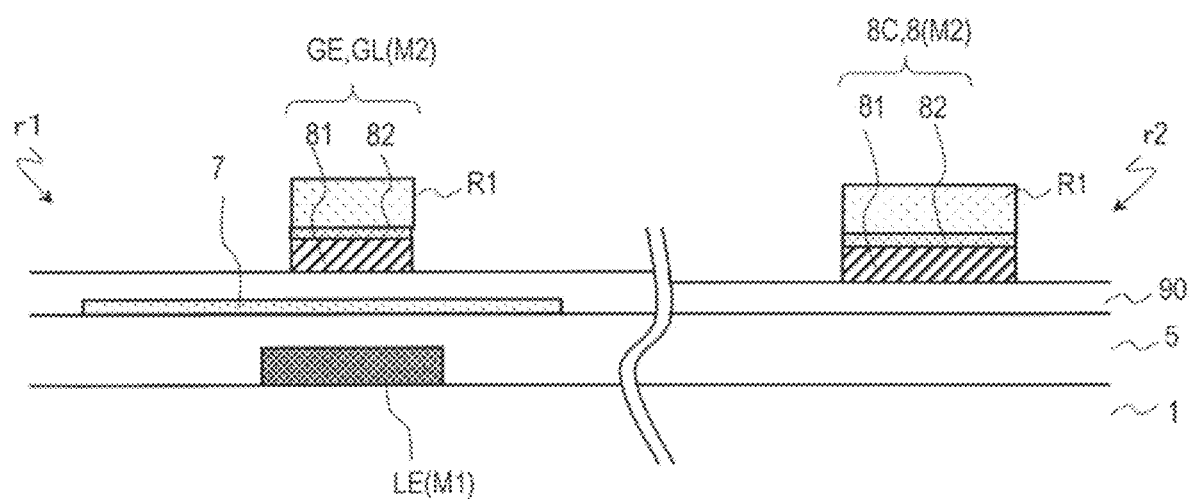
FIG. 11F is a process cross-sectional view illustrating the example of the method for manufacturing the active matrix substrate 101.

STEP 5: Forming Second Metal Layer M2 (FIG. 11E, FIG. 11F)

Next, the second conductive film 80 (having a thickness equal to or larger than 50 nm and equal to or less than 500 nm, for example) is formed on the gate insulating film 90, for example, by a sputtering method or the like.

The second conductive film 80 is a layered film including the Cu-containing conductive film 810 containing Cu and the metal oxide film 820. The Cu-containing conductive film 810 may include a Cu alloy layer and a Cu layer disposed on the Cu alloy layer.

The metal oxide film 820 can be formed by a sputtering method using, for example, a sputtering target identical to the oxide semiconductor layer 7.

Thereafter, as illustrated in FIG. 11F, the resist layer R1 is formed on a part of the second conductive film 80, and the second conductive film 80 is etched by using the resist layer R1 as a mask. Etching of the second conductive film 80 can be performed in the manner described with reference to FIG. 6A to FIG. 6D, for example. Thus, the second metal layer M2 including the gate bus line GL, the gate electrode GE of the pixel TFT, the first connection electrode 8C, the first wiring line 8, and the like is obtained. In this example, the second metal layer M2 includes the Cu-containing conductive layer 81 including a Cu alloy layer and a Cu layer, and the metal oxide layer 82 disposed on the upper face of the Cu-containing conductive layer 81.

Alternatively, the second metal layer M2 may be formed in the manner described with reference to FIG. 7A to FIG. 7E. Alternatively, the second conductive film 80 may include a barrier metal film such as a Ti film on the substrate 1 side of the Cu-containing conductive film 810. In this case, the second metal layer M2 may be formed in the methods described with reference to FIG. 8A to FIG. 8D or FIG. 9A to FIG. 9E.

Figure 11G:
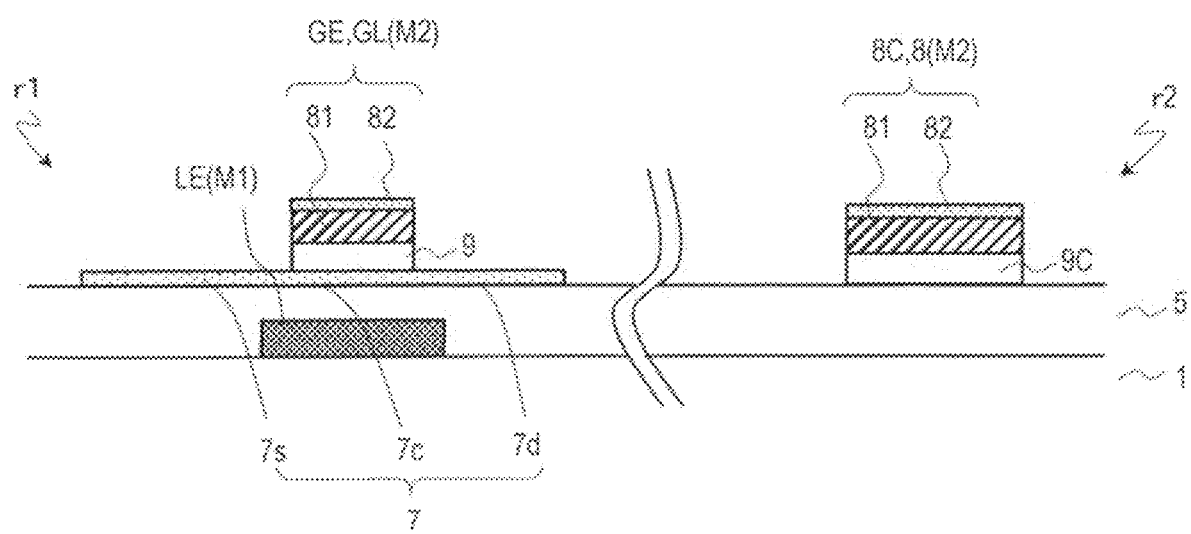
FIG. 11G is a process cross-sectional view illustrating the example of the method for manufacturing the active matrix substrate 101.

STEP 6: Patterning Gate Insulating Layer 9 (FIG. 11G)

Next, patterning (dry etching) of the gate insulating film 90 is performed by using the resist layer R1 described above as a mask or using the second metal layer M2 as a mask to form the gate insulating layers 9 and 9C. When viewed from the normal direction of the substrate 1, the side face of the gate electrode GE and the side face of the gate insulating layer 9 may be aligned with each other, and the side face of the first connection electrode 8C and the side face of the gate insulating layer 9C may be aligned with each other.

Note that patterning of the gate insulating film 90 and the second conductive film 80 may be performed separately. Specifically, prior to forming the second conductive film 80, patterning of the gate insulating film 90 is performed to form the gate insulating layers 9 and 9C. Subsequently, the second conductive film 80 may be formed to cover the gate insulating layers 9 and 9C, and the second metal layer M2 may be formed by patterning the second conductive film 80.

STEP 7: Processing for lowering Resistances of Oxide Semiconductor Layer 7 and Metal Oxide Layer 82

Subsequently, processing for lowering resistances of the oxide semiconductor layer 7 and the metal oxide layer 82 is performed. Plasma processing may be performed as the processing for lowering the resistances, for example. As a result, when viewed from the normal direction of the main surface of the substrate 1, regions of the oxide semiconductor layer 7 overlapping neither the gate electrode GE nor the gate insulating layer 9 (exposed regions) are low-resistive regions having a lower specific resistance than that of the region overlapping the gate electrode GE and the gate insulating layer 9 (here, the region serving as the channel). In this way, the oxide semiconductor layer 7 including the first region 7s and the second region 7d, which are the low-resistive regions, and the channel region 7c remaining as a semiconductor region without being lowered in resistance are obtained. In addition, by this processing for lowering resistances, the metal oxide layer 82 of the second metal layer M2 is similarly lowered in resistance and becomes a low-resistive region. The low-resistive region may be a conductive region (for example, sheet resistance equal to or less than 200Ω/□).

Note that the method of processing for lowering the resistances (plasma processing) is not limited to the method described above. For example, the exposed region of the oxide semiconductor layer 7 may be lowered in resistance by using plasma containing reducing plasma or a doping element (for example, argon plasma). The method and conditions of processing for lowering the resistances are described in JP 2008-40343 A, for example. The entire contents of the disclosure of JP 2008-40343 A are incorporated herein by reference.

Figure 11H:
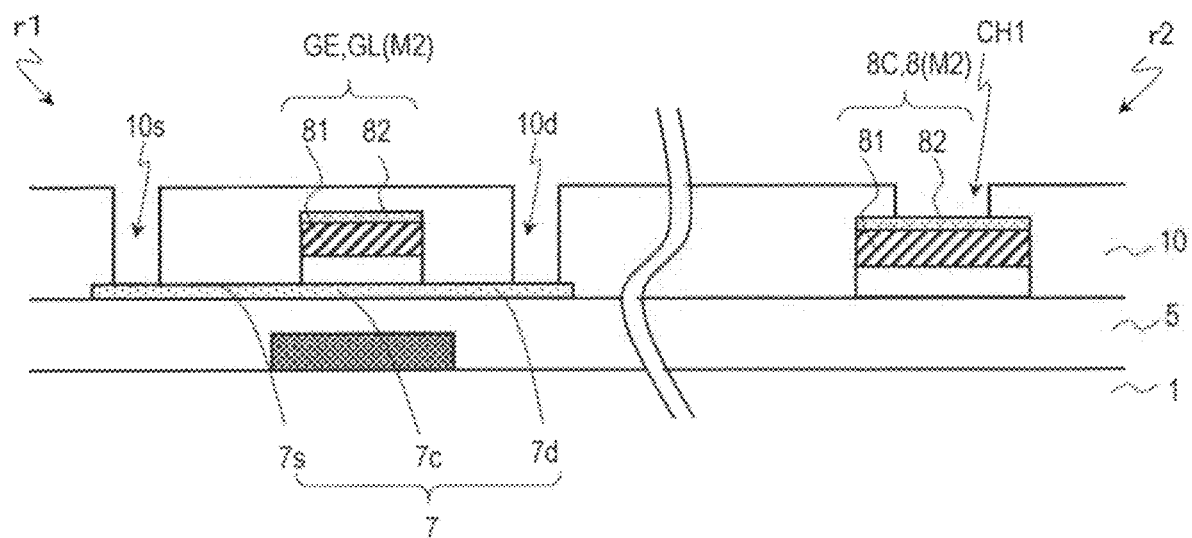
FIG. 11H is a process cross-sectional view illustrating the example of the method for manufacturing the active matrix substrate 101.

STEP 8: Forming Interlayer Insulating Layer 10 (FIG. 11H)

Subsequently, the interlayer insulating layer 10 that covers the oxide semiconductor layer 7, the gate insulating layer 9, and the gate electrode GE is formed. Thereafter, the interlayer insulating layer 10 is patterned by the known photolithography step. Thereby, as illustrated in FIG. 11H, the first opening 10s that exposes a part of the first region 7s of the oxide semiconductor layer 7 and the second opening 10d that exposes a part of the second region 7d are formed in the interlayer insulating layer 10 in the TFT formation region r1. Furthermore, the wiring line contact hole CH1 that exposes a part of the metal oxide layer 82 of the first connection electrode 8C is formed in the connection section formation region r2.

In patterning the interlayer insulating layer 10, for example, carbon tetrachloride ($CF_4$) gas and oxygen ($O_2$) gas ($CF_4/O_2$) are used as etching gas. Inert gas such as Ar gas may be added as appropriate. Etching conditions (a type of etching gas, substrate temperature, a degree of vacuum in a chamber, and the like) are set to conditions that can suppress damage to the oxide semiconductor layer 7 and the metal oxide layer 82 that serve as underlayers. As an example, in a case where $CF_4/O_2$ is used as the etching gas, when a flow rate of the $O_2$ gas is increased (for example, a flow rate ratio of $O_2$ gas to $CF_4$ gas is approximately from 10% to 25%), the surfaces of the oxide semiconductor layer 7 and the metal oxide layer 82 are less likely to be scraped. As a result, damage to the oxide semiconductor layer 7 can be reduced, and the formation of a projection in the wiring line contact hole CH1 can be more effectively suppressed.

The interlayer insulating layer 10 can be formed with a single layer of an inorganic insulating layer such as a silicon oxide film, a silicon nitride film, a silicon oxynitride film, and a silicon nitride oxide film, or formed by layering such inorganic insulating layers. The thickness of the inorganic insulating layer may be equal to or larger than 100 nm and equal to or less than 500 nm. It is preferable to form the interlayer insulating layer 10 by using an insulating film that reduces an oxide semiconductor such as a silicon nitride film, because the specific resistance of the region of the oxide semiconductor layer 7 being in contact with the interlayer insulating layer 10 (here, the low-resistive region) can be maintained low. Here, for example, a SiN layer (having a thickness of 300 nm) is formed as the interlayer insulating layer 10 by a CVD method.

When an insulating layer capable of reducing an oxide semiconductor (for example, a hydrogen donating layer such as a silicon nitride layer) is used as the interlayer insulating layer 10, even when the above-mentioned processing for lowering the resistances is not performed, the portion of the oxide semiconductor layer 7 being in contact with the interlayer insulating layer 10 can be lowered in resistance than the portions that are not contact with the interlayer insulating layer 10.

Note that when the wiring line connection section 32 illustrated in FIG. 10A to FIG. 10C as an example is formed, in this step, by collectively etching the interlayer insulating layer 10 and the lower insulating layer 5, the wiring line contact hole CH2 that exposes the lower connection electrode in the first metal layer M1 and the first connection electrode in the second metal layer M2 can be formed.

Figure 11I:
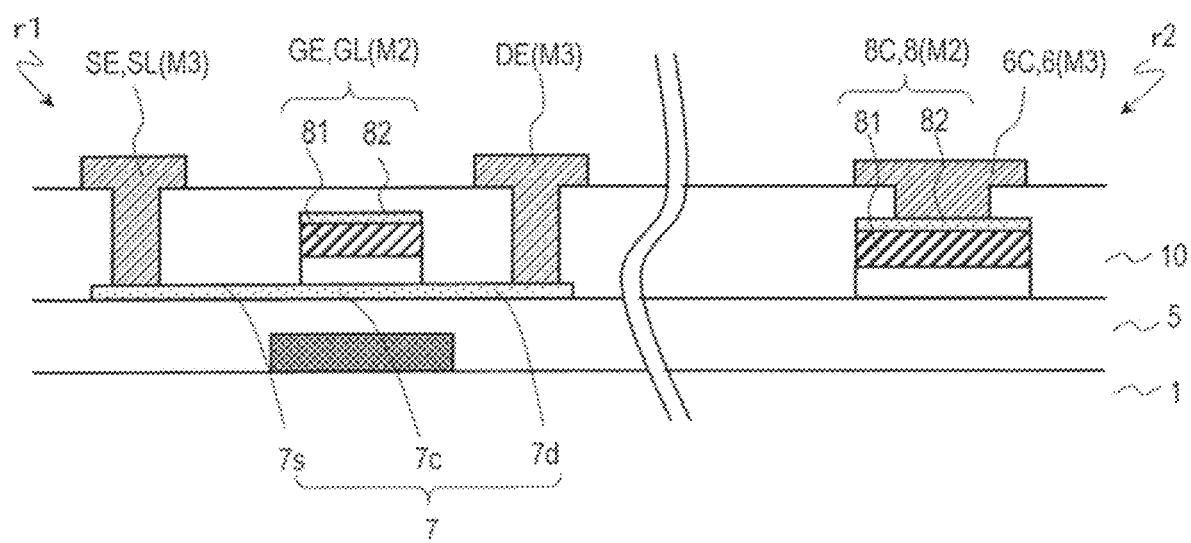
FIG. 11I is a process cross-sectional view illustrating the example of the method for manufacturing the active matrix substrate 101.

STEP 9: Forming Third Metal Layer M3 (FIG. 11I)

Subsequently, a third conductive film (having a thickness equal to or larger than 50 nm and equal to or less than 500 nm, for example) (not illustrated) is formed on the interlayer insulating layer 10, and the third conductive film is patterned. Thus, as illustrated in FIG. 11I, the third metal layer M3 including the source bus line SL, the source electrode SE, the drain electrode DE, the second connection electrode 6C, and the second wiring line 6 is formed.

The source electrode SE is disposed on the interlayer insulating layer 10 and in the first opening 10s, and is connected to the first region 7s of the oxide semiconductor layer 7 in the first opening 10s. The drain electrode DE is disposed on the interlayer insulating layer 10 and in the second opening 10d, and is connected to the second region 7d of the oxide semiconductor layer 7 in the second opening 10d. The second connection electrode 6C is disposed on the interlayer insulating layer 10 and in the wiring line contact hole CH1, and is connected to the metal oxide layer 82 of the first connection electrode 8C in the wiring line contact hole CH1.

As the third conductive film, an element selected from aluminum (Al), chromium (Cr), copper (Cu), tantalum (Ta), titanium (Ti), molybdenum (Mo), and tungsten (W), an alloy containing these elements as components, or the like can be used. For example, the third conductive film may have a triple-layer structure of titanium film-aluminum film-titanium film, a triple-layer structure of molybdenum film-aluminum film-molybdenum film, or the like. Note that the third conductive film is not limited to the triple-layer structure, and may have a single-layer or dual-layer structure, or a layered structure of four or more layers. Here, a layered film having a Ti film (having a thickness from 15 nm to 70 nm) as a lower layer and having a Cu film (having a thickness from 50 nm to 400 nm) as an upper layer is used. By using a layered film using an ohmic conductive film such as a Ti film as the bottom layer, a contact resistance of a source contact portion can be lowered more effectively.

STEP 10. Forming Inorganic Insulating Layer 11 and Organic Insulating Layer 12 (FIG. 11J)

Figure 11J:
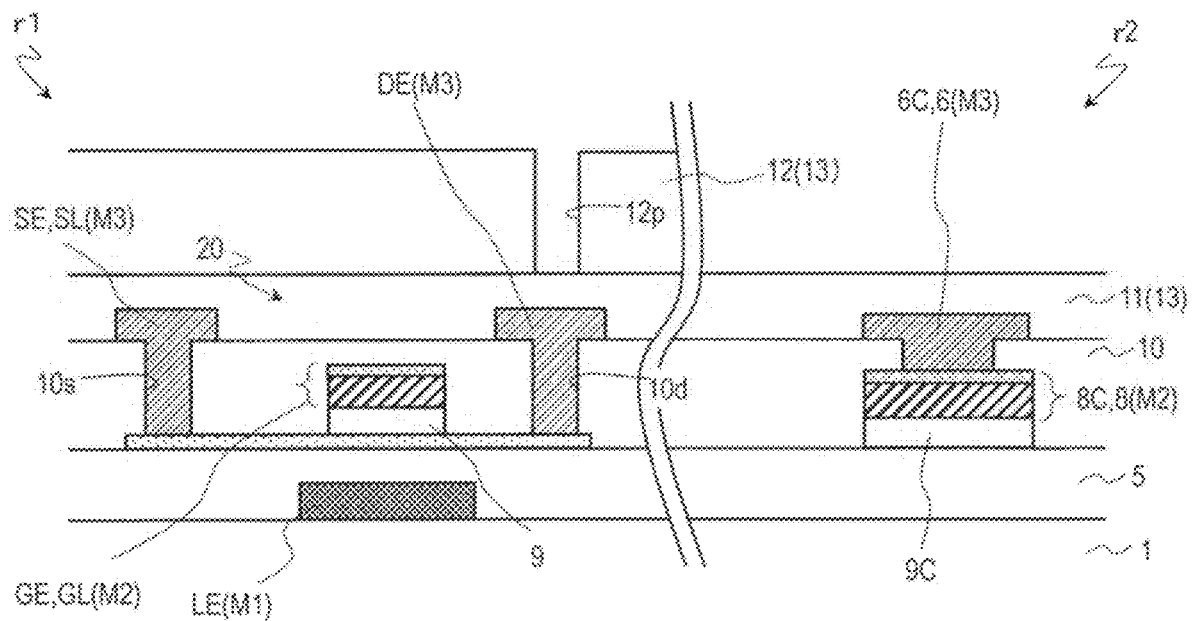
FIG. 11J is a process cross-sectional view illustrating the example of the method for manufacturing the active matrix substrate 101.

Next, as illustrated in FIG. 11J, the upper insulating layer 13 is formed to cover the interlayer insulating layer 10 and the third metal layer M3. Here, as the upper insulating layer 13, the inorganic insulating layer 11 (having a thickness equal to or larger than 100 nm and equal to or less than 500 nm, for example) and the organic insulating layer 12 (having a thickness from 1 μm to 4 μm, preferably from 2 μm to 3 μm, for example) are formed in this order.

As the inorganic insulating layer 11, an inorganic insulating film similar to that of the interlayer insulating layer 10 can be used. Here, as the inorganic insulating layer 11, for example, an SiNx layer (having a thickness of 300 nm) is formed by a CVD method. The organic insulating layer 12 may be, for example, an organic insulating film containing a photosensitive resin material (for example, an acrylic resin film).

Next, the organic insulating layer 12 is patterned. In this manner, in each pixel area, an opening 12p that exposes a part of the inorganic insulating layer 11 is formed in the organic insulating layer 12. The opening 12p is disposed to overlap the drain electrode DE when viewed from the normal direction of the substrate 1. The entire portion of the organic insulating layer 12 positioned in the non-display region may be removed by this patterning.

STEP 11: Forming Common Electrode CE (FIG. 11K)

Figure 11K:
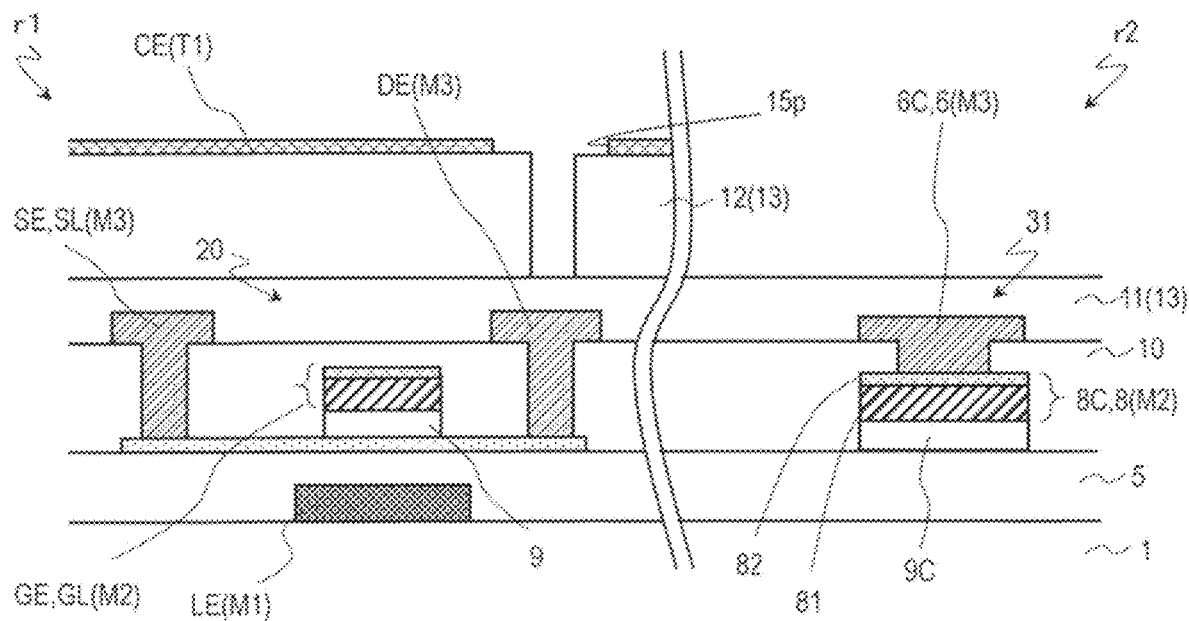
FIG. 11K is a process cross-sectional view illustrating the example of the method for manufacturing the active matrix substrate 101.

Subsequently, as illustrated in FIG. 11K, the common electrode CE is formed on the upper insulating layer 13.

First, the first transparent conductive film (having a thickness from 20 nm to 300 nm) (not illustrated) is formed on the upper insulating layer 13 and in the opening 12p. Here, for example, an indium-zinc oxide film is formed as the first transparent conductive film by a sputtering method. As a material of the first transparent conductive film, metal oxide such as indium-tin oxide (ITO), indium-zinc oxide, and ZnO can be used. Subsequently, patterning of the first transparent conductive film is performed. In the patterning, wet etching may be performed using an oxalic acid etching solution, for example. This allows the common electrode CE to be obtained. The common electrode CE has, for example, the opening 15p over a region where the pixel contact hole is formed.

STEP 12: Forming Dielectric Layer 17 (FIG. 11L)

Figure 11L:
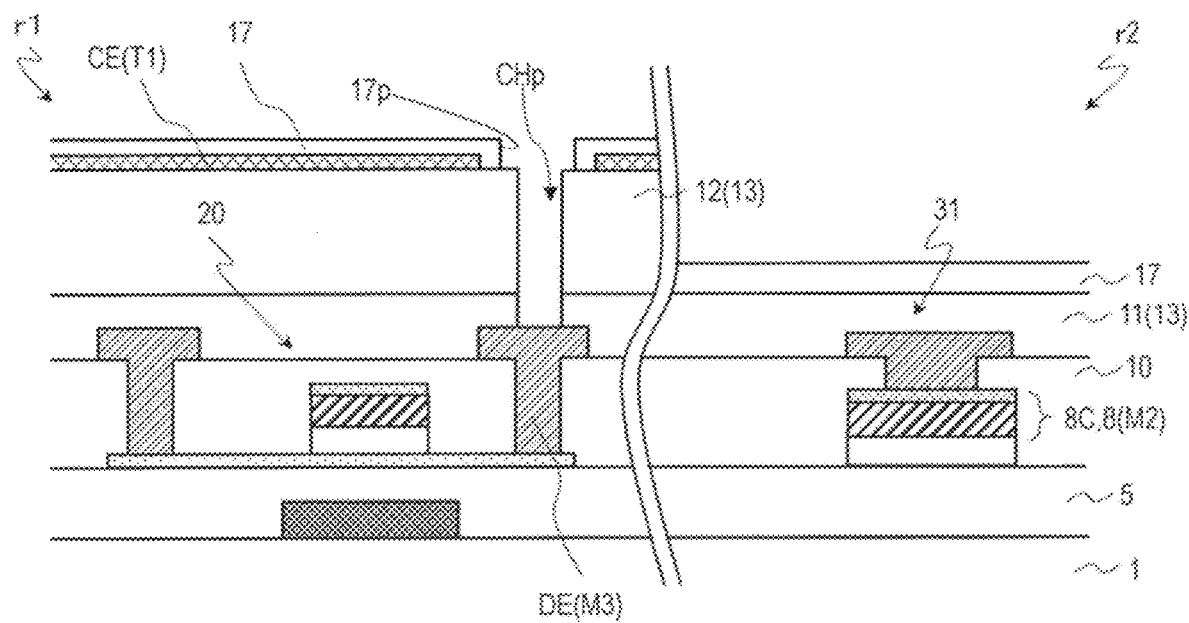
FIG. 11L is a process cross-sectional view illustrating the example of the method for manufacturing the active matrix substrate 101.

Next, as illustrated in FIG. 11L, the dielectric layer 17 (having a thickness from 50 nm to 500 nm) is formed to cover the common electrode CE, and the dielectric layer 17 and the inorganic insulating layer 11 are patterned.

The dielectric layer 17 is formed on the organic insulating layer 12 and the common electrode CE and in the opening 12p in the pixel area. A material of the dielectric layer 17 may be the same as the material exemplified as the material of the inorganic insulating layer 11. Here, as the dielectric layer 17, for example, a SiN film is formed by a CVD method.

Subsequently, by a known photolithography step, etching of the dielectric layer 17 and the inorganic insulating layer 11 is performed, and the pixel contact hole CHp that exposes the drain electrode DE is thereby formed. In this example, the pixel contact hole CHp is configured of the opening 17p of the dielectric layer 17, the opening 12p of the organic insulating layer 12, and the opening 11p of the inorganic insulating layer 11. The opening 17p may overlap at least partially the opening 12p when viewed from the normal direction of the substrate 1. The opening 11p is etched using a resist layer (not illustrated) on the dielectric layer 17 and the organic insulating layer 12 as a mask.

Figure 11M:
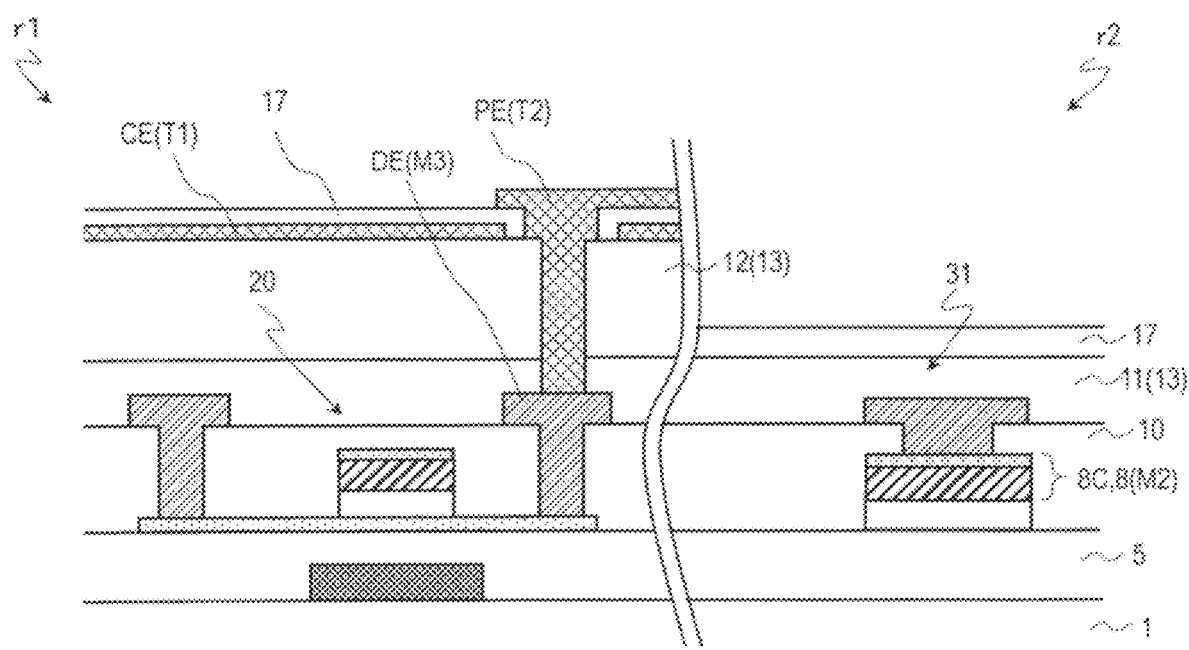
FIG. 11M is a process cross-sectional view illustrating the example of the method for manufacturing the active matrix substrate 101.

STEP 13: Forming Pixel Electrode PE (FIG. 11M)

Subsequently, the second transparent conductive film (having a thickness from 20 nm to 300 nm) (not illustrated) is formed on the dielectric layer 17 and in the pixel contact hole CHp. The second transparent conductive film can be formed using a material similar to that of the first transparent conductive film.

Thereafter, the second transparent conductive film is patterned. Here, for example, wet etching of the second transparent conductive film is performed by using an oxalic acid etching solution. In this manner, as illustrated in FIG. 11M, the pixel electrode PE is formed in each pixel area. The pixel electrode PE is connected to the drain electrode DE in the pixel contact hole CHp. In this manner, the active matrix substrate 101 is manufactured.

Second Embodiment

In the following, an active matrix substrate according to a second embodiment will be described. The active matrix substrate according to the second embodiment differs from the active matrix substrate 101 according to the embodiment described above in that the source bus lines SL are formed in the first metal layer M 1 (a lower source substrate structure is employed).

Figure 12A:
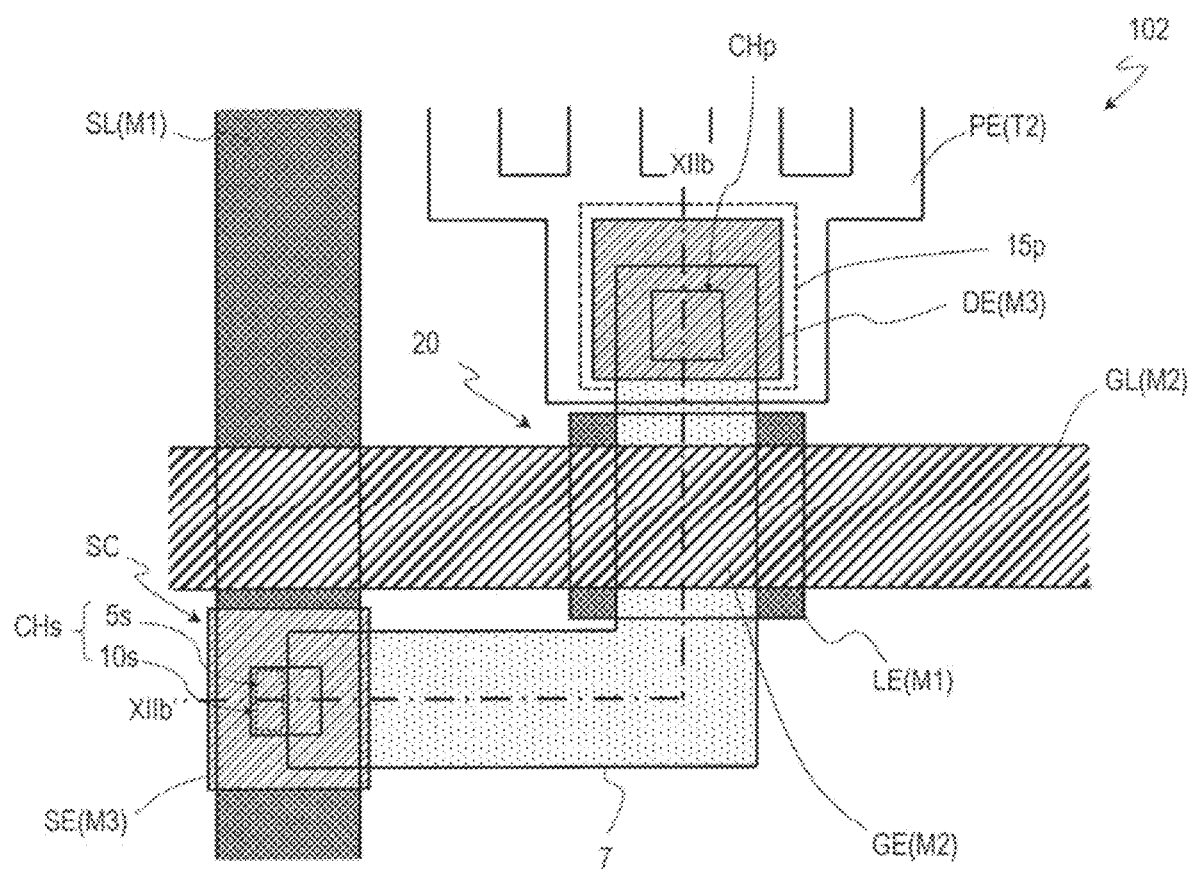
FIG. 12A is a plan view illustrating a pixel area in an active matrix substrate 102 according to a second embodiment.
Figure 12B:
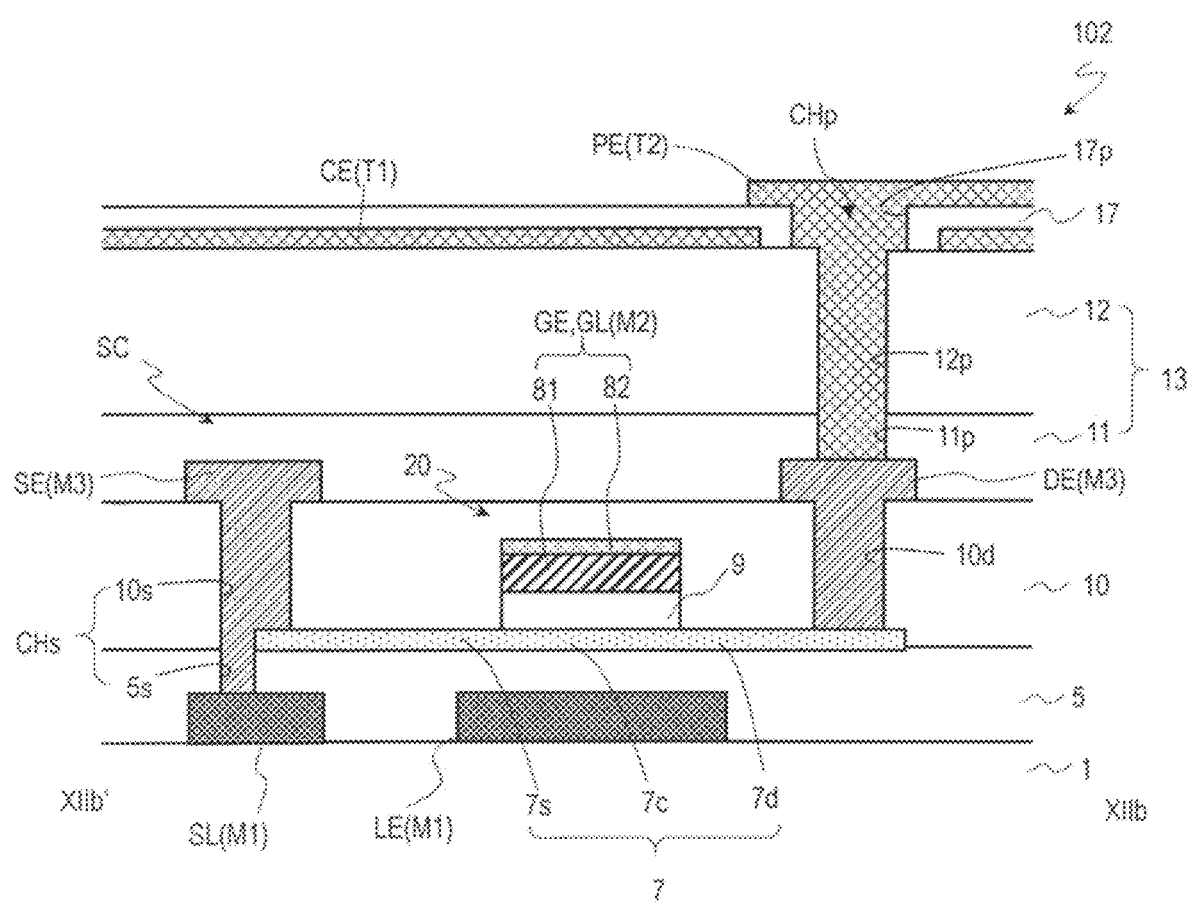
FIG. 12B is a cross-sectional view of the pixel area taken along the line XIIb-XIIb' illustrated in FIG. 12A.

FIG. 12A is a plan view illustrating an example of each pixel area in an active matrix substrate 102 according to the second embodiment, and FIG. 12B is a cross-sectional view taken along the line XIIb-XIIb' being across the TFT 20 in the pixel area. Constituent elements similar to those of FIG. 2A and FIG. 2B are denoted by the same reference signs and description thereof will be omitted.

In the present embodiment, the first metal layer M1 includes the lower electrode LE of the TFT 20 and the plurality of source bus lines SL. The second metal layer M2 including the oxide semiconductor layer 7 of the TFT 20, the gate insulating layer 9, the gate electrode GE of the TFT, and the plurality of gate bus lines GL, the interlayer insulating layer 10 covering the second metal layer M2, and the third metal layer M3 are formed in this order on the lower insulating layer 5 covering the first metal layer M1. In the present embodiment, the third metal layer M3 includes the source electrode SE and the drain electrode DE of the TFT 20. As with the embodiment described above, the lower transparent conductive layer T1, the dielectric layer 17, and the upper transparent conductive layer T2 are formed on the third metal layer M3.

The TFT 20 of the present embodiment differs from the TFT structure illustrated in FIG. 2A and FIG. 2B in that a source contact hole CHs is formed in the lower insulating layer 5 and the interlayer insulating layer 10. The source contact hole CHs exposes a part of the source bus line SL and a part of the first region 7s of the oxide semiconductor layer 7 in the TFT 20. The source contact hole CHs includes a lower opening 5s formed in the lower insulating layer 5 and the first opening 10s formed in the interlayer insulating layer 10. The source contact hole CHs can be formed, for example, by etching the interlayer insulating layer 10 and the lower insulating layer 5 with the oxide semiconductor layer 7 being used as an etch stop, for example. In this case, the side face of the oxide semiconductor layer 7 can be aligned with the side face of the lower opening 5s in the source contact hole CHs. In the present embodiment, when viewed from the normal direction of the substrate 1, the edge (peripheral edge) of the oxide semiconductor layer 7 extends across the first opening 10s. Furthermore, when viewed from the normal direction of the substrate 1, the lower opening 5s is disposed inside the first opening 10s, and does not overlap the oxide semiconductor layer 7.

The source electrode SE is disposed on the interlayer insulating layer 10 and in the source contact hole CHs, and is connected to both the exposed portion of the source bus line SL and the exposed portion of the first region 7s of the oxide semiconductor layer 7 (here, an upper face and a side face at an end portion of the first region 7s) in the source contact hole CHs. The source electrode SE may directly contact both the source bus line SL and the first region 7s in the source contact hole CHs. A connection section SC that electrically connects the source bus line SL and the first region 7s of the oxide semiconductor layer 7 through the source electrode SE is referred to as a "source contact portion".

A rate of an area of a portion where the first opening 10s and the oxide semiconductor layer 7 overlap with each other when viewed from the normal direction of the substrate 1 (that is, a contact area between the source electrode SE and the upper face of the oxide semiconductor layer 7) with respect to the whole area of the first opening 10s may be, for example, equal to or larger than ⅓ and equal to or less than ⅔.

Figure 13A:
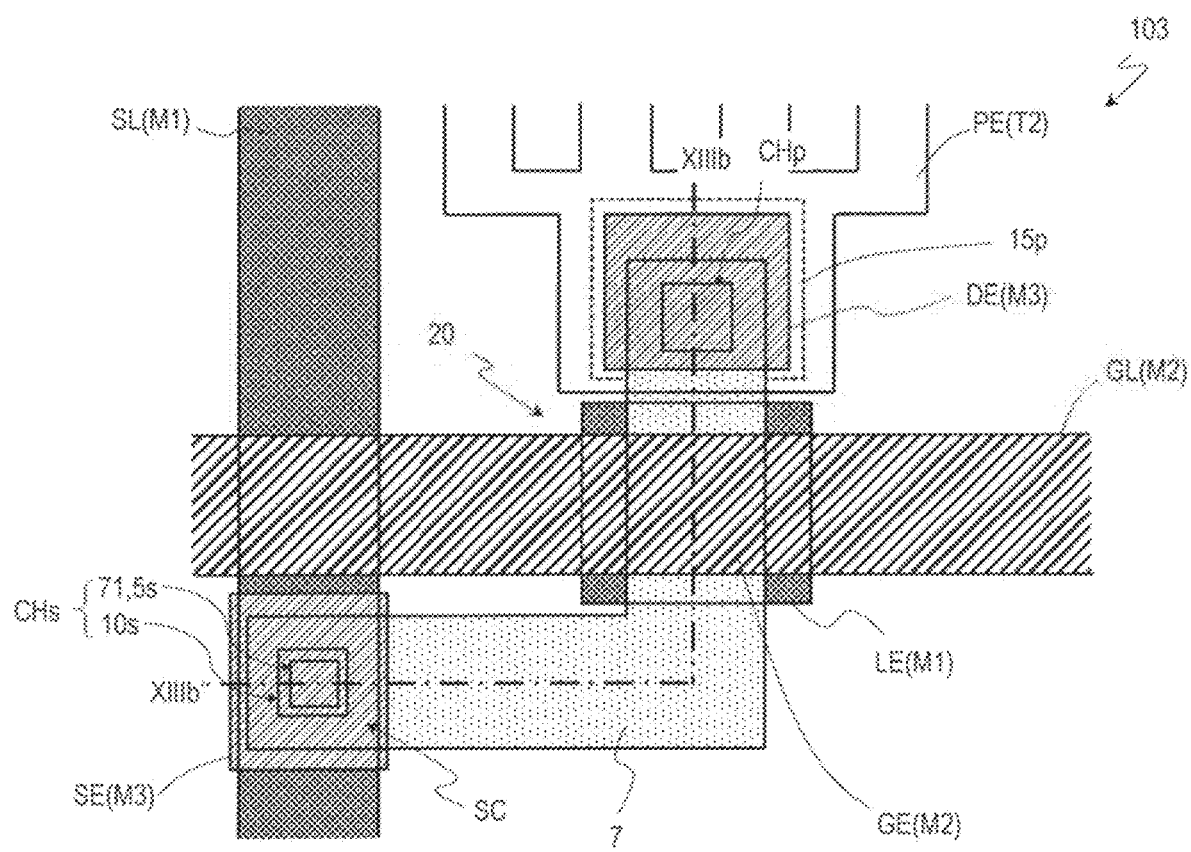
FIG. 13A is a plan view illustrating a pixel area in another active matrix substrate 103 according to the second embodiment.
Figure 13B:
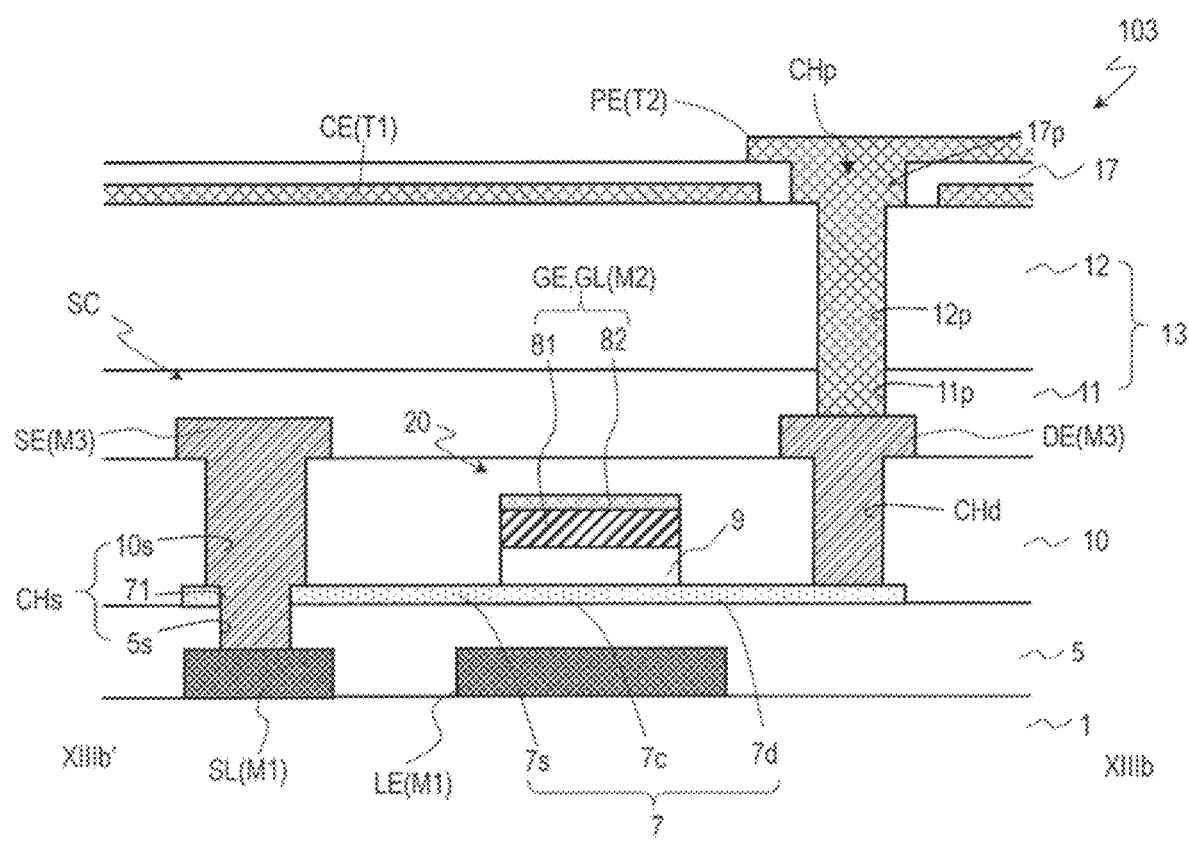
FIG. 13B is a cross-sectional view of the pixel area taken along the line XIIIb-XIIVb' illustrated in FIG. 13A.

FIG. 13A is a plan view illustrating an example of each pixel area in another active matrix substrate 103 according to the second embodiment, and FIG. 13B is a cross-sectional view taken along the line XIIIb-XIIIb' being across the TFT 20 in the pixel area.

The active matrix substrate 103 is different from the active matrix substrate 102 in that an opening 71 is formed in the first region 7s of the oxide semiconductor layer 7 in a source contact portion SC. Note that, instead of providing the opening 71 in the oxide semiconductor layer 7, a notched portion may be provided.

In the active matrix substrate 103, the source contact hole CHs of the TFT 20 is configured of the lower opening 5s of the lower insulating layer 5, the opening 71 (or notched portion) of the oxide semiconductor layer 7, and the first opening 10s of the interlayer insulating layer 10. The first opening 10s is disposed so as to at least partially overlap the opening 71 of the oxide semiconductor layer 7 when viewed from the normal direction of the substrate 1. In this manner, when viewed from the normal direction of the substrate 1, the opening 71 and the lower opening 5s may be positioned inside the first opening 10s. According to this, even when misalignment occurs, the contact area between the source electrode SE and the oxide semiconductor layer 7 can be maintained. Note that when the opening 71 of the oxide semiconductor layer 7 is positioned inside the first opening 10s, the entire side face of the lower opening 5s can be aligned with the side face of the opening 71. Such a structure may be formed by performing etching of the lower insulating layer 5 and the interlayer insulating layer 10 by using the oxide semiconductor layer 7 as an etch stop.

Wiring Line Connection Section 33

The active matrix substrates 102 and 103 having the lower source substrate structure may include a wiring line connection section (source-gate connection section) that electrically connects the wiring line (lower wiring line) formed in the first metal layer M1 and the first wiring line formed in the second metal layer M2 through a second connection electrode disposed on the interlayer insulating layer 10.

Figure 14A:
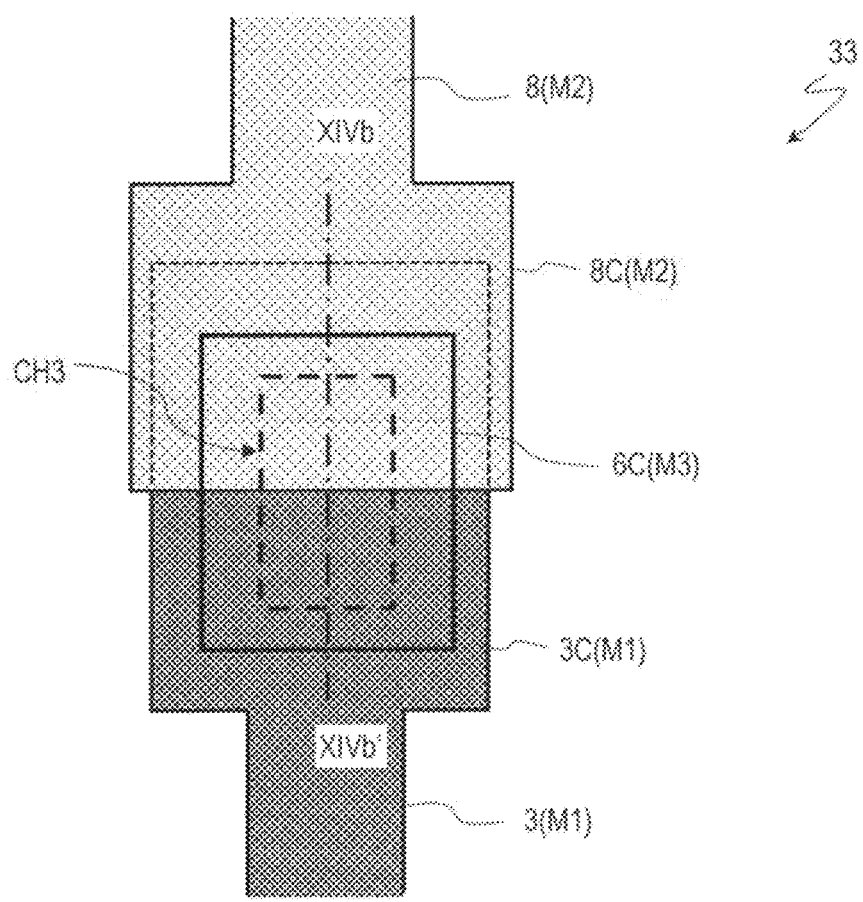
FIG. 14A is a plan view illustrating an example of a wiring line connection section 33 in the active matrix substrate 102.
Figure 14B:
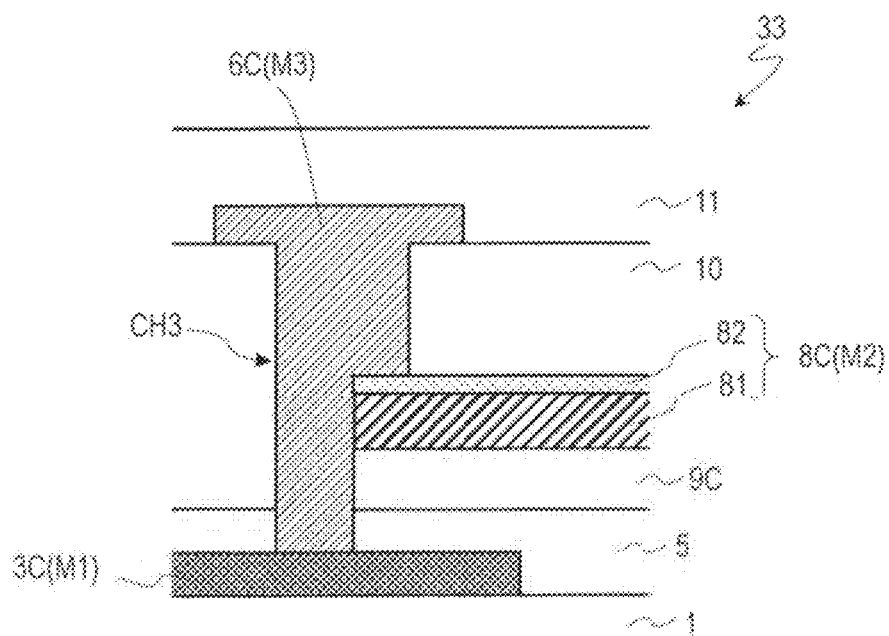
FIG. 14B is a cross-sectional view of the wiring line connection section 33 taken along the line XIVb-XIVb' illustrated in FIG. 14A.

FIG. 14A and FIG. 14B are a plan view and a cross-sectional view illustrating an example of a wiring line connection section (source-gate connection section) 33 in the active matrix substrates 102 and 103, respectively. Here, only a single wiring line connection section is illustrated.

The wiring line connection section 33 includes the lower connection electrode 3C that is a part of the lower wiring line 3 formed in the first metal layer M1, the lower insulating layer 5 extending over the lower connection electrode 3C, the first connection electrode 8C that is a part of the first wiring line 8 formed in the second metal layer M2, the gate insulating layer 9C extending between the lower insulating layer 5 and the first connection electrode 8C, the interlayer insulating layer 10 extending over the first connection electrode 8C, and the second connection electrode 6C disposed in a wiring line contact hole CH3 formed in the interlayer insulating layer 10 and the lower insulating layer 5 and on the interlayer insulating layer 10.

The wiring line contact hole CH3 exposes a part of the metal oxide layer 82 in the first connection electrode 8C and a part of the lower connection electrode 3C. In this example, a part of the upper face and a part of the side face of the metal oxide layer 82, a part of the side face of the Cu-containing conductive layer 81, and a part of the upper face of the lower connection electrode 3C are exposed. The second connection electrode 6C is formed, for example, in the third metal layer M3. The second connection electrode 6C is disposed on the interlayer insulating layer 10 and in the wiring line contact hole CH3, and is connected to the exposed portion of the first connection electrode 8C and the exposed portion of the lower connection electrode 3C in the wiring line contact hole CH3.

For example, the lower wiring line 3 may be the source bus line SL, and the first wiring line 8 may be a gate connection wiring line. Alternatively, the first wiring line 8 may be the gate bus line GL, and the lower wiring line 3 may be a source connection wiring line (see FIG. 1). Further, both the first wiring line 8 and the lower wiring line 3 may be wiring lines other than bus lines.

Note that in FIG. 14A and FIG. 14B, an example in which the metal oxide layer 82 is disposed on only the upper face of the Cu-containing conductive layer 81 is illustrated, but as exemplified in FIG. 10B, the metal oxide layer 82 may be disposed so as to also cover the side face of the Cu-containing conductive layer 81. As a result, the Cu-containing conductive layer 81 is not exposed in the wiring line contact hole CH2, so the occurrence of an etching inhibitor can be more effectively suppressed.

Here, the source-gate connection section has been described as an example, but other wiring line connection sections such as a terminal section may have a similar structure. In addition, in the active matrix substrates 102 and 103, in a case where the pixel TFT or the circuit TFT has a double gate structure, a gate connection section having a similar configuration to that described above may be provided.

Method for Manufacturing Active Matrix Substrate 102

Next, an example of a method for manufacturing the active matrix substrate 102 according to the present embodiment will be described with reference to the accompanying drawings. Description of a material, thickness, forming process, and the like of each layer will be omitted when they are similar to those of the active matrix substrate 101 (see FIG. 11A to FIG. 11M). Note that by differentiating the pattern of the oxide semiconductor layer 7, the active matrix substrate 103 may be manufactured by a similar method to that of the active matrix substrate 102.

FIG. 15A to FIG. 15G are schematic process cross-sectional views for describing the method for manufacturing the active matrix substrate 102. Here, the TFT formation region r1 where each pixel TFT is formed, and the connection section formation region r2 where each wiring line connection section (source-gate connection section) is formed are illustrated.

Figure 15A:
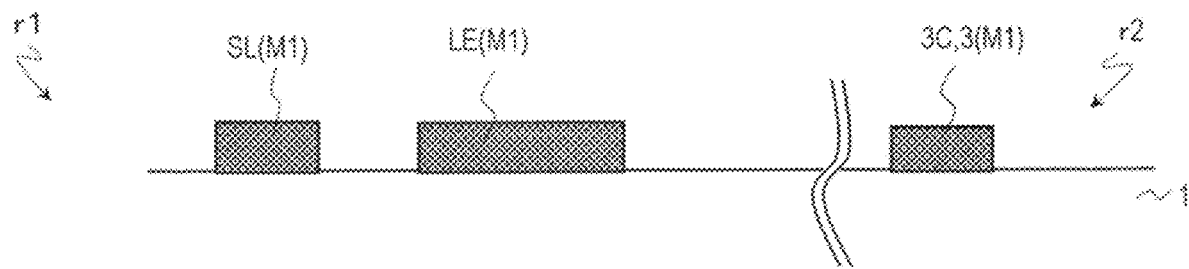
FIG. 15A is a process cross-sectional view illustrating an example of a method for manufacturing the active matrix substrate 102.
Figure 15B:
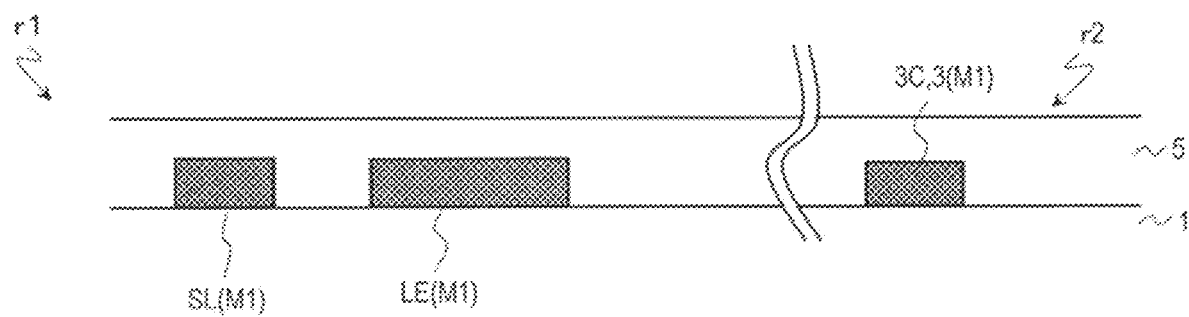
FIG. 15B is a process cross-sectional view illustrating the example of the method for manufacturing the active matrix substrate 102.
Figure 15C:
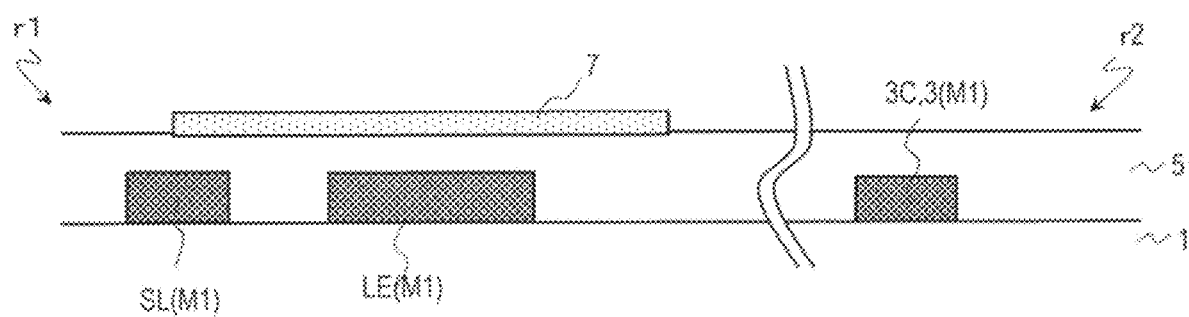
FIG. 15C is a process cross-sectional view illustrating the example of the method for manufacturing the active matrix substrate 102.
Figure 15D:
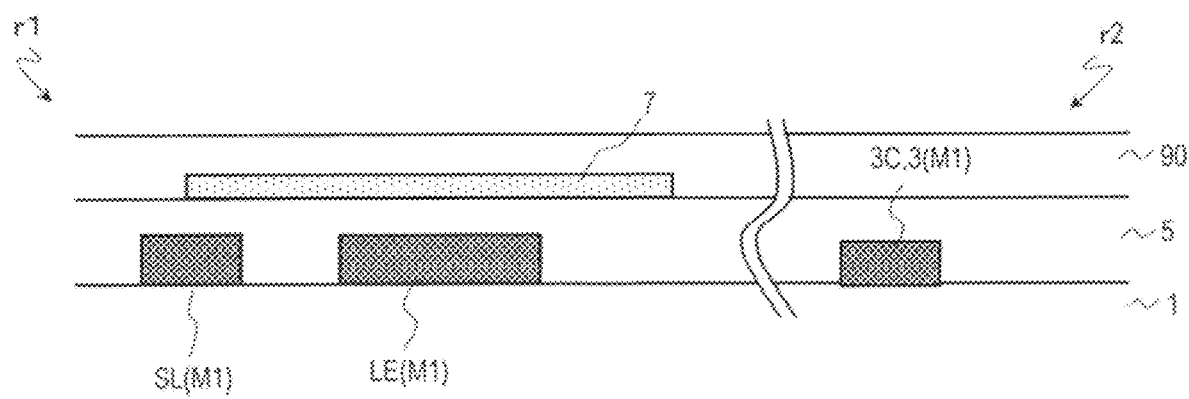
FIG. 15D is a process cross-sectional view illustrating the example of the method for manufacturing the active matrix substrate 102.
Figure 15E:
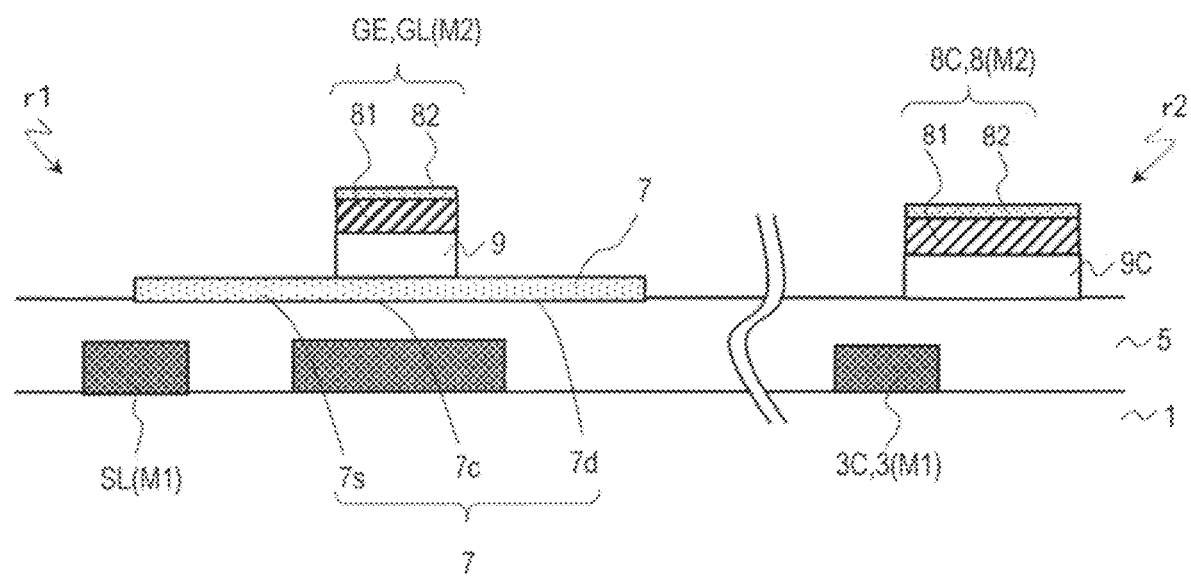
FIG. 15E is a process cross-sectional view illustrating the example of the method for manufacturing the active matrix substrate 102.

A first conductive film is formed on the substrate 1, and patterning of the first conductive film is performed. As a result, as illustrated in FIG. 15A, the first metal layer M1 including the source bus line SL, the lower electrode LE of the TFT, the lower connection electrode 3C of the wiring line connection section, and the lower wiring line 3 is formed (STEP 1).

Note that when the source bus line SL is directly connected to the oxide semiconductor layer 7, an ohmic conductive film such as a Ti film may be provided on the top layer of the source bus line SL in order to reduce a contact resistance. In contrast, in the present embodiment, the source bus line SL is connected to the oxide semiconductor layer 7 through the source electrode SE, so an ohmic conductive film need not be provided on the top layer of the source bus line SL. Thus, a layered film having a single-layer film formed from a metal film containing Cu or Al as the first conductive film or a layered film having a top layer formed from such a metal film may be used.

Next, as illustrated in FIG. 15B to FIG. 15E, as with the embodiment described above, the lower insulating layer 5 that covers the first metal layer M1 is formed, and the oxide semiconductor layer 7 is formed on the lower insulating layer 5. Next, the gate insulating film 90 and the second conductive film are formed, and patterning is performed to form the gate insulating layer 9 and the gate electrode GE in the TFT formation region r1 and to form the gate insulating layer 9C and the first connection electrode 8C in the connection section formation region r2 (STEP 2 to STEP 6). Subsequently, processing for lowering resistances of the oxide semiconductor layer 7 and the metal oxide layer 82 may be performed (STEP 7).

Figure 15F:
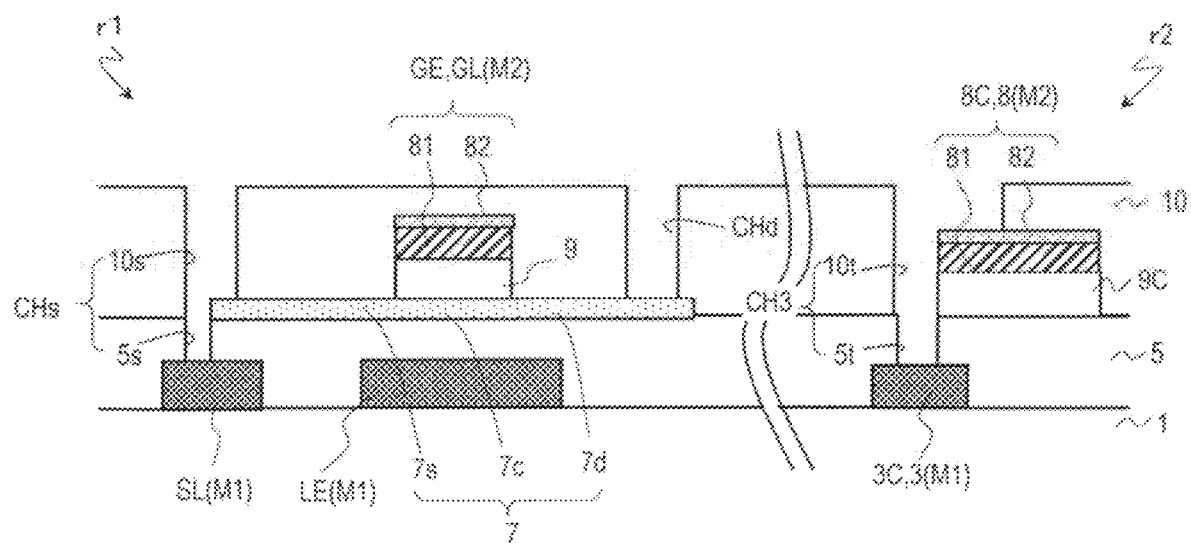
FIG. 15F is a process cross-sectional view illustrating the example of the method for manufacturing the active matrix substrate 102.

Subsequently, as illustrated in FIG. 15F, the interlayer insulating layer 10 that covers the oxide semiconductor layer 7, the gate insulating layer 9, and the gate electrode GE is formed (STEP 8).

Thereafter, the interlayer insulating layer 10 and the lower insulating layer 5 are patterned by the known photolithography step. The patterning of the interlayer insulating layer 10 and the lower insulating layer 5 can be performed, for example, by dry etching.

Thus, in the TFT formation region r1, the source contact hole CHs that exposes a part of the source bus line SL and a part of the first region 7s of the oxide semiconductor layer 7 is formed in the interlayer insulating layer 10 and the lower insulating layer 5, and the second opening 10d that exposes a part of the second region 7d of the oxide semiconductor layer 7 is formed. The source contact hole CHs includes the lower opening 5s formed in the lower insulating layer 5 and the first opening 10s formed in the interlayer insulating layer 10. In the source contact hole CHs, a part of the side face of the lower opening 5s formed in the lower insulating layer 5 may be aligned with the side face of the oxide semiconductor layer 7, and another part thereof may be aligned with the side face of the first opening 10s.

On the other hand, in the connection section formation region r2, the wiring line contact hole CH3 that exposes a part of the lower connection electrode 3C and a part of the first connection electrode 8C is formed in the interlayer insulating layer 10 and the lower insulating layer 5. In this example, a part of the upper face and a part of the side face of the metal oxide layer 82, a part of the side face of the Cu-containing conductive layer 81, and a part of the upper face of the lower connection electrode 3C are exposed in the wiring line contact hole CH3.

The wiring line contact hole CH3 is configured of a lower opening 5t formed in the lower insulating layer 5 and an upper opening 10t formed in the interlayer insulating layer 10. In the wiring line contact hole CH3, a part of the side face of the lower opening 5t may be aligned with the side faces of the first connection electrode 8C and the gate insulating layer 9C, and another part thereof may be aligned with the side face of the upper opening 10t.

Also in the present embodiment, by forming the metal oxide layer 82 as the top layer of the first connection electrode 8C, it is possible to suppress the generation of a projection in the wiring line contact hole CH3 in this etching step.

In patterning the interlayer insulating layer 10 and the lower insulating layer 5, for example, carbon tetrachloride ($CF_4$) gas and oxygen ($O_2$) gas ($CF_4/O_2$) are used as the etching gas. Inert gas such as Ar gas may be added as appropriate. Etching conditions (a type of etching gas, substrate temperature, a degree of vacuum in a chamber, and the like) are set to conditions that can suppress damage to the oxide semiconductor layer 7 and the metal oxide layer 82. As an example, in a case where $CF_4/O_2$ is used as the etching gas, when a flow rate of the $O_2$ gas is increased (for example, a flow rate ratio of $O_2$ gas to $CF_4$ gas is approximately from 10% to 25%), the surfaces of the oxide semiconductor layer 7 and the metal oxide layer 82 are less likely to be scraped. As a result, damage to the oxide semiconductor layer 7 can be reduced, and the formation of a projection in the wiring line contact hole CH3 can be more effectively suppressed.

Figure 15G:
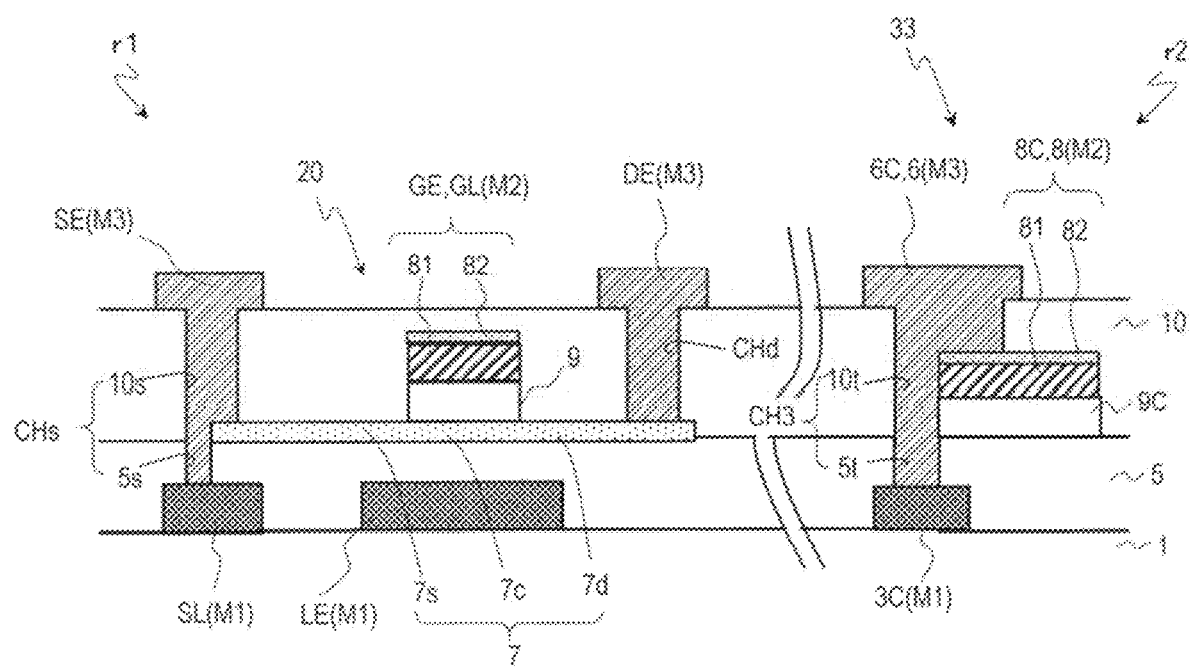
FIG. 15G is a process cross-sectional view illustrating the example of the method for manufacturing the active matrix substrate 102.

Next, as illustrated in FIG. 15G, a third conductive film is formed on the interlayer insulating layer 10, and the third conductive film is patterned to form the third metal layer M3 including the source electrode SE, the drain electrode DE, the second connection electrode 6C, and the second wiring line 6 (STEP 9). The source electrode SE is disposed on the interlayer insulating layer 10 and in the source contact hole CHs, and is connected to both the source bus line SL and the first region 7s of the oxide semiconductor layer 7 in the source contact hole CHs. The drain electrode DE is disposed on the interlayer insulating layer 10 and in the second opening 10d, and is connected to the second region 7d of the oxide semiconductor layer 7 in the second opening 10d. The second connection electrode 6C is connected to the lower connection electrode 3C and the first connection electrode 8C in the wiring line contact hole CH3. In this example, the second connection electrode 6C directly makes contact with a part of the upper face and a part of the side face of the metal oxide layer 82, a part of the side face of the Cu-containing conductive layer 81, and a part of the upper face of the lower connection electrode 3C in the wiring line contact hole CH3.

In the present embodiment, the lower face of the source electrode SE directly makes contact with the oxide semiconductor layer 7. In order to reduce a contact resistance between the source electrode SE and the oxide semiconductor layer 7, a layered film having an ohmic conductive film such as a Ti film as the bottom layer may be used as the third conductive film.

Subsequently, although not illustrated, the upper insulating layer 13, the lower transparent conductive layer T1 including the common electrode CE, the dielectric layer 17, and the upper transparent conductive layer T2 including the pixel electrode PE are formed in a similar manner to that of the active matrix substrate 101 (STEP 10 to STEP 12). In this manner, the active matrix substrate 102 is manufactured.

In the conventional lower source substrate structure, the source contact portion has a structure in which the oxide semiconductor layer and the source bus line directly contact with each other in an opening for source formed in the lower insulating layer. Compared to such a conventional structure, the active matrix substrate according to the present embodiment achieves the following effects.

According to the active matrix substrates 102 and 103 of the present embodiment, the oxide semiconductor layer 7 and the source bus line SL are connected through the source electrode SE, so it is possible to reduce a contact resistance of the source contact portion, compared to the conventional lower source substrate.

In addition, for the conventional lower source substrate, patterning of the lower insulating layer 5 is required before the formation of the oxide semiconductor layer 7. In contrast, in the present embodiment, since the lower insulating layer 5 and the interlayer insulating layer 10 are etched in a common etching step, the number of photomasks to be used can be reduced.

Furthermore, according to the investigation by the present inventors, in the conventional lower source substrate, a part of a resist layer formed on the lower insulating layer 5 may remain without being peeled. The remaining portion of the resist layer is referred to as a "resist residue". When the oxide semiconductor film is formed on the lower insulating layer 5, because the adhesion between the oxide semiconductor film and the remaining resist is low, a portion of the oxide semiconductor film positioned on the resist residue may be peeled off to generate a defect in the oxide semiconductor film. In the present embodiment, there is no need to form a resist layer on the lower insulating layer 5, so the above-described problem caused by the resist residue does not occur.

Another Active Matrix Substrate 104

Figure 16A:
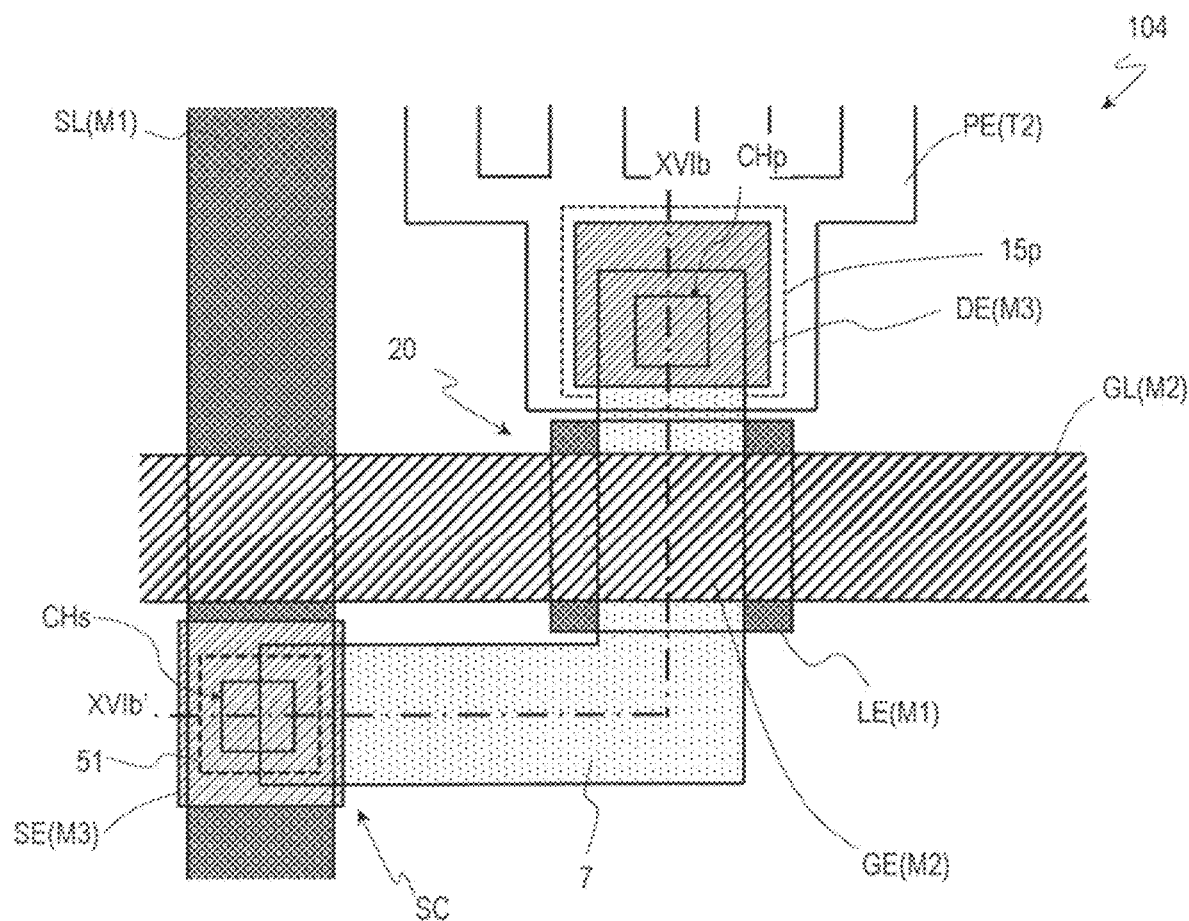
FIG. 16A is a cross-sectional view illustrating another active matrix substrate 104 according to the second embodiment.
Figure 16B:
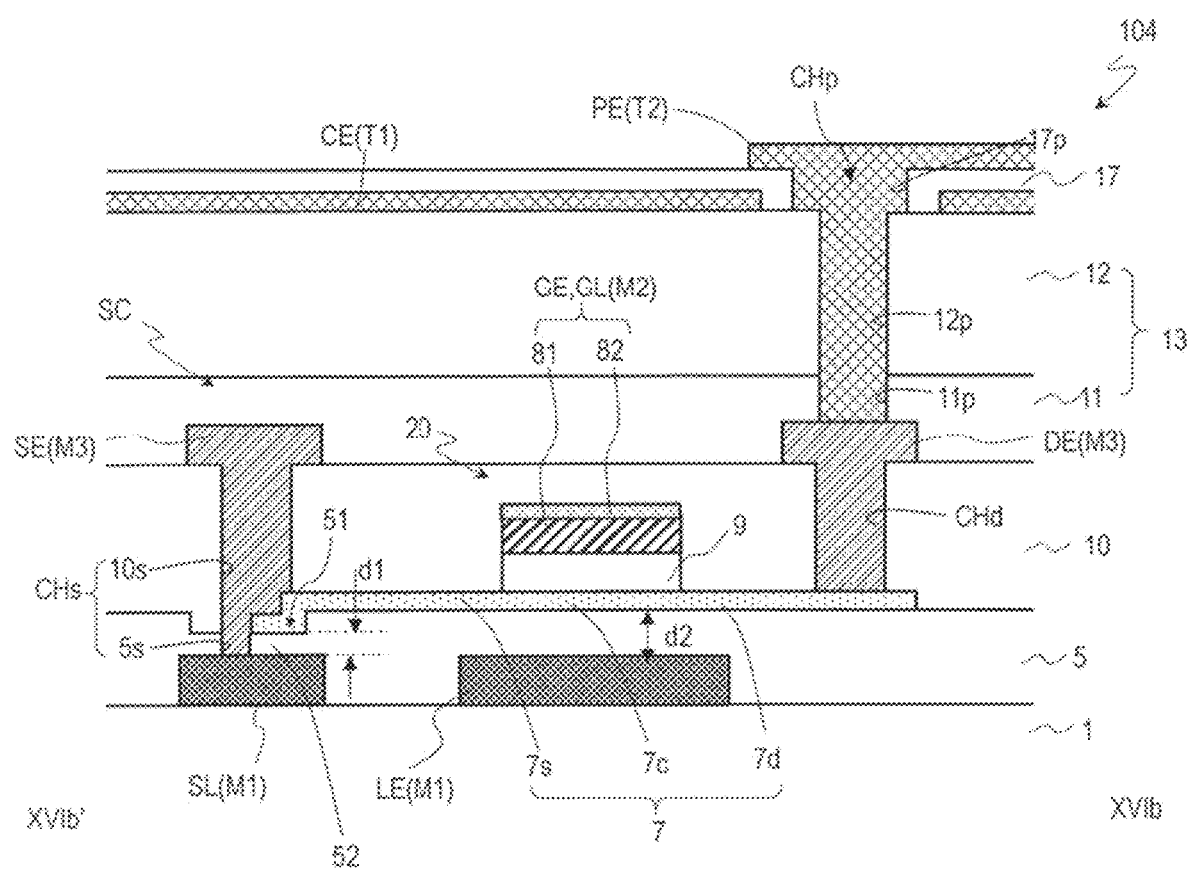
FIG. 16B is a cross-sectional view of a pixel area taken along the line XVIb-XVIb' illustrated in FIG. 16A.

FIG. 16A and FIG. 16B are a plan view and a cross-sectional view illustrating an example of a pixel area in still another active matrix substrate 104 according to the present embodiment, respectively. Constituent elements similar to those in FIG. 12A and FIG. 12B are denoted by the same reference signs and description thereof will be omitted.

The active matrix substrate 104 differs from the active matrix substrates 102 and 103 in that the lower insulating layer 5 includes a thinned region 52 being thinner than the other regions in the source contact portion SC. Only differences from the active matrix substrate 102 will be described below.

In the source contact portion SC, the thinned region 52 is provided in the lower insulating layer 5. A thickness d1 of the thinned region 52 is less than a thickness d2 of another region of the lower insulating layer 5 (for example, a region overlapping the channel region 7c when viewed from the normal direction of the substrate 1). The thickness d1 of the thinned region 52 may be less than or equal to one half of the thickness d2, for example. Here, the thinned region 52 is formed by providing a recessed portion 51 having a predetermined depth on the surface of the lower insulating layer 5.

In the source contact portion SC, the oxide semiconductor layer 7 is disposed so as to partially cover the thinned region 52. The first opening 10s in the source contact hole CHs is disposed so as to at least partially overlap the thinned region 52. The lower opening 5s is formed in the thinned region 52 of the lower insulating layer 5. In this example, the lower opening 5s is positioned inside the recessed portion 51 when viewed from the normal direction of the substrate 1.

Figure 17:
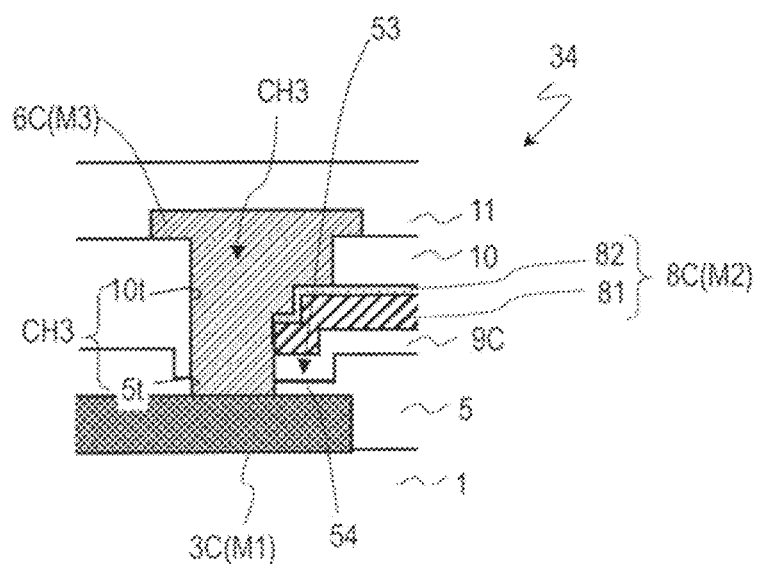
FIG. 17 is a plan view illustrating an example of a wiring line connection section 34 in the active matrix substrate 104.

FIG. 17 is a cross-sectional view illustrating an example of a wiring line connection section 34 in the active matrix substrate 104.

The wiring line connection section 34 differs from the wiring connection section 33 (FIG. 14A and FIG. 14B) in the active matrix substrate 102 in that a thinned region 54 is formed in the lower insulating layer 5 by providing a recessed portion 53 on the surface of the lower insulating layer 5. The first connection electrode 8C and the gate insulating layer 9C are disposed to cover a part of the thinned region 54 when viewed from the normal direction of the substrate 1. Furthermore, when viewed from the normal direction of the substrate 1, the wiring line contact hole CH3 is disposed such that a part thereof overlaps the first connection electrode 8C, and another part thereof overlaps the thinned region 54.

In this example, the wiring line contact hole CH3 includes the upper opening 10t of the interlayer insulating layer 10 and the lower opening 5t of the lower insulating layer 5. The lower opening 5t may be positioned inside the recessed portion 53 when viewed from the normal direction of the substrate 1.

Method for Manufacturing Active Matrix Substrate 104

FIG. 18A to FIG. 18E are process cross-sectional views for describing an example of a method for manufacturing the active matrix substrate 104 according to the present embodiment, and illustrate the TFT formation region r1 where each pixel TFT is formed and the connection section formation region r2 where each wiring line connection section is formed. Further, description of the material, thickness, forming process, and the like of each layer will be omitted when they are similar to those of the active matrix substrate 102.

Figure 18A:
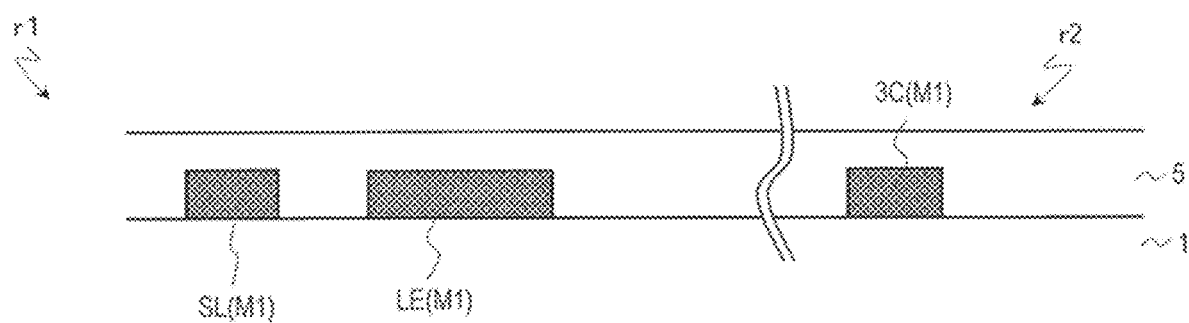
FIG. 18A is a process cross-sectional view illustrating an example of a method for manufacturing the active matrix substrate 104.

First, as illustrated in FIG. 18A, the first metal layer M1 including the source bus line SL and the lower electrode LE of the TFT is formed, and the lower insulating layer 5 is then formed to cover the first metal layer M1.

Figure 18B:
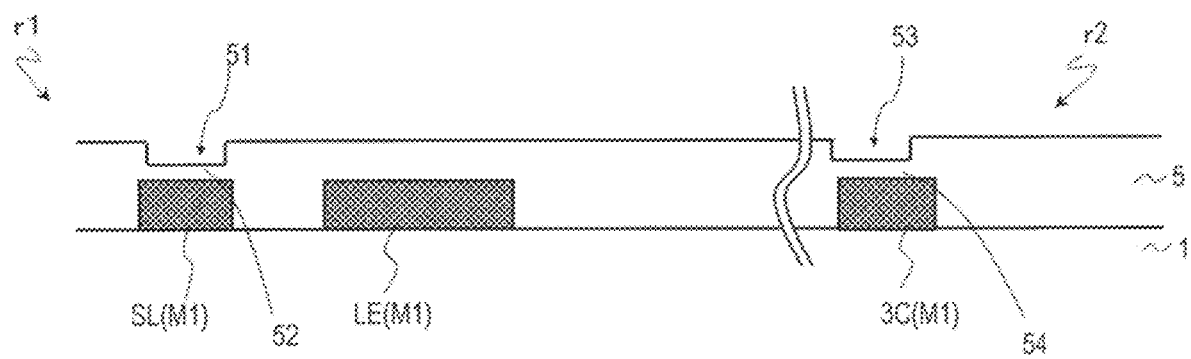
FIG. 18B is a process cross-sectional view illustrating the example of the method for manufacturing the active matrix substrate 104.

Thereafter, as illustrated in FIG. 18B, the thinned region 52 is formed in the lower insulating layer 5 by forming the recessed portion 51 in the surface of the lower insulating layer 5 in each region (source contact portion formation region) that is to form the source contact portion of the TFT formation region r1. Similarly, in the connection section formation region r2, the thinned region 54 is formed in the lower insulating layer 5 by forming the recessed portion 53 in the surface of the lower insulating layer 5. The recessed portions 51 and 53 can be formed by forming a resist layer on the lower insulating layer 5 in a known photolithography step and etching only the upper portion of the lower insulating layer 5 with the resist layer being used as a mask (half etching), for example.

Figure 18C:
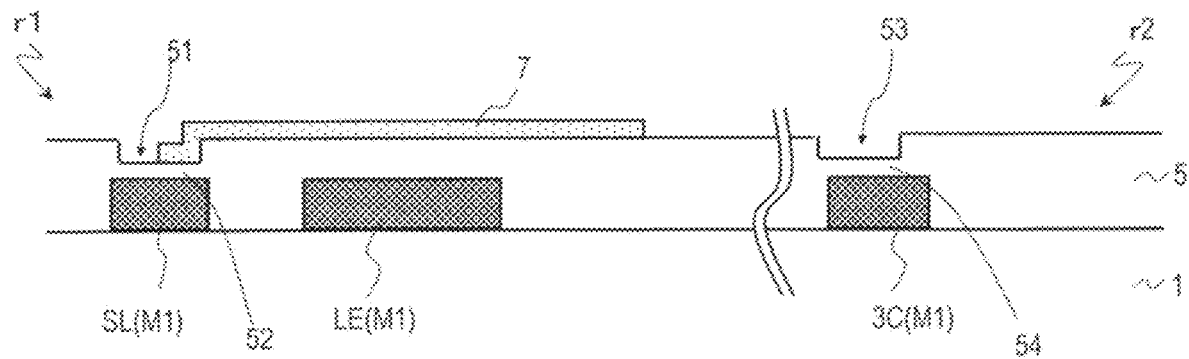
FIG. 18C is a process cross-sectional view illustrating the example of the method for manufacturing the active matrix substrate 104.

Subsequently, as illustrated in FIG. 18C, the oxide semiconductor layer 7 is formed on the lower insulating layer 5. Here, the oxide semiconductor layer 7 is disposed so as to cover only a part of the recessed portion 51 (that is, only a part of the thinned region 52).

Figure 18D:
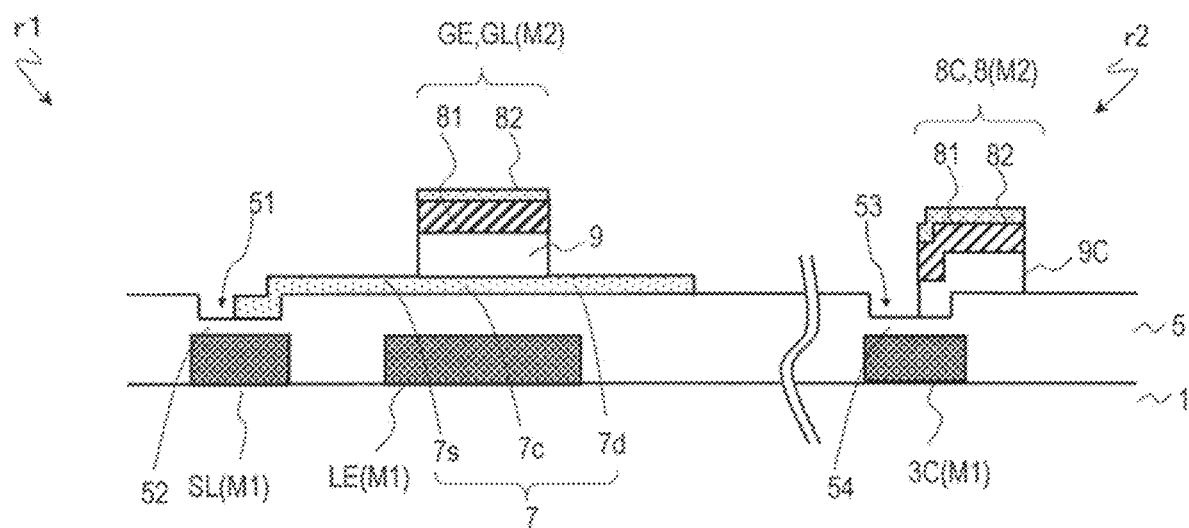
FIG. 18D is a process cross-sectional view illustrating the example of the method for manufacturing the active matrix substrate 104.

Next, as illustrated in FIG. 18D, the gate insulating layer 9 and the gate electrode GE are formed on a part of the oxide semiconductor layer 7 in the TFT formation region r1. Subsequently, processing for lowering the resistance of the oxide semiconductor layer 7 is performed, and the channel region 7c, the first region 7s, and the second region 7d are formed in the oxide semiconductor layer 7. Additionally, the gate insulating layer 9C and the first connection electrode 8C are formed in the connection section formation region r2. The gate insulating layer 9C and the first connection electrode 8C are disposed to cover only a part of the thinned region 54 of the lower insulating layer 5.

Figure 18E:
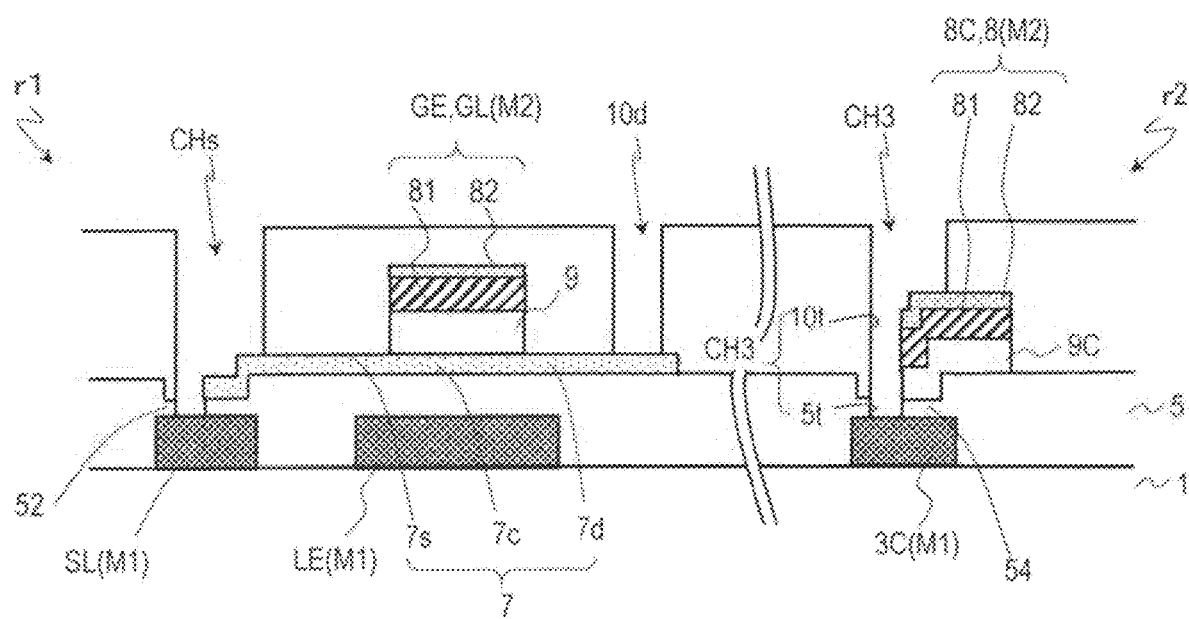
FIG. 18E is a process cross-sectional view illustrating the example of the method for manufacturing the active matrix substrate 104.

Subsequently, as illustrated in FIG. 18E, the interlayer insulating layer 10 that covers the oxide semiconductor layer 7, the gate insulating layer 9, and the gate electrode GE is formed, and the interlayer insulating layer 10 and the lower insulating layer 5 are patterned. Due to this, in the TFT formation region r1, the source contact hole CHs that exposes a part of the source bus line SL and a part of the first region 7s of the oxide semiconductor layer 7 is formed in the interlayer insulating layer 10 and the lower insulating layer 5, and the second opening 10d that exposes a part of the second region 7d of the oxide semiconductor layer 7 is formed. Furthermore, in the connection section formation region r2, the wiring line contact hole CH3 that exposes a part of the lower connection electrode 3C and a part of the first connection electrode 8C is formed in the interlayer insulating layer 10 and the lower insulating layer 5.

The source contact hole CHs is configured of the lower opening 5s formed in the thinned region 52 of the lower insulating layer 5 and the first opening 10s formed in the interlayer insulating layer 10. When viewed from the normal direction of the substrate 1, the first opening 10s is disposed such that a part thereof overlaps the oxide semiconductor layer 7, and the remaining portion overlaps the thinned region 52. Thus, only the thinned region 52 of the lower insulating layer 5 is etched to form the lower opening 5s. A part of the side face of the lower opening 5s may be aligned with the side face of the oxide semiconductor layer 7, and the other portion may be aligned with the side face of the first opening 10s.

The wiring line contact hole CH3 is configured of the lower opening 5t formed in the thinned region 54 of the lower insulating layer 5 and the upper opening 10t formed in the interlayer insulating layer 10. The upper opening 10t is disposed such that a part thereof overlaps the first connection electrode 8C and the remaining portion overlaps the thinned region 54 when viewed from the normal direction of the substrate 1. Thus, only the thinned region 54 of the lower insulating layer 5 is etched to form the lower opening 5t. A part of the side face of the lower opening 5t may be aligned with the side faces of the first connection electrode 8C and the gate insulating layer 9C, and the other portion may be aligned with the side face of the upper opening 10t.

Next, although not illustrated, the third metal layer M3 including the source electrode SE, the drain electrode DE, the second connection electrode 6C, and the like is formed. Since the subsequent steps are similar to those for the active matrix substrate 102, description thereof is omitted.

In the method for manufacturing the active matrix substrate 104, a step for thinning the lower insulating layer 5 (half etching) is added, compared to the active matrix substrate 102. However, the method has the following advantages.

In the method for manufacturing the active matrix substrate 102, in the etching step of the interlayer insulating layer 10 and the lower insulating layer 5, after the interlayer insulating layer 10 is etched to expose a part of the oxide semiconductor layer 7 and a part of the first connection electrode 8C, there is a concern that the exposed portions of the oxide semiconductor layer 7 and the first connection electrode 8C are exposed to etching gas until the etching of the lower insulating layer 5 ends to be damaged. In addition, during etching of the lower insulating layer 5, the edge of the resist layer is retracted by the etching gas, and a contact hole size may be larger than a predetermined size. In contrast, according to the present embodiment, the lower insulating layer 5 in the regions where the source contact hole CHs and the wiring line contact hole CH3 are formed is thinned, so a time period of the etching of the lower insulating layer 5 is reduced. As a result, damage caused by etching to the exposed portions of the oxide semiconductor layer 7 and the first connection electrode 8C can be suppressed. In addition, a shift amount of the contact hole size can be reduced. Furthermore, when a part of the side face of the Cu-containing conductive layer 81 of the first connection electrode 8C is exposed to the inside of the wiring line contact hole CH3, the occurrence of an etching inhibitor caused by etching the Cu-containing conductive layer 81 can be suppressed.

Note that, when a through hole that reaches the source bus line SL is formed in the lower insulating layer 5 before the oxide semiconductor layer 7 is formed, the exposed portion of the source bus line SL may be damaged by the etching solution of the oxide semiconductor film. In contrast, in the present embodiment, only thinning of the lower insulating layer 5 is performed before the oxide semiconductor layer 7 is formed, and the source bus line SL is not exposed, so damage to the source bus line SL due to the etching solution of the oxide semiconductor film can be avoided.

In this example, as the thinned region 52 is thinner, the time period required for etching the lower insulating layer 5 can be shortened in the etching step for forming the source contact hole CHs and the wiring line contact hole CH3, and thus, damage to the exposed portions of the oxide semiconductor layer 7 and the first connection electrode 8C and the shift of the contact hole size can be more effectively suppressed. In this regard, the thickness d1 of the thinned region 52 may be, for example, equal to or less than ½, preferably equal to or less than ⅓, of the thickness d2 of another region of the lower insulating layer 5 (for example, the thickness of the portion overlapping the channel region 7c). The lower limit of the thickness d1 of the thinned region 52 is not particularly limited as long as the source bus line SL is not exposed, but the lower limit is set, for example, to be equal to or larger than 100 nm (equal to or larger than 30% of the thickness d2) in consideration of the accuracy of etching or the like.

Although not illustrated, the opening 71 or a notched portion may be provided in the oxide semiconductor layer 7 as in the active matrix substrate 103. When viewed from the normal direction of the substrate 1, the opening 71 may be positioned inside the thinned region 52 (inside the recessed portion 51).

The placement of the source contact portion SC in the present embodiment can be applied to other lower source substrates, for example, various lower source substrates disclosed in Provisional Application U.S. 62/9061,249 by the inventors. The entire contents of the disclosure of the above provisional application are incorporated herein by reference.

Oxide Semiconductor

The oxide semiconductor (also referred to as metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of two layers (that is the lower layer in the case of the bottom gate structure, and the upper layer in the case of the top-gate structure) may be smaller than an energy gap of the oxide semiconductor included in a layer positioned on the opposite side to the gate electrode (that is the upper layer in the case of the bottom gate structure, and the lower layer in the case of the top-gate structure). However, in a case where a difference in the energy gap between these layers is relatively small, the energy gap of the oxide semiconductor included in the layer positioned on the gate electrode side may be larger than the energy gap of the oxide semiconductor included in the layer positioned on the opposite side to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O-based semiconductor (for example, an indium gallium zinc oxide). Here, the In—Ga—Zn—O-based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. Such an oxide semiconductor layer can be formed of an oxide semiconductor film including an In—Ga—Zn—O-based semiconductor.

The In—Ga—Zn—O-based semiconductor may be an amorphous semiconductor or may be a crystalline semiconductor. A crystalline In—Ga—Zn—O-based semiconductor in which a c-axis is oriented substantially perpendicular to a layer surface is preferable as the crystalline In—Ga—Zn—O-based semiconductor.

Note that a crystal structure of the crystalline In—Ga—Zn—O-based semiconductor is disclosed, for example, in JP 2014-007399 A described above, JP 2012-134475 A, JP 2014-209727 A, and the like. The entire contents of the disclosures of JP 2012-134475 A and JP 2014-209727 A are incorporated herein by reference. A TFT including an In—Ga—Zn—O-based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O-based semiconductor, the oxide semiconductor layer may include another oxide semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, and the like.

While there have been described what are at present considered to be certain embodiments of the application, it will be understood that various modifications may be made thereto, and it is intended that the appended claim cover all such modifications as fall within the true spirit and scope of the application.

The invention claimed is:

1. An active matrix substrate including a display region including a plurality of pixel areas arranged, in a matrix shape, in a row direction and a column direction, and a non-display region positioned around the display region, the active matrix substrate comprising:
   a substrate;
   a plurality of oxide semiconductor thin film transistors (TFTs) supported by the substrate, the plurality of oxide semiconductor TFTs including a plurality of pixel TFTs disposed corresponding to the plurality of pixel areas; and
   a plurality of wiring line connection sections supported by the substrate,
   wherein each of the plurality of oxide semiconductor TFTs includes:
      an oxide semiconductor layer including a channel region,
      a gate electrode disposed on the channel region of the oxide semiconductor layer with a gate insulating layer interposed between the gate electrode and the channel region,
      an interlayer insulating layer covering the oxide semiconductor layer and the gate electrode, and
      a source electrode electrically connected to a part of the oxide semiconductor layer,
   each of the plurality of wiring line connection sections electrically connects a first connection electrode provided in a layer identical to a layer of the gate electrode and a second connection electrode disposed on the interlayer insulating layer,
   the gate electrode of each of the plurality of oxide semiconductor TFTs and the first connection electrode of each of the plurality of wiring line connection sections include a layered structure including a Cu-containing conductive layer containing Cu, and a metal oxide layer disposed on the Cu-containing conductive layer, the metal oxide layer containing an oxide material identical to an oxide material of the channel region of the oxide semiconductor layer,
   each of the plurality of wiring line connection sections includes:
      the first connection electrode,
      the interlayer insulating layer extending over the first connection electrode,
      a wiring line contact hole formed in an insulating layer including the interlayer insulating layer, the wiring line contact hole exposing a part of the metal oxide layer of the first connection electrode, and
      the second connection electrode,
   a first connection section is provided to connect to the second connection electrode and to the part of the metal oxide layer of the first connection electrode, the first connection section being located in the wiring line contact hole, and
   in the gate electrode and the first connection electrode, the Cu-containing conductive layer includes a Cu alloy layer and a Cu layer disposed on the Cu alloy layer.

2. The active matrix substrate according to claim 1, wherein the second connection electrode of each of the plurality of wiring line connection sections is formed from a conductive film identical to a conductive film of the source electrode of each of the plurality of oxide semiconductor TFTs.

3. The active matrix substrate according to claim 1, wherein, in the gate electrode and the first connection electrode, the metal oxide layer covers an upper face of the Cu-containing conductive layer.

4. An active matrix substrate including a display region including a plurality of pixel areas arranged, in a matrix shape, in a row direction and a column direction, and a non-display region positioned around the display region, the active matrix substrate comprising:
   a substrate;
   a plurality of oxide semiconductor thin film transistors (TFTs) supported by the substrate, the plurality of oxide semiconductor TFTs including a plurality of pixel TFTs disposed corresponding to the plurality of pixel areas; and
   a plurality of wiring line connection sections supported by the substrate,
   wherein each of the plurality of oxide semiconductor TFTs includes:
      an oxide semiconductor layer including a channel region,
      a gate electrode disposed on the channel region of the oxide semiconductor layer with a gate insulating layer interposed between the gate electrode and the channel region,
      an interlayer insulating layer covering the oxide semiconductor layer and the gate electrode, and
      a source electrode electrically connected to a part of the oxide semiconductor layer,
   each of the plurality of wiring line connection sections electrically connects a first connection electrode provided in a layer identical to a layer of the gate electrode and a second connection electrode disposed on the interlayer insulating layer,
   the gate electrode of each of the plurality of oxide semiconductor TFTs and the first connection electrode of each of the plurality of wiring line connection sections include a layered structure including a Cu-containing conductive layer containing Cu, and a metal oxide layer disposed on the Cu-containing conductive layer, the metal oxide layer containing an oxide material identical to an oxide material of the channel region of the oxide semiconductor layer,
   each of the plurality of wiring line connection sections includes:
      the first connection electrode,
      the interlayer insulating layer extending over the first connection electrode,
      a wiring line contact hole formed in an insulating layer including the interlayer insulating layer, the wiring line contact hole exposing a part of the metal oxide layer of the first connection electrode, and
      the second connection electrode,
   a first connection section is provided to connect to the second connection electrode and to the part of the metal oxide layer of the first connection electrode, the first connection section being located in the wiring line contact hole, and
   in the gate electrode and the first connection electrode, the metal oxide layer covers an upper face and a side face of the Cu-containing conductive layer.

5. The active matrix substrate according to claim 4, wherein the layered structure of the gate electrode and the first connection electrode further includes a barrier metal layer disposed on a side of the substrate of the Cu-containing conductive layer, and the barrier metal layer contains Ti or Mo.

6. An active matrix substrate including a display region including a plurality of pixel areas arranged, in a matrix shape, in a row direction and a column direction, and a non-display region positioned around the display region, the active matrix substrate comprising:
a substrate;
a plurality of oxide semiconductor thin film transistors (TFTs) supported by the substrate, the plurality of oxide semiconductor TFTs including a plurality of pixel TFTs disposed corresponding to the plurality of pixel areas; and
a plurality of wiring line connection sections supported by the substrate,
wherein each of the plurality of oxide semiconductor TFTs includes:
an oxide semiconductor layer including a channel region,
a gate electrode disposed on the channel region of the oxide semiconductor layer with a gate insulating layer interposed between the gate electrode and the channel region,
an interlayer insulating layer covering the oxide semiconductor layer and the gate electrode, and
a source electrode electrically connected to a part of the oxide semiconductor layer,
each of the plurality of wiring line connection sections electrically connects a first connection electrode provided in a layer identical to a layer of the gate electrode and a second connection electrode disposed on the interlayer insulating layer,
the gate electrode of each of the plurality of oxide semiconductor TFTs and the first connection electrode of each of the plurality of wiring line connection sections include a layered structure including a Cu-containing conductive layer containing Cu, and a metal oxide layer disposed on the Cu-containing conductive layer, the metal oxide layer containing an oxide material identical to an oxide material of the channel region of the oxide semiconductor layer,
each of the plurality of wiring line connection sections includes:
the first connection electrode,
the interlayer insulating layer extending over the first connection electrode,
a wiring line contact hole formed in an insulating layer including the interlayer insulating layer, the wiring line contact hole exposing a part of the metal oxide layer of the first connection electrode, and
the second connection electrode,
a first connection section is provided to connect to the second connection electrode and to the part of the metal oxide layer of the first connection electrode, the first connection section being located in the wiring line contact hole, and
in the gate electrode and the first connection electrode, a thickness of the metal oxide layer is equal to or greater than 30 nm, and is less than a thickness of the Cu-containing conductive layer.

7. The active matrix substrate according to claim 4, wherein, in each of the plurality of oxide semiconductor TFTs,
the oxide semiconductor layer includes a first metal oxide containing In, Ga, and Zn,
the metal oxide layer of the gate electrode includes a second metal oxide containing In, Ga, and Zn, and
a ratio, in the first metal oxide, of numbers of atoms of In, Ga, and Zn to all metal elements contained in the first metal oxide and a ratio, in the second metal oxide, of numbers of atoms of In, Ga, and Zn to all metal elements contained in the second metal oxide are substantially identical.

8. The active matrix substrate according to claim 4, wherein each of the plurality of oxide semiconductor TFTs further includes a lower electrode disposed between the channel region of the oxide semiconductor layer and the substrate, and the oxide semiconductor layer is disposed on the lower electrode with a lower insulating layer interposed between the oxide semiconductor layer and the lower electrode.

9. The active matrix substrate according to claim 8, wherein the plurality of wiring line connection sections includes a first wiring line connection section that electrically connects a lower connection electrode, provided in a layer identical to a layer of the lower electrode, to the first connection electrode via the second connection electrode, and
in the first wiring line connection section,
the wiring line contact hole is formed in the interlayer insulating layer and the lower insulating layer, and exposes the part of the metal oxide layer of the first connection electrode and a part of the lower connection electrode, and
a second connection section is provided for connecting the second connection electrode to the part of the metal oxide layer of the first connection electrode and to the part of the lower connection electrode, the second connection section being located in the wiring line contact hole.

10. The active matrix substrate according to claim 9, wherein the plurality of oxide semiconductor TFTs includes a plurality of double gate structure TFTs, and
the first wiring line connection section includes a gate connection section that electrically connects the lower electrode and the gate electrode that are included in each of the plurality of double gate structure TFTs.

11. The active matrix substrate according to claim 4, further comprising:
a plurality of gate bus lines supported by a main surface of the substrate and extending in the row direction; and
a plurality of source bus lines supported by the main surface of the substrate and extending in the column direction,
wherein the source electrode of each of the plurality of pixel TFTs is electrically connected to one corresponding source bus line of the plurality of source bus lines, and the gate electrode of each of the plurality of pixel TFTs is electrically connected to one corresponding gate bus line of the plurality of gate bus lines, and
each of the plurality of gate bus lines is provided in a layer identical to a layer of the gate electrode of a corresponding pixel TFT of the plurality of pixel TFTs, and each of the plurality of source bus lines is provided in a layer identical to a layer of the source electrode of a corresponding pixel TFT of the plurality of pixel TFTs, on the interlayer insulating layer.

12. The active matrix substrate according to claim 8, further comprising:
a plurality of gate bus lines supported by a main surface of the substrate and extending in the row direction; and
a plurality of source bus lines supported by the main surface of the substrate and extending in the column direction,
wherein the source electrode of each of the plurality of pixel TFTs is electrically connected to one corresponding source bus line of the plurality of source bus lines, and the gate electrode of each of the plurality of pixel TFTs is electrically connected to one corresponding gate bus line of the plurality of gate bus lines, and each of the plurality of gate bus lines is provided in a layer identical to a layer of the gate electrode of a corresponding pixel TFT of the plurality of pixel TFTs, and each of the plurality of source bus lines is provided in a layer identical to a layer of the lower electrode of a corresponding pixel TFT of the plurality of pixel TFTs.

13. The active matrix substrate according to claim 12, wherein, in each of the plurality of pixel TFTs, the lower insulating layer and the interlayer insulating layer include a source contact hole exposing the part of the oxide semiconductor layer and a part of the one corresponding source bus line, and the source electrode is disposed on the interlayer insulating layer and in the source contact hole, and is electrically connected to the part of the oxide semiconductor layer and the part of the one corresponding source bus line in the source contact hole.

14. The active matrix substrate according to claim 4, wherein the second connection electrode of each of the plurality of wiring line connection sections is formed from a conductive film identical to a conductive film of the source electrode of each of the plurality of oxide semiconductor TFTs.

15. The active matrix substrate according to claim 1, wherein the layered structure of the gate electrode and the first connection electrode further includes a barrier metal layer disposed on a side of the substrate of the Cu-containing conductive layer, and the barrier metal layer contains Ti or Mo.

16. The active matrix substrate according to claim 1, wherein, in each of the plurality of oxide semiconductor TFTs, the oxide semiconductor layer includes a first metal oxide containing In, Ga, and Zn, the metal oxide layer of the gate electrode includes a second metal oxide containing In, Ga, and Zn, and a ratio, in the first metal oxide, of numbers of atoms of In, Ga, and Zn to all metal elements contained in the first metal oxide and a ratio, in the second metal oxide, of numbers of atoms of In, Ga, and Zn to all metal elements contained in the second metal oxide are substantially identical.

17. The active matrix substrate according to claim 6, wherein the second connection electrode of each of the plurality of wiring line connection sections is formed from a conductive film identical to a conductive film of the source electrode of each of the plurality of oxide semiconductor TFTs.

18. The active matrix substrate according to claim 6, wherein, in the gate electrode and the first connection electrode, the metal oxide layer covers an upper face of the Cu-containing conductive layer.

19. The active matrix substrate according to claim 6, wherein the layered structure of the gate electrode and the first connection electrode further includes a barrier metal layer disposed on a side of the substrate of the Cu-containing conductive layer, and the barrier metal layer contains Ti or Mo.

20. The active matrix substrate according to claim 6, wherein, in each of the plurality of oxide semiconductor TFTs, the oxide semiconductor layer includes a first metal oxide containing In, Ga, and Zn, the metal oxide layer of the gate electrode includes a second metal oxide containing In, Ga, and Zn, and a ratio, in the first metal oxide, of numbers of atoms of In, Ga, and Zn to all metal elements contained in the first metal oxide and a ratio, in the second metal oxide, of numbers of atoms of In, Ga, and Zn to all metal elements contained in the second metal oxide are substantially identical.

* * * * *